US 7,023,048 B2

(12) United States Patent
Sasago et al.

(10) Patent No.: US 7,023,048 B2
(45) Date of Patent: Apr. 4, 2006

(54) NONVOLATILE SEMICONDUCTOR MEMORY DEVICES AND THE FABRICATION PROCESS OF THEM

(75) Inventors: Yoshitaka Sasago, Kokubunji (JP); Takashi Kobayashi, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/417,269

(22) Filed: Apr. 17, 2003

(65) Prior Publication Data

US 2004/0124459 A1    Jul. 1, 2004

(30) Foreign Application Priority Data

Apr. 19, 2002    (JP)    ............................ P2002-117471

(51) Int. Cl.
*H01L 29/788* (2006.01)
(52) U.S. Cl. ........................ 257/316; 257/314; 257/315
(58) Field of Classification Search ................ 257/296, 257/301, 314–316
See application file for complete search history.

(56) References Cited

U.S. PATENT DOCUMENTS

| | | | |
|---|---|---|---|
| 5,095,344 A | | 3/1992 | Harari |
| 5,414,287 A | * | 5/1995 | Hong ......................... 257/316 |
| 5,640,032 A | * | 6/1997 | Tomioka .................... 257/316 |
| 6,670,671 B1 | * | 12/2003 | Sasago et al. ............... 257/319 |
| 6,765,258 B1 | * | 7/2004 | Wu ............................ 257/315 |
| 2004/0051134 A1 | * | 3/2004 | Jang et al. .................. 257/316 |

FOREIGN PATENT DOCUMENTS

JP    2-110981 A    4/1990

OTHER PUBLICATIONS

Naruke et al., A new flash-erase EEPROM cell with a sidewall select-gate on its source side, IEDM (Dec. 1989) 603.
Kume, Flash Memory technology, Applied Physics 65 (Japan Society of Applied Physics, Nov. 1996) 1114.

* cited by examiner

*Primary Examiner*—Christian D. Wilson
(74) *Attorney, Agent, or Firm*—Antonelli, Terry, Stout and Kraus, LLP.

(57) ABSTRACT

The present invention enables to avoid a reduction in coupling ratio in a nonvolatile semiconductor memory device. The reduction is coupling ratio is caused due to difficulties in batch forming of a control gate material, an interpoly dielectric film material, and a floating gate material, the difficulties accompanying a reduction in word line width. Further, the invention enables to avoid damage caused in the batch forming on a gate oxide film. Before forming floating gates of memory cells of a nonvolatile memory, a space enclosed by insulating layers is formed for each of the floating gates of the memory cells, so that the floating gate is buried in the space. This structure is realized by processing the floating gates in a self alignment manner after depositing the floating gate material. Therefore, it is unnecessary to perform the batch forming of the control gate material, the interpoly dielectric film material, and the floating gate material in the case of processing the control gates, thereby ensuring adequate interpoly dielectric film capacitance.

17 Claims, 63 Drawing Sheets

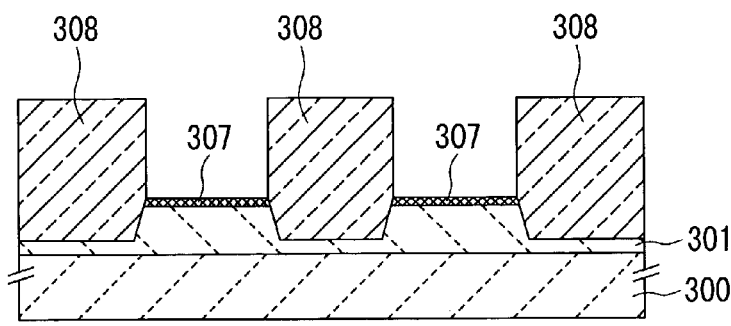
FIG.44A
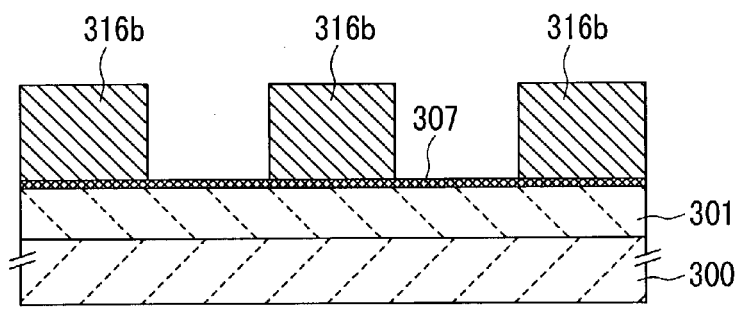
FIG.44B
FIG.44C
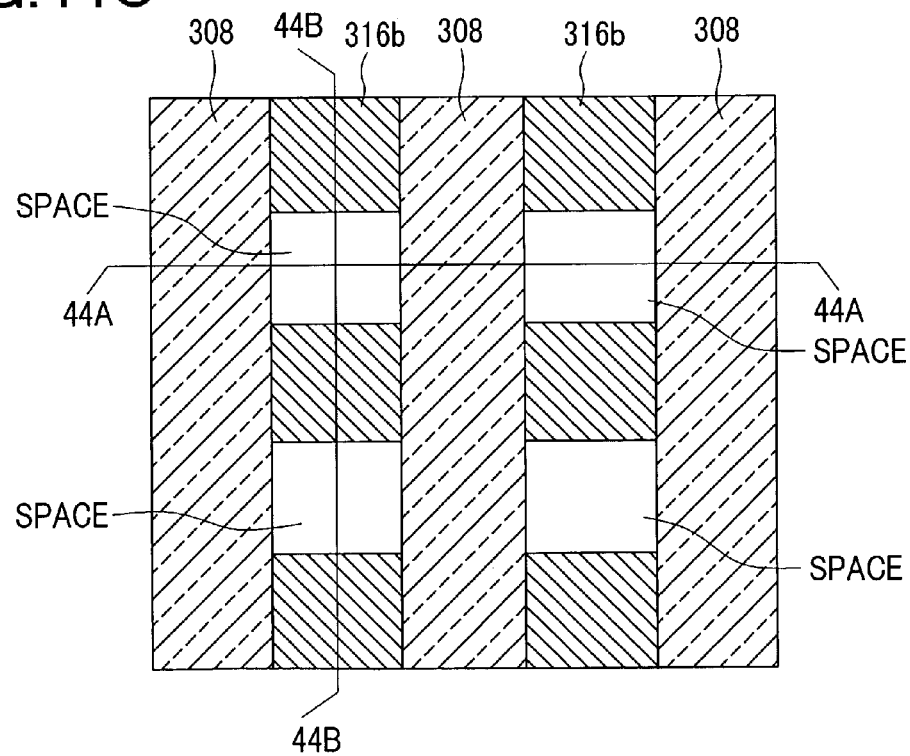

NONVOLATILE SEMICONDUCTOR MEMORY DEVICES AND THE FABRICATION PROCESS OF THEM

BACKGROUND OF THE INVENTION

The present invention relates to a semiconductor integrated circuit device and a process for fabricating the same and, particularly, to a technique for realizing a high degree of integration and a high degree of reliability of an electrically rewritable nonvolatile semiconductor memory device.

Among electrically rewritable nonvolatile semiconductor memory devices, flash memories are well known in the art as the one capable of bulk erasing. Since the flash memories are excellent in portability as well as impact resistance and capable of electrical bulk erasing, they are rapidly growing in demand in recent years as memory devices to be used for personal digital assistances such as a mobile personal computer and a digital still camera. One of the important factors in expanding the market for the flash memory is a reduction in bit cost by way of a reduction in memory cell region. For example, as is mentioned in "Applied Physics", Vol. 65, No. 11, pp. 1114–1124, published by The Japan Society of Applied Physics on Nov. 10, 1996 (Literature 1), various memory cell technologies have heretofore been proposed.

Also, Japanese Patent Laid-open No. 2-110981 (Literature 2) discloses a virtual ground memory cell using a three-layer polysilicon gate.

The memory cell disclosed in the above-mentioned patent literature has a semiconductor region formed in a well in a semiconductor substrate and three gates. The three gates namely are a floating gate formed on the well, a control gate formed over the well and the floating gate, and an erase gate formed between the control gate and the floating gate. The gates are formed from polysilicon, and they are separated from one another by an insulating layer. The floating gate and the well are also separated from each other by an insulating layer. The control gates are connected in the row direction to form a word line. Source/drain diffusion layers are formed in the column direction, and they are of the virtual ground type in which one diffusion layer is shared with adjacent memory cells. Thus, a reduction in pitch in the column direction is achieved. The erase gates are aligned in parallel with a channel and the word line in such a manner that the erase gates are placed between adjacent word lines (control gates).

In the patent literature, in the case of writing data in the memory cell, positive voltages which are independent from each other are applied separately to the word line and the drain, and each of the well, the source, and the erase gate is set to 0V. Thus, hot electrons are generated at the channel portion in the vicinity of the drain so that electrons are injected into the floating gate, thereby raising a threshold value of the memory cell. In the case of erasing data, a positive voltage is applied to the erase gate, and each of the word line, the source, the drain, and the well is set to 0 V. Thus, electrons are injected from the floating gate to the erase gate, thereby lowering the threshold value.

Further, a method of controlling the floating gate potential by the word line and controlling a split channel by a third gate which is different from the floating gate and the control gate is discussed in International Electron Device Meeting Technical Digest (1989), pp. 603–606 (Literature 3).

A common object of the above-mentioned memory cells is to ensure adequate capacitance of a capacitor which is defined between the floating gate and the control gate via an interpoly dielectric film. In order to inject electrons into the floating gate, a positive voltage is applied to the control gate to thereby raise the floating gate potential. In this case, a coupling ratio, which is a ratio of the floating gate voltage to the control gate voltage, is increased owing to the adequate capacitance of the capacitor defined between the floating gate and the control gate via the interpoly dielectric film. Therefore, it is possible to perform data-writing by sufficiently raising the floating gate voltage even if the control gate voltage is low. In a cell where the electron ejection to the substrate, the source drain diffusion layer or the erase gate is performed by applying a negative voltage to the control gate, it is possible to sufficiently lower the floating gate voltage with a low negative control gate voltage by increasing the coupling ratio, thereby enabling to perform the electron injection operation.

The following measures have been taken for the above-mentioned memory cells in order to ensure the adequate capacitance of the capacitor defined between the floating gate and the control gate via the interpoly dielectric film: (1) increasing a surface area of the floating gate by making the floating gate tridimensional so that the adequate capacitance is ensured; and (2) preventing a reduction in capacitance which is caused due to a misalignment of the floating gate with the control gate by forming the control gate, the interpoly dielectric film, and the floating gate in a batch manner.

Since a width of the word line has been narrowed due to the microfabrication of the flash memory, these conventional methods are now in conflict with each other. More specifically, due to the tridimensional floating gate, height differences among the control gate, the interpoly dielectric film, and the floating gate become prominent to make it difficult to perform the batch forming. Therefore, an etch residue on the floating gate causes defects such as a short between memory cells. Further each of the memory cells obtained by the batch forming has a forward tapered shape, which reduces a ratio of capacitance of the interpoly dielectric film to capacitance of the gate insulating layer which is at a portion corresponding to the bottom of the tapered shape.

Further, as the word line width is reduced, a length of a bird's beak which is caused by light oxidation performed for the purpose of compensating for the damage caused by the batch forming on a gate oxidation film is increased to an unignorable degree as compared with the word line width, which adversely effects on a data erase characteristic and reliability of the memory cell.

SUMMARY OF THE INVENTION

In view of the above problems, an object of the present invention is to provide a nonvolatile semiconductor memory device having three types of gates, namely, a control gate, a floating gate, and an erase gate, wherein capacitance between the floating gate and the control gate is satisfactorily ensured and a process for fabricating such semiconductor memory device.

There are two major aspects for attaining the object of the present invention.

The first aspect is to enlarge a surface area of the floating gate so as to ensure the adequate capacitance between the floating gate and the control gate. The second aspect is to eliminate a misalignment between the floating gate and the control gate. To achieve the first and the second aspect, or, as the third aspect, a high-k material is used as an interpoly dielectric film between the floating gate and the control gate so as to ensure the capacitance.

According to the above aspects which will hereinafter be described in detail, the fabrication process is facilitated since the surface area of the floating gate is satisfactorily increased and the batch forming is no longer necessary. Further, the damage on the gate oxidation film which would be otherwise caused by the batch forming is avoided, and accordingly the light oxidation for repairing the damage is necessary no longer. Furthermore, since it is unnecessary to form the interpoly insulating layer in the device structure of the present invention, formation of the memory cell is considerably facilitated even if the high-k material such as tantalum pentoxide is used as the material for the interpoly dielectric film between a first gate and a second gate.

The nonvolatile semiconductor memory device of the present invention has the following characteristics. Floating gates of memory cells are formed on a silicon substrate via a gate oxidation film, each of the floating gates being formed in a space defined by side walls each of which is an insulating layer. The floating gate is placed in the space in such a manner as to avoid filling up the space perfectly, so that the floating gate has a dented shape when viewed from either one of side walls (as viewed in a longitudinal section and a cross-section of the floating gate). Owing to the dented shape, the surface area of the floating gate is increased as compared with the case where the space is filled up with a floating gate perfectly. The floating gate is formed in such a manner that a height thereof becomes lower than that of the side walls which are parallel with a word line, so that it is possible to form only the word line after the formation of the floating gate for each of the memory cells. Thus, it is possible to eliminate the conventional batch forming of the control gate, the interpoly dielectric film, and the floating gate.

BRIEF DESCRIPTION OF THE DRAWING

FIGS. 32A to 32C are sectional views illustrating process steps subsequent to FIG. 31D of the fabrication process of the nonvolatile semiconductor memory device in the sixth embodiment;

FIGS. 33A to 33C are sectional views illustrating a process step subsequent to FIGS. 32A to 32C of the fabrication process of the nonvolatile semiconductor memory device in the sixth embodiment, wherein FIGS. 33B and 33C are sectional views taken along the lines 33B—33B and 33C—33C in FIG. 33A;

FIGS. 44A to 44C are diagrams illustrating the fabrication process of the nonvolatile semiconductor memory device in the seventh embodiment, wherein FIG. 44C is a plan view, FIG. 44A is a cross-sectional view, and FIG. 44B is a longitudinal sectional view;

FIGS. 46A to 46C are diagrams illustrating the fabrication process of the nonvolatile semiconductor memory device in the seventh embodiment, wherein FIG. 46C is a plan view, FIG. 46A is a cross-sectional view, and FIG. 46B is a longitudinal sectional view;

FIGS. 47A to 47C are diagrams illustrating the fabrication process of the nonvolatile semiconductor memory device in the seventh embodiment, wherein FIG. 47C is a plan view, FIG. 47A is a cross-sectional view, and FIG. 47B is a longitudinal sectional view;

DESCRIPTION OF THE PREFERRED EMBODIMENTS

Embodiments of the present invention will hereinafter be described in detail with reference to the accompanying drawings. Components having an identical function are designated by the same numerals, and repetitive description for such components is omitted as much as possible.

First Embodiment

Figure 1:
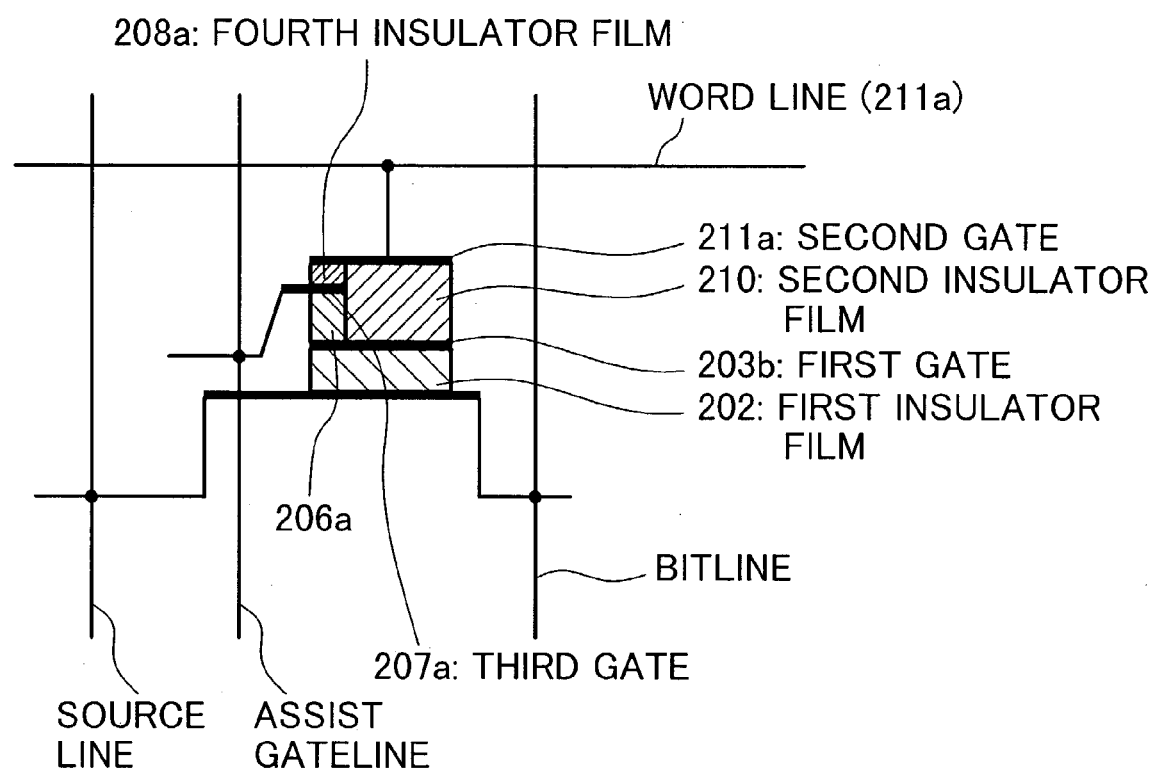
FIG. 1 is a diagram showing an equivalent circuit of a memory cell of the present invention.
Figure 2:
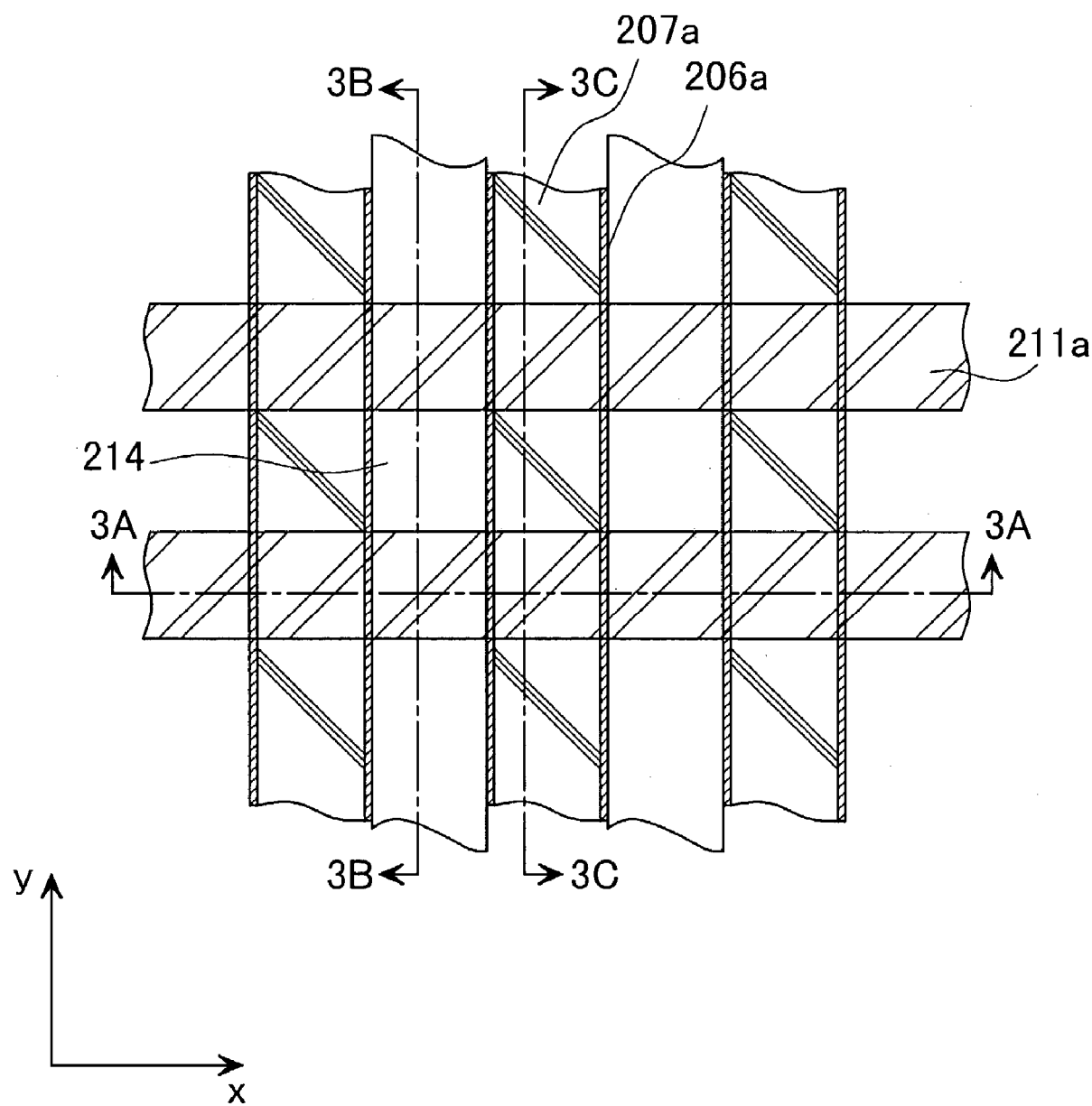
FIG. 2 is a partial plan view showing an example of a nonvolatile semiconductor memory device in a first embodiment according to the present invention.
Figure 3A:
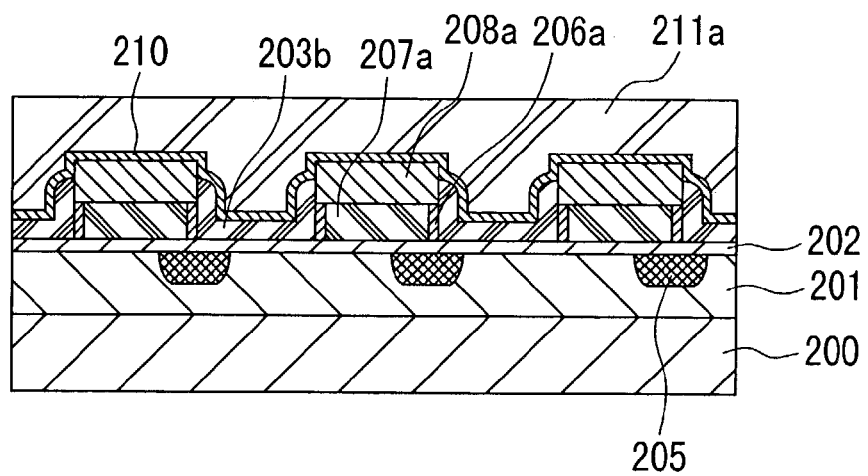
FIGS. 3A to 3C are sectional views showing three sections of the memory cell in the present invention.
Figure 3B:
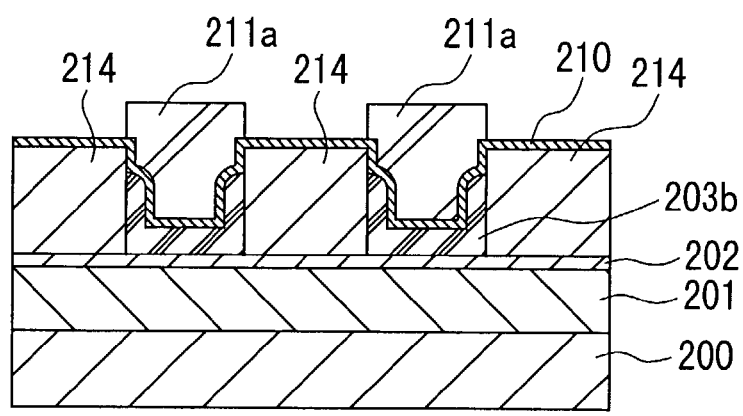
Figure 3C:
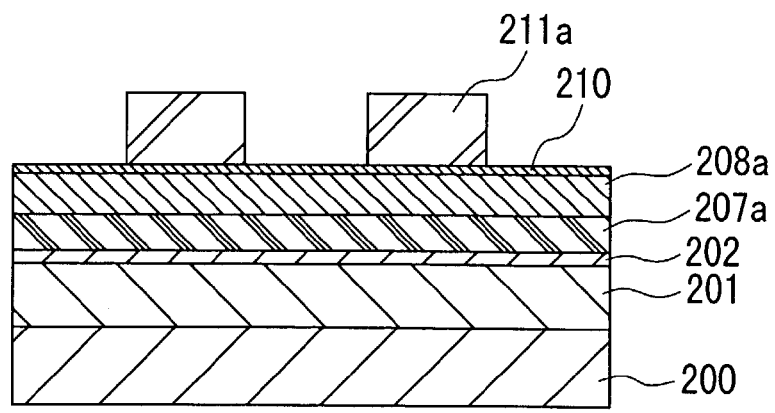

FIG. 1 is a diagram showing an equivalent circuit of a memory cell according to the present invention. FIG. 2 is a plan view showing an example of a semiconductor integrated circuit device which is a first embodiment according to the present invention. Some components included in the device are omitted in FIG. 2 in order to facilitate understanding of an arrangement of main wirings. FIGS. 3A to 3C are sectional views taken along the lines 3A—3A, 3B—3B, and 3C—3C in FIG. 2.

[Basic Structure of Memory Cell in First Embodiment]

A memory cell according to the first embodiment will hereinafter be described briefly with reference to FIG. 1. The memory cell of the present embodiment is a cell of a so-called flash memory, which has, like known memory cells, a word line 211a, a bit line, a source line, a first gate 203b which is a floating gate, a second gate 211a which will serve as a control gate, and a third gate 207a. The third gate is a so-called erase gate.

Although an operation of the memory cell will be described in detail later in this specification, an outline thereof is described briefly in the following. A potential is applied to the control gate 211a and the third gate 207a to form a channel in a well under the third gate. Then, electrons flowing through the channel are accelerated by a source-drain potential difference to generate hot electrons in the channel at a source-side end of the floating gate. A part of the hot electrons is injected into the floating gate so that desired information is written in the cell.

At the time of reading out data from the cell, a potential is applied to the third gate to form a channel in the well under the third gate. Then, when a potential which is determined based on the source-drain is applied to the word line of a selected cell, it is judged if the source-drain current conduction is established or not to read data.

A sectional structure of the semiconductor device will hereinafter be described. The memory cell of the semiconductor integrated circuit device according to the present embodiment has a semiconductor substrate 200, the well 201 which is formed on a main surface of the semiconductor substrate 200, a source and drain diffusion layer 205 which is formed in the well 201, the first gate (floating gate) 203b, the second gate (control gate) 211a, and the third gate 207a (see FIGS. 3A to 3C). Although a state of the well is not clearly illustrated in FIGS. 3A to 3C, the layer 201 is a region formed as the well.

A basic relationship between the gate insulating layer and the gates will be described below referring to the equivalent circuit in FIG. 1, in which a basic conception of the present invention will be clarified based on the basic structure. Note that the following description of the basic structure is an outline of the basic relationship, and a specific description thereof will be described later in this specification in accordance with a fabrication process.

A first insulating layer 202 is a gate insulating layer between a channel region in the source and drain regions and the gates; a second insulating layer 210 is an insulating layer between the floating gate and the second gate (control gate); a third insulating layer 206a is an insulating layer between the first gate (floating gate) and the third gate; and a fourth insulating layer is an insulating layer between the third gate and the second gate. The third gate is insulated from the second gate with a multi-layer of the fourth insulating layer and the second insulating layer.

A first characteristic of the present invention is that the floating gate 203b which will serve as the first gate contacts with the insulating layers in both of the directions parallel to and perpendicular to the word line 211a. In other words, the technical concept is such that the floating gate structure is achieved by the use of an inner wall of a hole which is formed for each of the memory cells.

A second characteristic of the present invention is that a thickness of a peripheral portion of the floating gate 203b is larger than that of a central portion. That is to say, since the floating gate 203b is provided with the dented shape in the memory cell region, a surface area of the floating gate in the memory cell is larger than that of a flat surface floating gate. In the following embodiments, the thickness of the floating gate is increased in a direction opposite to the substrate (i.e. in the upward direction in the figure) along walls of the insulating layers with which the floating gate contacts in both of the directions parallel to and perpendicular to the word line 211a.

The above characteristics will be described in detail with reference to FIGS. 3A to 3C in the following. FIG. 3A is a sectional view taken along the line which is parallel with the word line 211a. The predetermined well 201 is formed on the semiconductor substrate 200, and a part thereof is shown in FIGS. 3A to 3C. Although a reverse conduction type semiconductor region (not shown) is defined in a specific semiconductor device to form the well. Impurity-doped regions 205 which will be formed into the source and drain regions are formed in the well. The first insulating layer 202 is formed on the well. The first insulating layer 202 serves as a first insulating film on the source and drain regions.

The first gates 203b which are the floating gates and the third gates 207a are arranged alternately on the first insulating layer. Each of the third gates 207a is provided, on their side faces, with the third insulating layer 206a which serves as the insulating layer between the third gate 207a and the first gate (floating gate in this case). The fourth insulating layer 208a is formed on each of the third gates 207a, and the second insulating layer 210 is formed to cover the fourth insulating layers 208a and the first gate 203b. The second gates 211a (control gate in this case) are formed on the second insulating layer 210. The second gates are connected with the word line. Thus, the memory cells having the electrical structure shown in FIG. 1 are formed.

As described above, as viewed in the section of the floating gate (first gate) which is in parallel with the word line 211a, each of the side walls of the floating gate is covered with either one of the insulating layers. The insulating layers covering the side walls are the third insulating layer 206a and the fourth insulating layer 208a. As shown in FIG. 3B, the floating gate (first gate) 203b has the dented shape, and a thickness of portions contacting with the insulating layers is larger than that of a central portion.

FIG. 3B is a sectional view taken along the line 3B-3B in FIG. 2. The section is taken along the line perpendicular to the word line. Shown in FIG. 3B are sections of two word lines 211a which are shown in FIG. 2. The floating gate (first gate) 203a, the second insulating layer 210, and the second gate 211a are layered on the gate insulating layer 202. A fifth insulating layer 214 is formed between the regions corresponding to the word lines 211a. More specifically, the floating gate (first gate) and the fifth insulating layer 214 are formed and then the second insulating layer is formed on them in the same manner as shown in FIG. 3A. The fabrication process will be described later in this specification.

As shown in FIG. 3B, as viewed in the section of the floating gate (first gate) which is perpendicular to the word line 211a, each of the side walls of the floating gate 203b is covered with the fifth insulating layer 214. Also, as shown in FIG. 3B, the floating gate (first gate) 203b has the dented shape, and a thickness of portions contacting with the insulating layers is larger than that of a central portion.

As is apparent form FIGS. 3A and 3B, the characteristics of the memory cell of the present embodiment are as follows. First, the first gate which will be formed into the floating gate is surrounded by the insulating layers for one memory cell. Second, the contact face of the first gate which will serve as the floating gate with the second insulating layer 210 has the dented shape in the directions parallel with and perpendicular to the word line. Owing to the dented shape, an area of a capacitor, which is formed via the interpoly dielectric film 210 between the first gate serving as the floating gate and the second gate serving as the control gate, is enlarged, thereby making it possible to ensure adequate capacitance of the capacitor. Thus, the above described first and second characteristics are now clearly understood.

Characteristics of heights of the insulating layers will be described in the following. The first gate 203b which will serve as the floating gate is buried in the region which is surrounded by the third insulating layer 206a and the fourth insulating layer 208a which are formed on the side wall of the third gate 207a in one direction (first direction) as well as by the fifth insulating layer 214 in the other direction (a second direction). Further, the height of the first gate 203b is below at least the fifth insulating layer 214. This characteristic enables to employ the following fabrication process and is more effective for attaining the object of the present invention of ensuring the adequate capacitance.

More specifically, when the control gate 211a is formed by photolithography and a dry etching technique after depositing a control gate material, the etching is terminated when the fifth insulating layer 214 is exposed. With the above fabrication process, the capacitance is decreased no longer even if a misalignment between positions of the floating gate 203a and the control gate 211a occurs. That is to say, it is unnecessary to perform the conventional method, which is called the batch forming, of simultaneously processing the control gate, the interpoly dielectric film, and the floating gate. With the process of the present embodiment, it is possible to ensure the adequate capacitance while allowing a certain limited degree of misalignment between the positions of the floating gate 203a and the control gate 211a.

The control gates (second gates) 211a of the memory cells are connected in the row direction (x direction) to form the word line WL. The floating gates arranged in the direction perpendicular to the word line are separated from one another by the fifth insulating layers 214.

The source and drain diffusion layers 205 are arranged in a direction (y direction) perpendicular to the extending direction (x direction) of the word line 211a to serve as local source lines and local data lines for connecting sources with drains of the memory cells arranged in the column direction (y direction). That is to say, the semiconductor integrated circuit device of the present embodiment is formed of a so-called contactless array wherein contact holes are not formed for every memory cells 205.

The channel is formed in the direction (x direction) perpendicular to the diffusion layers 205.

Two of end faces of the third gate 207a respectively face to two of end faces of the floating gate 203b with the insulating layer 206a being sandwiched therebetween, the two end faces of the floating gate 203b being perpendicular respectively to the word line and the channel.

The third gates 207a are buried in gaps between the floating gates 203b existing in the direction (y direction) perpendicular to the word line 211a and the channel. The floating gates 203b and the third gates 207a are formed symmetrically to each other.

In the present embodiment, the pair of impurity diffusion layers forming the source and the drain has an asymmetrical relationship with the floating gate pattern. That is to say, the present embodiment has an offset structure wherein one of the pair of impurity diffusion layers does not overlap with the floating gate 203a.

Also, in the present embodiment, a part of the third gate 207a overlaps with a part of the diffusion layer 205. Therefore, the channel is formed also in the well under the third gate 207a in the present embodiment, thereby enabling the third gate 207a to function as a gate for controlling the channel under the third gate 207a. Thus, the memory cell functions as a split gate type transistor including the first gate and the third gate.

[Basic Operation]

Figure 4:
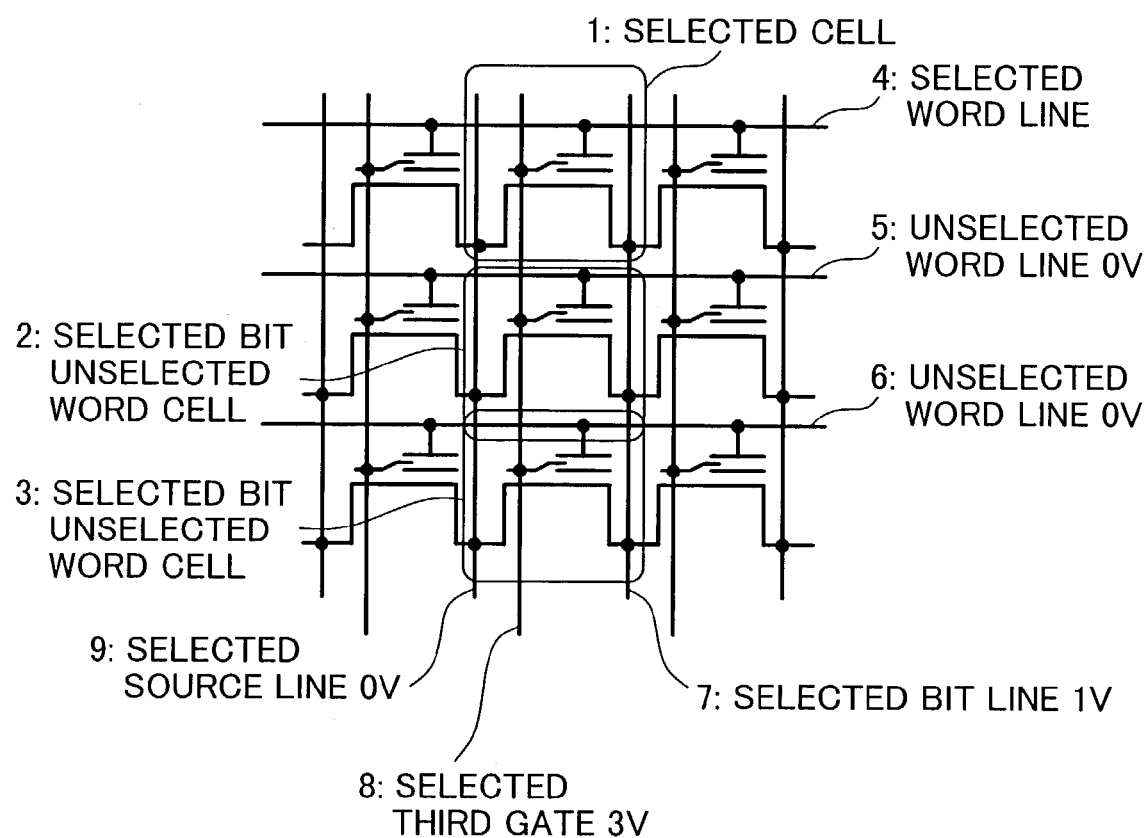
FIG. 4 is a diagram showing an equivalent circuit in a state where information is read out from the memory cell.
Figure 5:
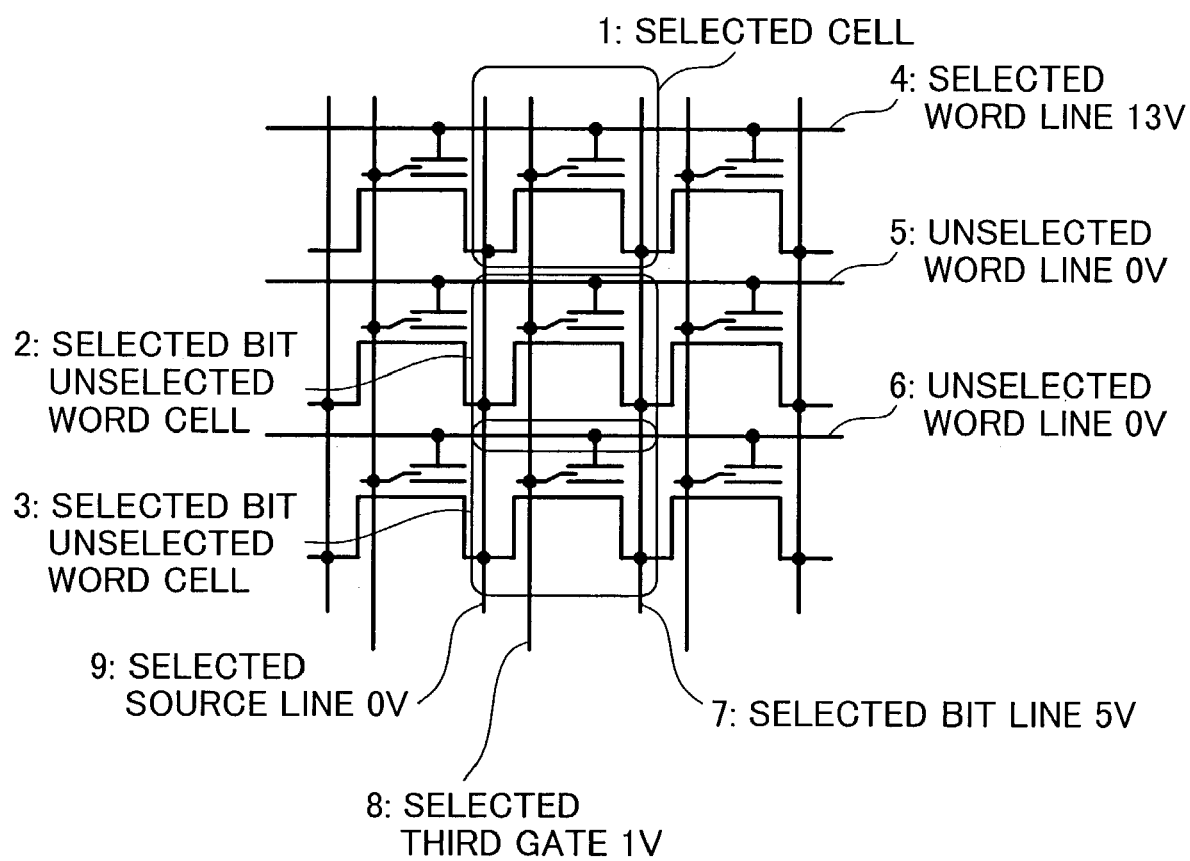
FIG. 5 is a diagram showing an equivalent circuit in a state where information is written in the memory cell.

The basic operation will hereinafter be described in detail with reference to FIGS. 4 and 5. FIG. 4 is a diagram showing an equivalent circuit in a state where information is read out therefrom, and FIG. 5 is a diagram showing the equivalent circuit in a state where information is written therein. In both in FIGS. 4 and 5, a memory cell which is denoted by the reference numeral 1 is selected. Shown in both of the drawings are selected memory cell (hereinafter simply referred to as "selected cell") 1, memory cells 2 and 3 wherein a bit line is selected while word lines are unselected, a selected word line 4, the unselected word lines 5 and 6, the selected bit line 7, a selected gate line 8, and a selected source line 9.

At the time of data-reading out as shown in FIG. 4, a voltage of about 3 V, for example, is applied to the third gate 8 to form a channel in the well under the third gate 207a. Further, a voltage is applied to the selected word line 4 to judge a threshold value of the memory cell 1.

At the time of data-writing as shown in FIG. 5, a channel is formed in the well under the third gate 207a: applying a voltage of about 13 V, for example, to the control gate 4 of the selected cell 1 through the selected word line 4; applying a voltage of about 5 V, for example, to the drain; applying a voltage of about 1 V, for example, to the third gate; and maintaining a voltage of each of the source and the well at, for example, 0 V. Thus, hot electrons are generated in the channel at an end of the floating gate 10 at the source side, so that electrons are injected into the floating gate 10.

In addition, in the present embodiment, the third gate can be used also as an erase gate for withdrawing electrons from the adjacent floating gate when erasing data.

[Example of Fabrication Process]

FIGS. 6A to 14B are sectional views showing process steps of an example of a fabrication process of the nonvolatile semiconductor memory device of the first embodiment, in which the sectional views are indicated in order of the process steps.

Figure 6A:
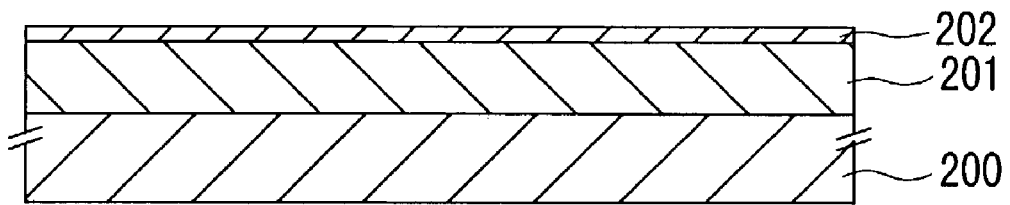
FIGS. 6A to 6C are sectional views illustrating an example of a fabrication process of the nonvolatile semiconductor memory device in the first embodiment.

Firstly, a p-type (first conductivity type) well 201 is formed in a semiconductor substrate 200. On this well 201, a gate insulating layer (first insulating layer) 202 having a thickness of about 10 nm is formed by a thermal oxidation. As described in the foregoing, a part of one well is shown in FIG. 6A.

Figure 6B:
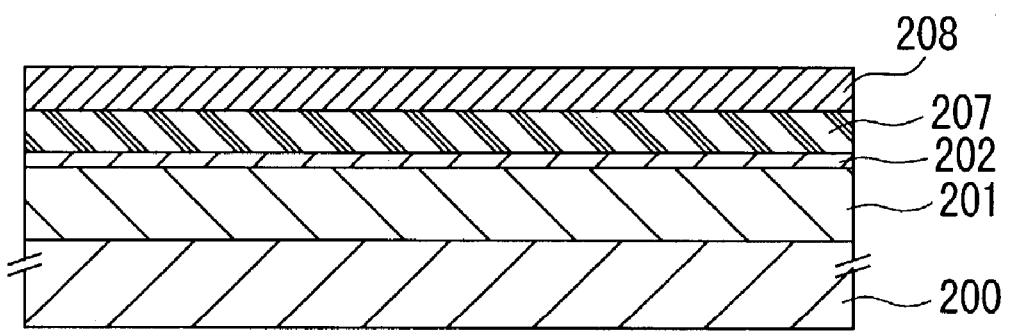

Then, a polysilicon film 207 doped with phosphor (P), which will be formed into the third gates 207a, and a silicon oxide film 208 is deposited in this order (FIG. 6B). The deposition of the polysilicon film 207 and the silicon oxide film 208 may be achieved by CVD (Chemical Vapor Deposition).

Figure 6C:
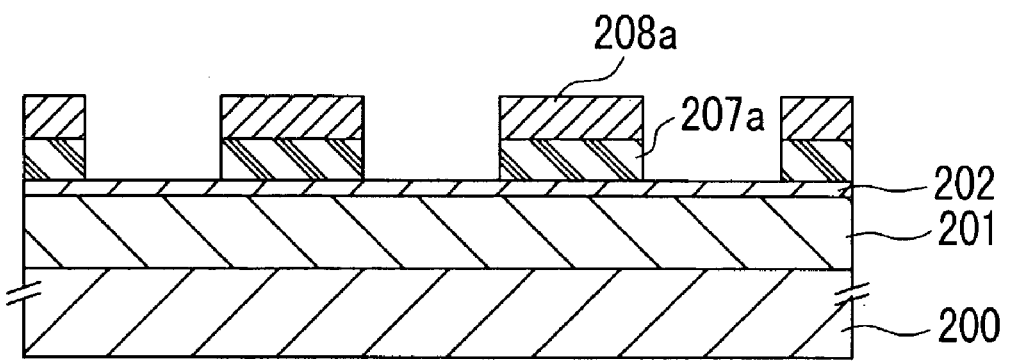

The silicon oxide film 208 and the polysilicon film 207 are then processed to be in desired shapes by a lithography and a dry etching technique. By subjecting to this pattering process, the silicon oxide film 208 and the polysilicon film 207 become silicon oxide films 208a and polysilicon films 207a (FIG. 6C). In addition, the silicon oxide films 208a and the polysilicon films 207a are patterned to form stripes extending in the y direction.

Figure 7A:
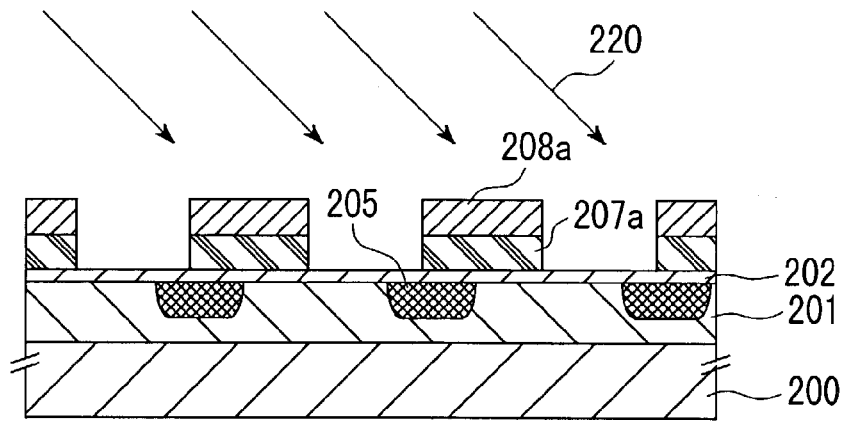
FIGS. 7A to 7C are sectional views illustrating process steps subsequent to FIG. 6C of the fabrication process of the nonvolatile semiconductor memory device in the first embodiment.

After that, arsenic (As) ions 220 are implanted in the well 201 by tilted ion implantation to form impurity diffusion layers 205 which will serve as sources or drains of memory cells (FIG. 7A). A predetermined portion of the diffusion layer 205 which communicates with the source or the drain functions as a source line or a data line of the memory cell. At the time of the ion implantation, the silicon oxide films 208a and the polysilicon films 207a serve as masks. Therefore, the impurity diffusion layers 205 are formed in a so-called self alignment manner with respect to the polysilicon films 207a. In addition, since the silicon oxide films 208a and the polysilicon films 207a are patterned to form the stripe shapes extending in the y direction, the impurity diffusion layers 205 are extended in the y direction.

Further, since the impurity diffusion layers 205 are formed by the tilted ion implantation, the irradiated ions are shielded by the silicon oxide films 208a and the polysilicon films 207a and, therefore, each of the impurity diffusion layers 205 is not formed on a whole region of a gap between the adjacent polysilicon films 207a but on a part of the gap. Furthermore, since the ions are emitted in a tilted direction onto the substrate, the impurity diffusion layer 205 is formed in such a manner that a part thereof is under the polysilicon film 207a. Thus, as described in the foregoing, a part of the third gate 207a overlaps with a part of the impurity diffusion layer 205, so that the channel is formed also in the well 201 under the third gate 207a.

Figure 7B:
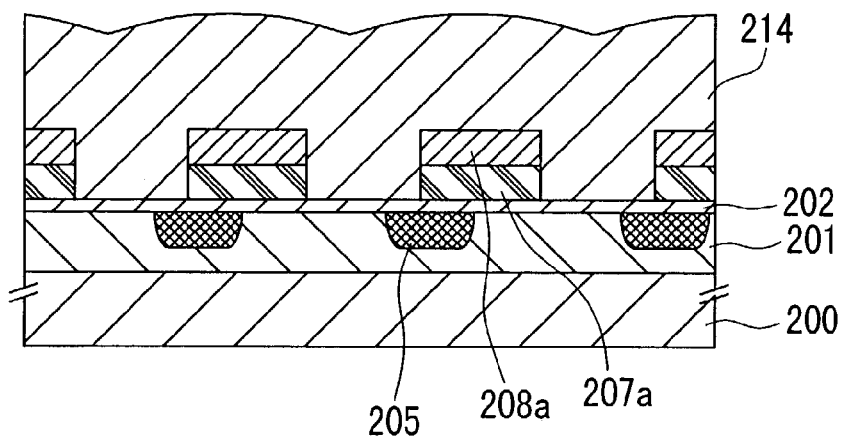

A silicon nitride film 214 which will serve as the fifth insulating layer is deposited on the thus-obtained substrate in such a manner that the third gates 207a and the fourth insulating layers 208a are perfectly covered with the silicon nitride film 214 (FIG. 7B).

Figure 7C:
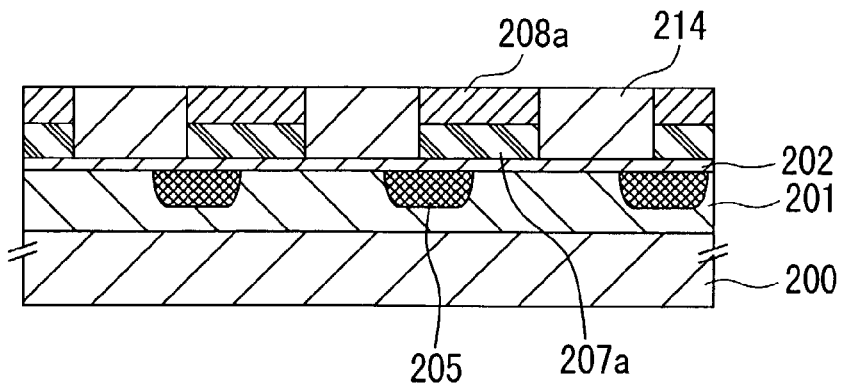

The fifth insulating layer 214 is then removed by an etch back or a chemical mechanical polishing technique until surfaces of the fourth insulating layers 208a are exposed (FIG. 7C).

Figure 15:
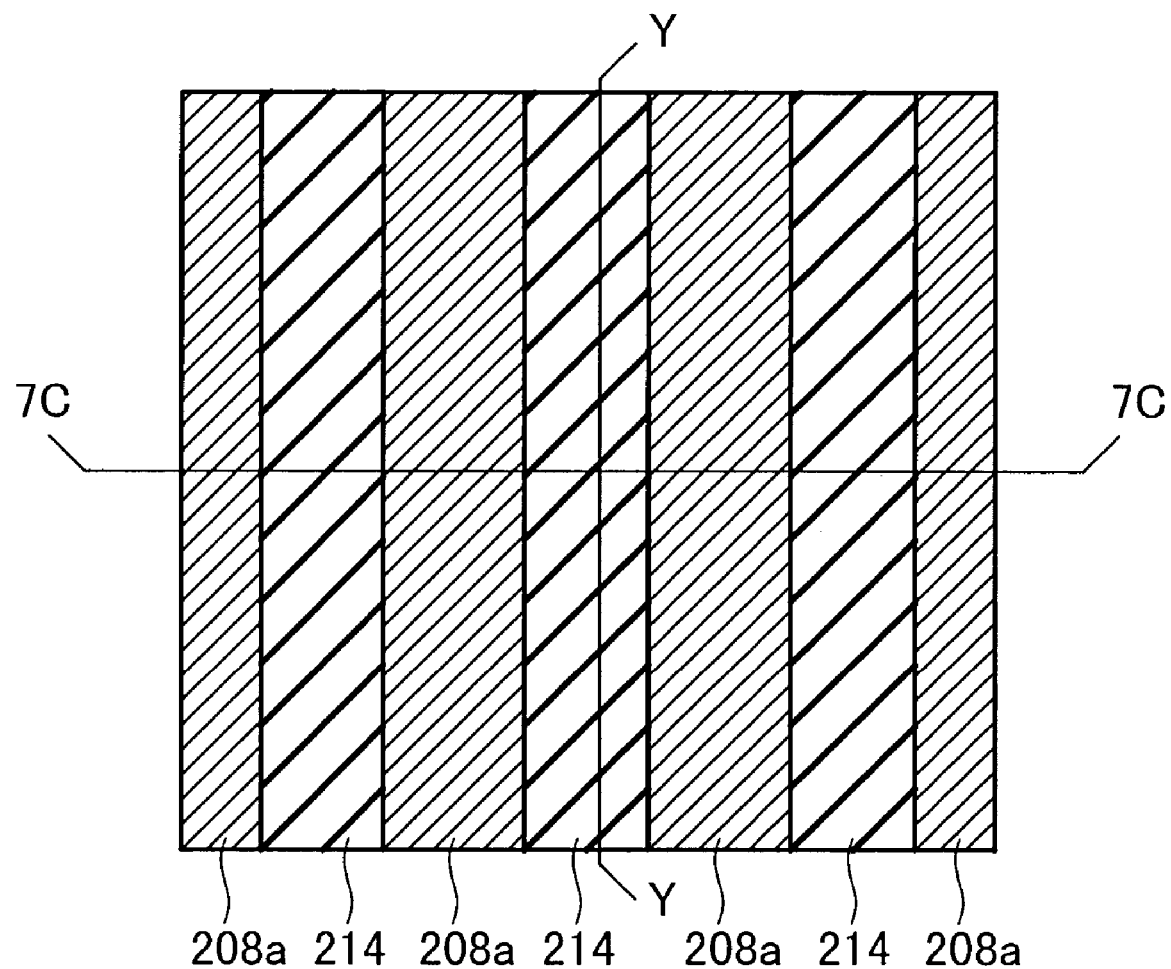
FIG. 15 is a plan view showing a substrate surface in FIG. 7C.

FIG. 15 is a plan view showing a surface of the substrate at the process step in FIG. 7C. Regions where the surfaces of the fourth insulating layers 208a are exposed and regions where the fifth insulating layers 214 are exposed are arranged alternately. A section taken along the line 7C—7C in FIG. 15 is shown in FIG. 7C.

Figure 16:
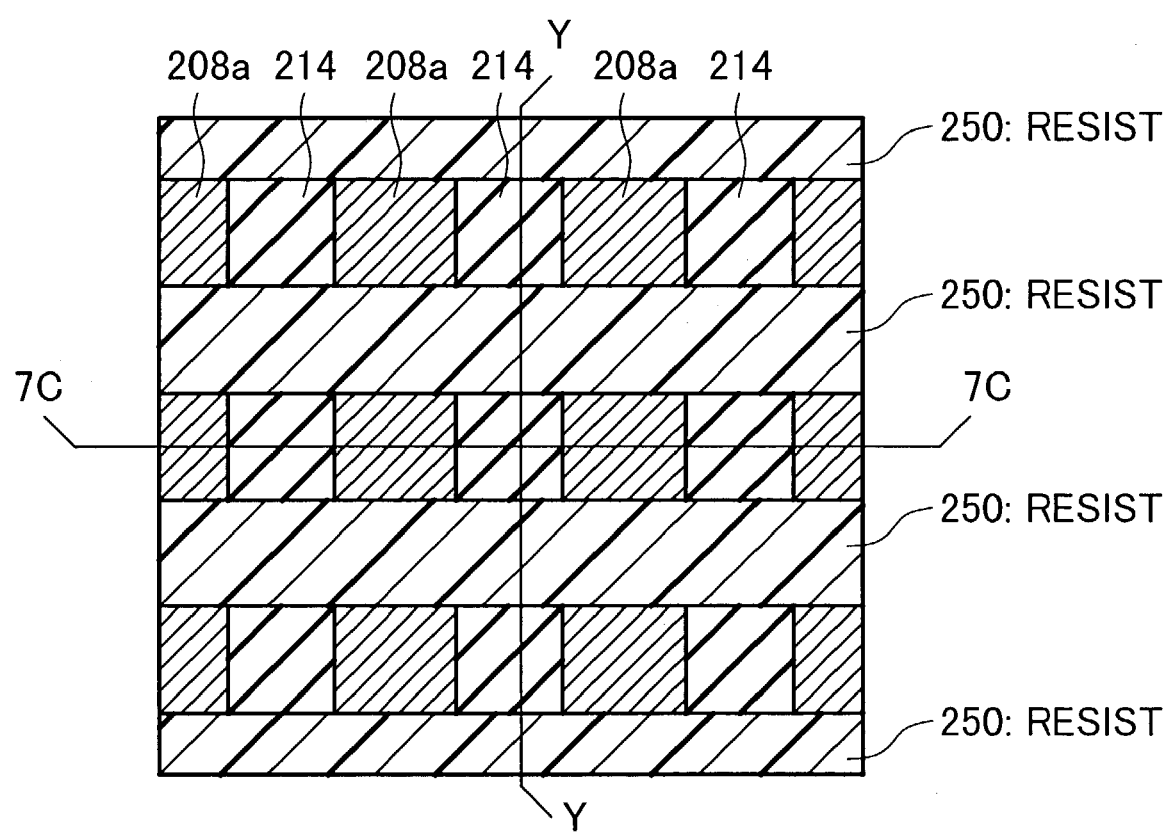
FIG. 16 is a plan view showing the substrate surface in FIG. 7C on which a resist mask is formed.

Then, stripe resist masks 250 extending in the direction perpendicular to the longitudinal direction of the third gates 207a are formed. FIG. 16 is a plan view showing a state after this process step. Dry etching is performed by using the resist masks 250. The etching is performed under the condition of selectively etching the silicon nitride films which are the fifth insulating layers 214.

Figure 17:
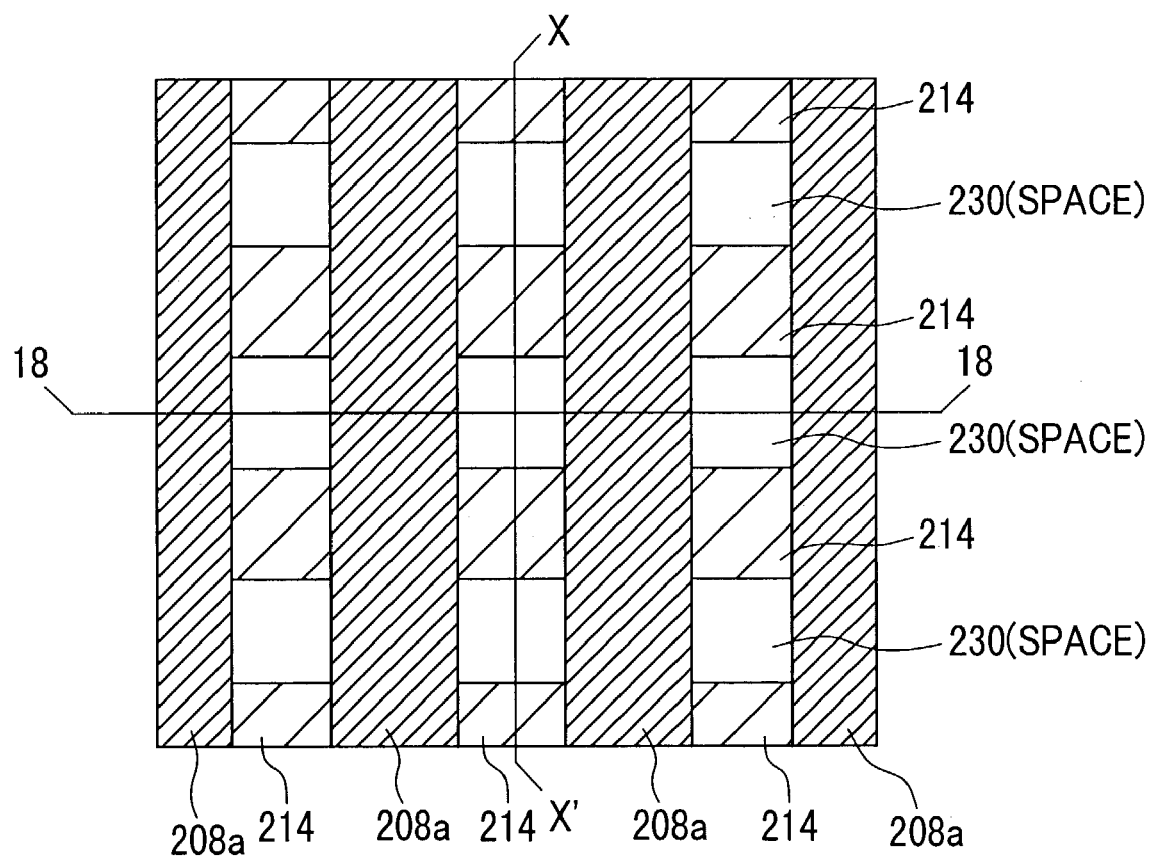
FIG. 17 is a plan view showing a substrate surface wherein a space for covering the floating gate of the memory cell is indicated.
Figure 18:
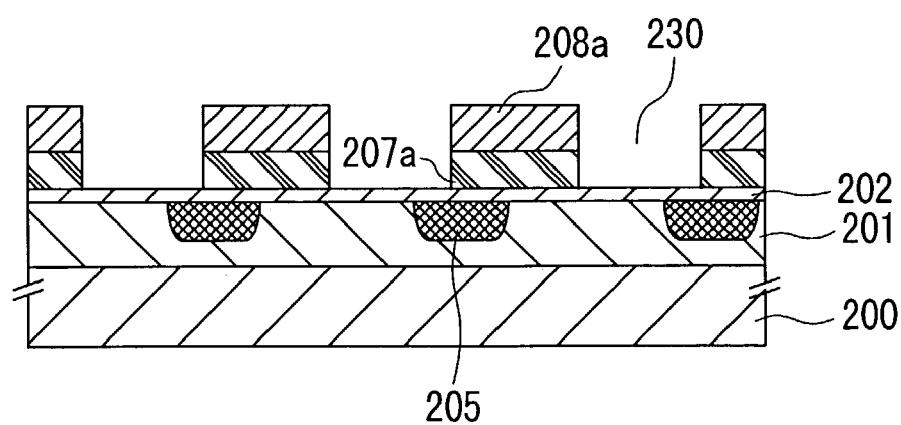
FIG. 18 is a sectional view taken along the line 18—18 in FIG. 17.

Thus, spaces, in each of which two side walls are respectively surrounded by the fifth insulating layer 214 and other two side walls are respectively surrounded by the third gate 207a and the fifth insulating layer 208a, are formed on the silicon substrate via the first gate oxide film 202. FIG. 17 is a plan view showing the silicon substrate with the spaces. In addition, only the fourth insulating layers 208a which are arranged on an upper portion of the silicon substrate are denoted in FIG. 17. The gate oxide film 202 is exposed in the spaces. The first characteristic of the present invention is to form the memory cells using the spaces. The floating gate is formed by using the inner walls of each of the spaces 230.

Figure 8:
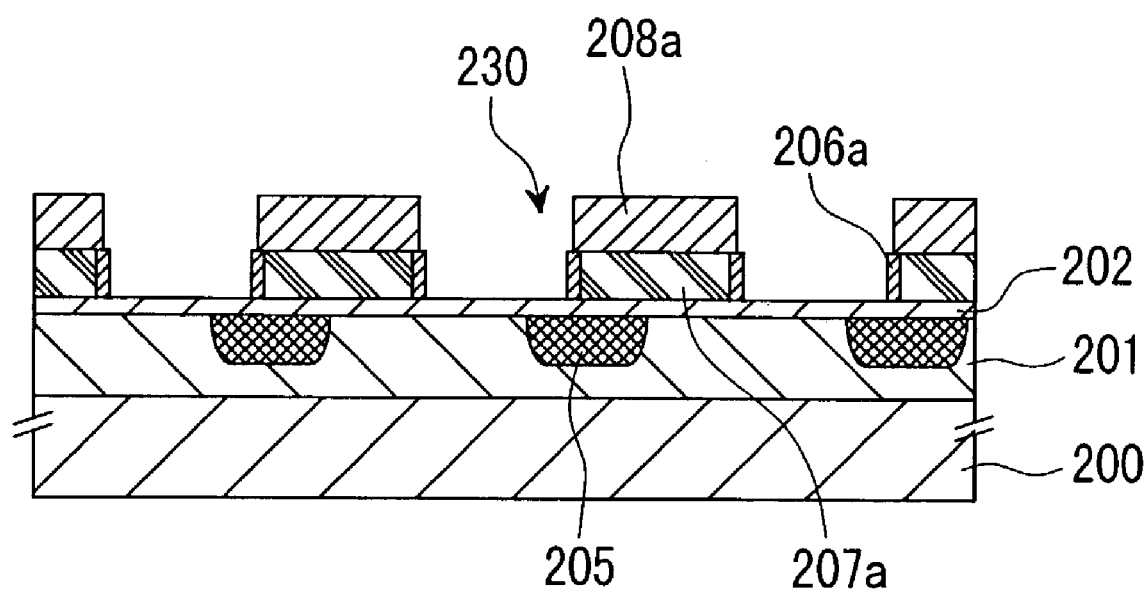
FIG. 8 is a sectional view illustrating a process step subsequent to FIG. 7C of the fabrication process of the nonvolatile semiconductor memory device in the first embodiment.

Next, silicon oxide films 206a each of which is used for separating the third gate 207a from the floating gate 203b are formed. The oxide films 206a can be formed by thermal oxidation of the polysilicon films 207a, deposition of oxide films by CVD or combination of both (FIG. 8).

Figure 9A:
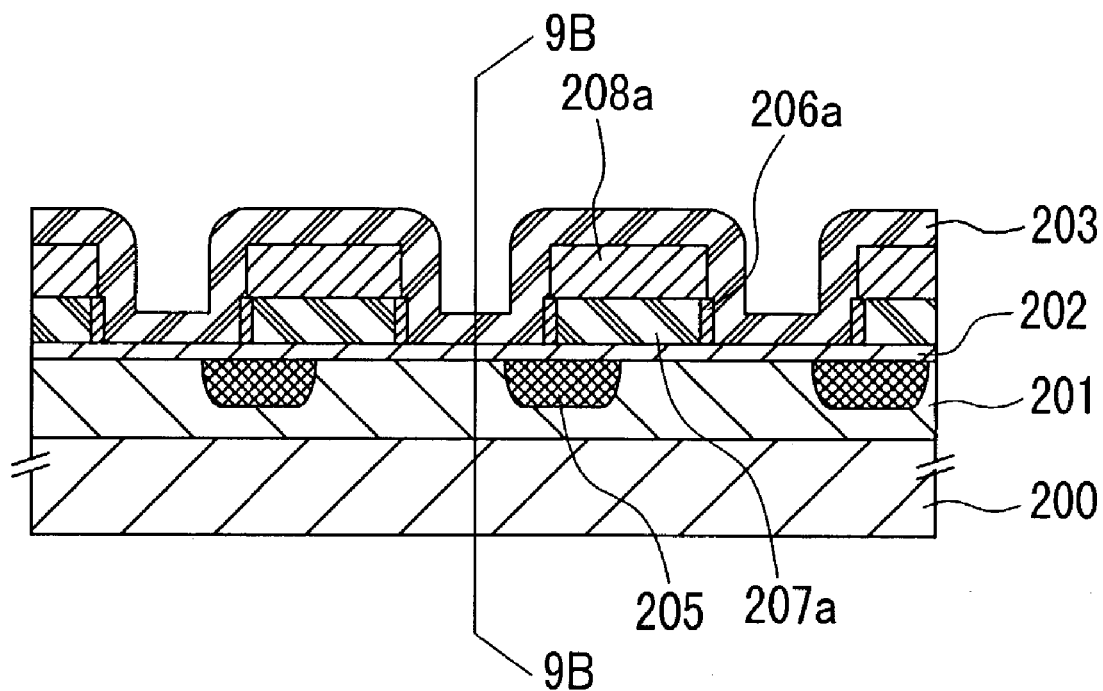
FIGS. 9A to 9B are sectional views illustrating a process step subsequent to FIG. 8 of the fabrication process of the nonvolatile semiconductor memory device in the first embodiment.
Figure 9B:
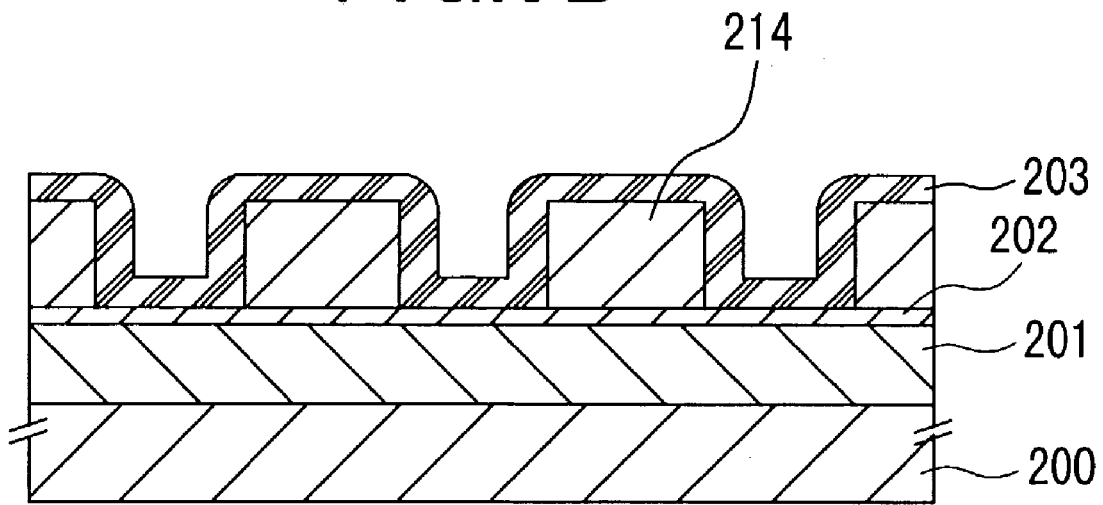

After that, a polysilicon film 203 doped with phosphor (P), which will be formed into the floating gates 203b, is deposited in such a manner as to avoid filling up the spaces perfectly (FIG. 9A). A section taken along the line 9B—9B in FIG. 9A is shown in FIG. 9B. Sections perpendicular to each other are used in the following description. Referring to FIGS. 9A to 13B, A-figures are sectional views showing sections taken in the direction of the word line and B-figures are sectional views showing sections perpendicular to the sections of A-figures.

Figure 10A:
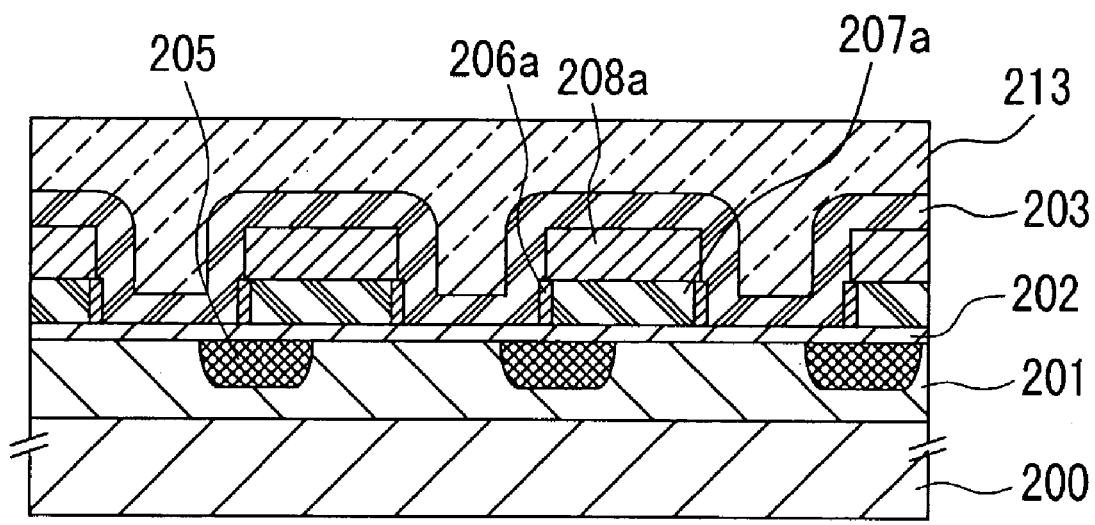
FIGS. 10A to 10B are sectional views illustrating a process step subsequent to FIGS. 9A and 9C of the fabrication process of the nonvolatile semiconductor memory device in the first embodiment.
Figure 10B:
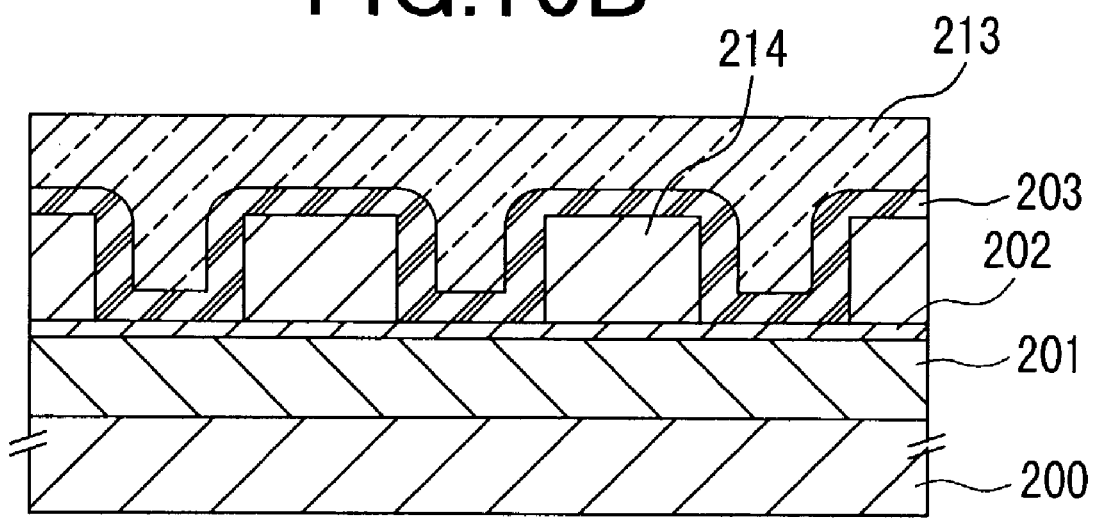

Then, gaps are filled with a resist 213. FIGS. 10A and 10B are sectional views showing the sections which are taken in the above-described directions after this process.

Figure 11A:
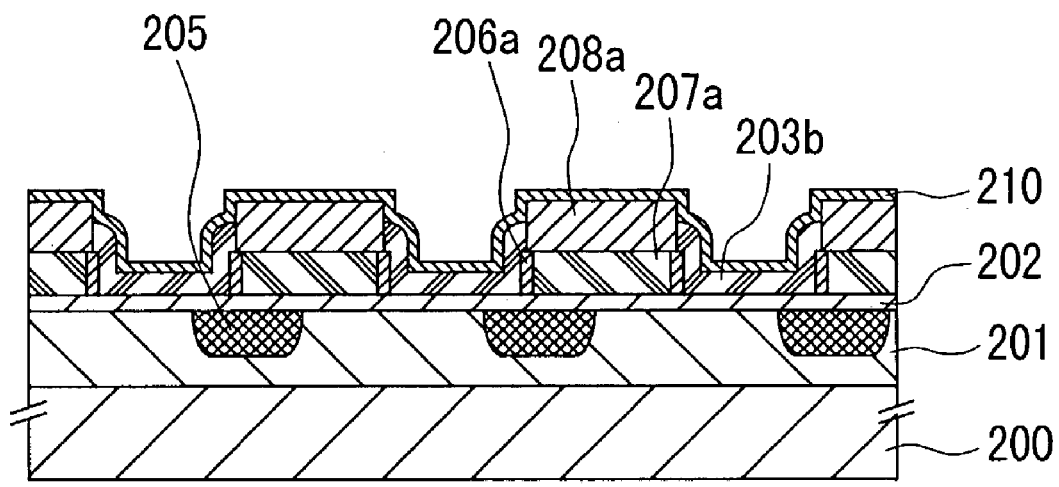
FIGS. 11A to 11B are sectional views illustrating a process step subsequent to FIGS. 10A and 10B of the fabrication process of the nonvolatile semiconductor memory device in the first embodiment.
Figure 11B:
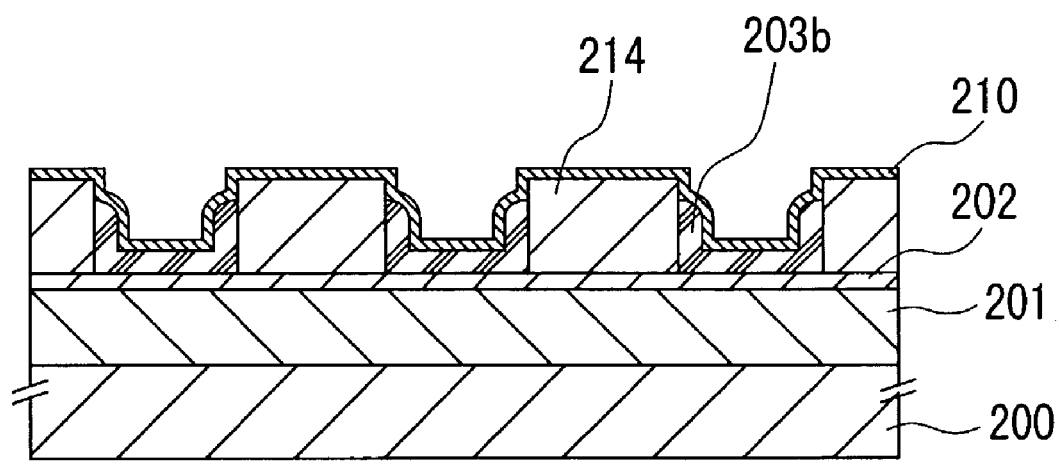

The polysilicon film 203 which will be formed into the floating gates 203b is processed to have desired shapes by performing etch backs on the resist and the polysilicon film 203. The processing on the polysilicon film 203 is performed in such a manner that a height of each of the floating gates 203b will be greater than that of the fifth insulating layers 214. On the thus-obtained semiconductor substrate, an insulating layer 210 for separating the floating gates from the word lines 211a which will be formed on the floating gates is formed. The insulating layer 210 is a silicon oxide film or a multilayer of silicon oxide film/silicon nitride film/silicon oxide film, for example (FIGS. 11A and 11B).

Figure 12A:
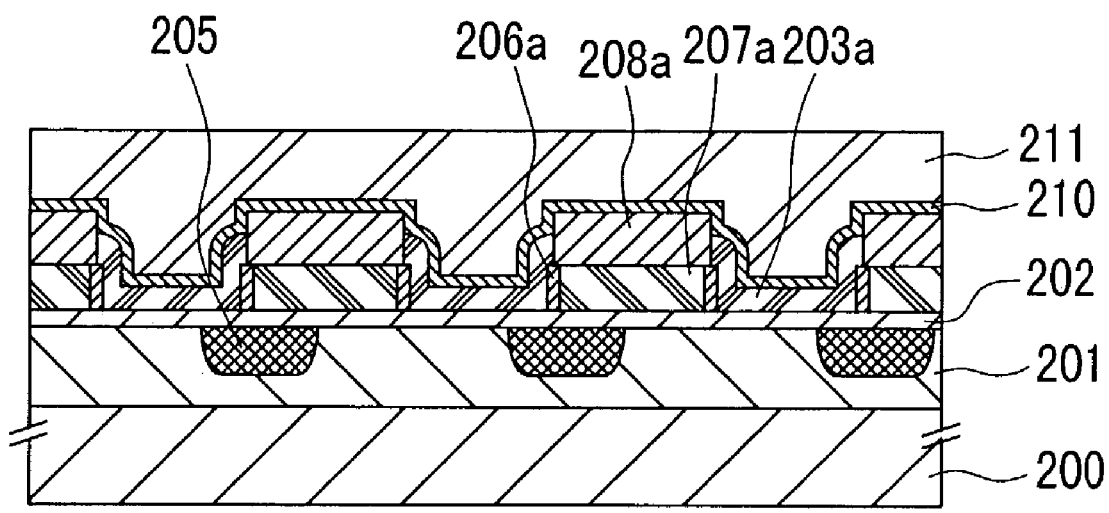
FIGS. 12A to 12B are sectional views illustrating a process step subsequent to FIGS. 11A and 11B of the fabrication process of the nonvolatile semiconductor memory device in the first embodiment.
Figure 12B:
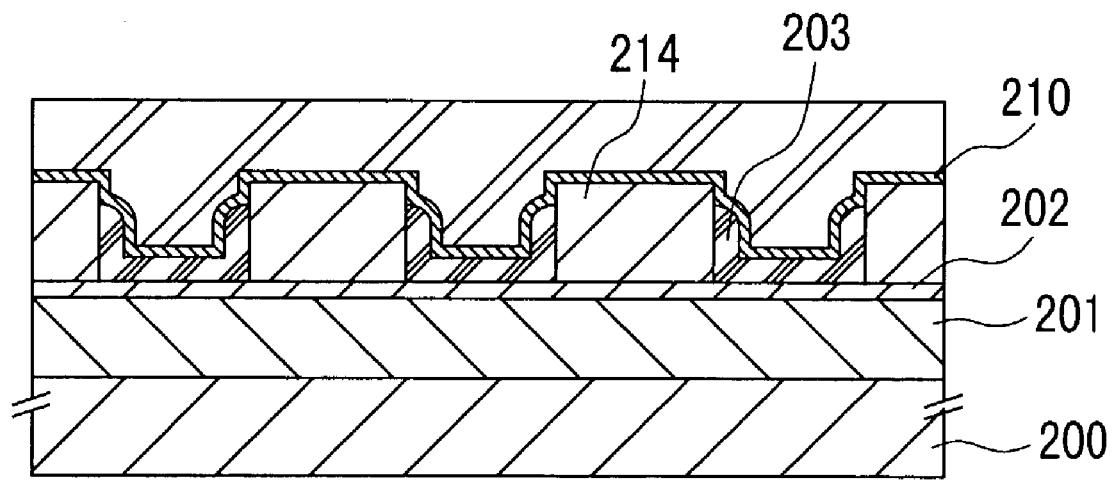

Then, a multilayer of a polysilicon film, a tungsten nitride film, and a tungsten film, which is a so-called polymetal film 211, is deposited. FIGS. 12A and 12B are sectional views showing the sections taken along both of the above-described directions after this process step.

Figure 13A:
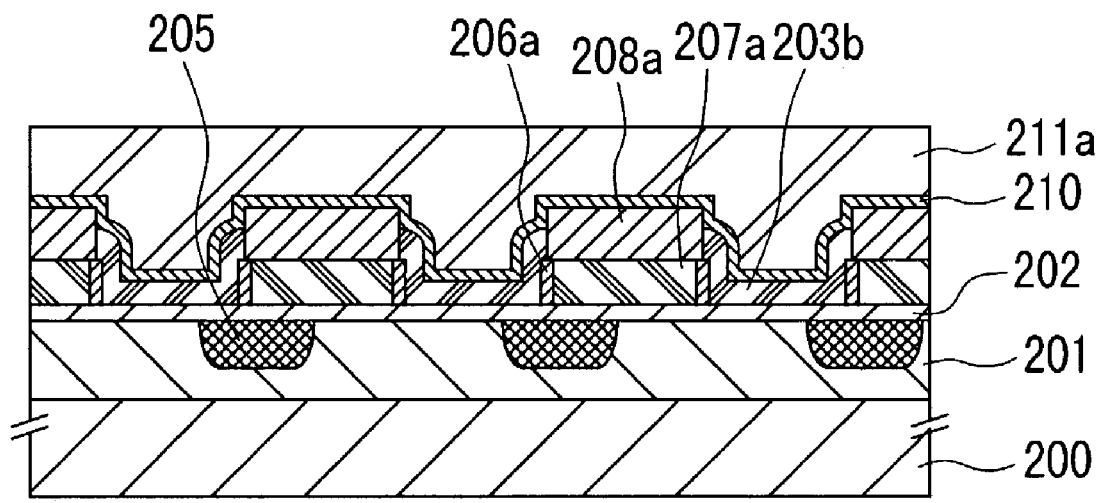
FIGS. 13A to 13B are sectional views illustrating a process step subsequent to FIGS. 12A and 12B of the fabrication process of the nonvolatile semiconductor memory device in the first embodiment.
Figure 13B:
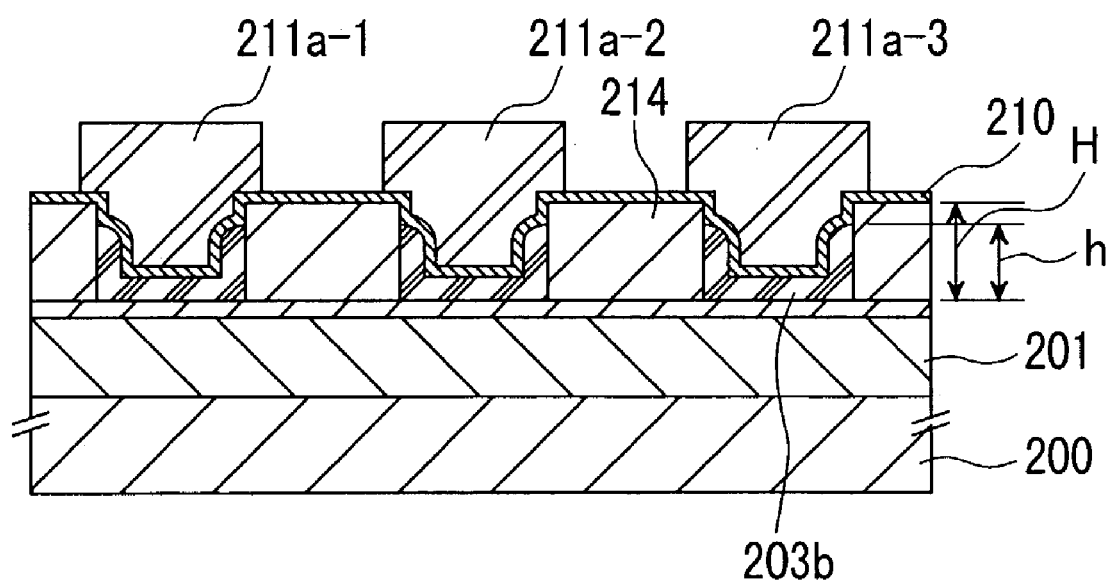

The thus-obtained substrate is then processed by a lithography and a dry etching technique to form the word lines (FIGS. 13A and 13B).

Conventionally, the silicon oxide film or the multilayer 210 of silicon film/silicon nitride film/silicon oxide film and the polysilicon film 207 must be etched after the above process step.

However, in the present embodiment, since the floating gates in the memory cells are perfectly separated from one another in the process step in FIGS. 11A and 11B, the word lines 211 have only to be processed after the above process step.

Further, the following advantages are also derived from the present embodiment. That is, the height h of the floating gates 203b is below the height H of the fifth insulating layers 214. Therefore, the processing being performed for the word line 211a using a dry etching is terminated at a stage where the surfaces of the fifth insulating layers 214 are exposed, so that it is possible to separate the adjacent word lines 211a-1, 211a-2, and 211a-3 from one another. Furthermore, even if a misalignment between the floating gate 203b and the word line 211a occurs, the capacitance of a capacitor formed between the floating gate 203b and the control gate 211a with the interpoly dielectric film being formed therebetween is not reduced. In addition, since the control gates and the word lines are integrally formed, they are referred to by the identical reference numeral 211a.

Figure 14A:
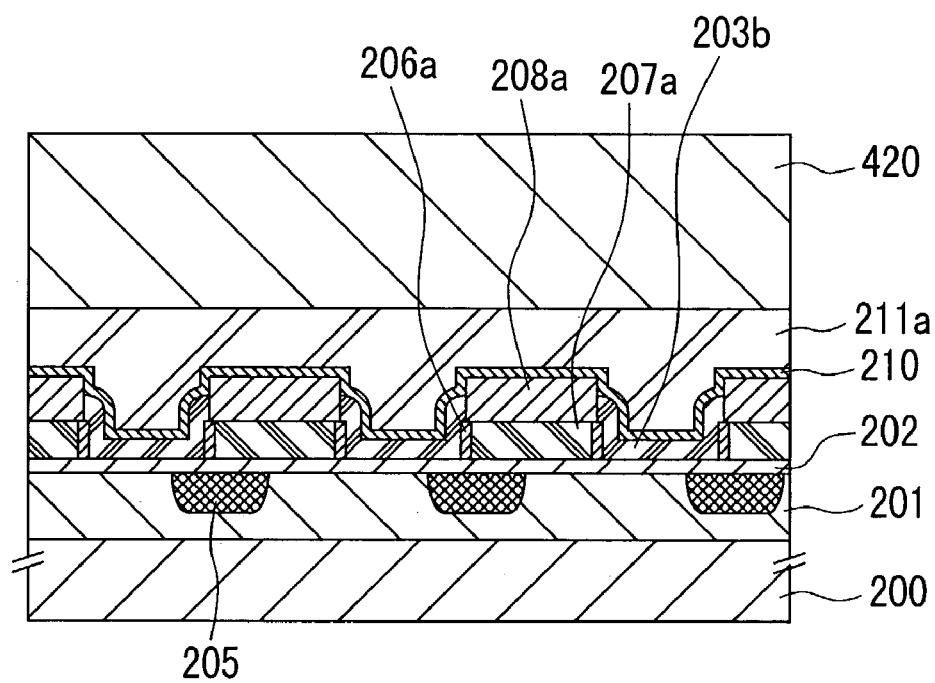
FIGS. 14A and 14B are sectional views showing the complete nonvolatile semiconductor memory device in the first embodiment.
Figure 14B:
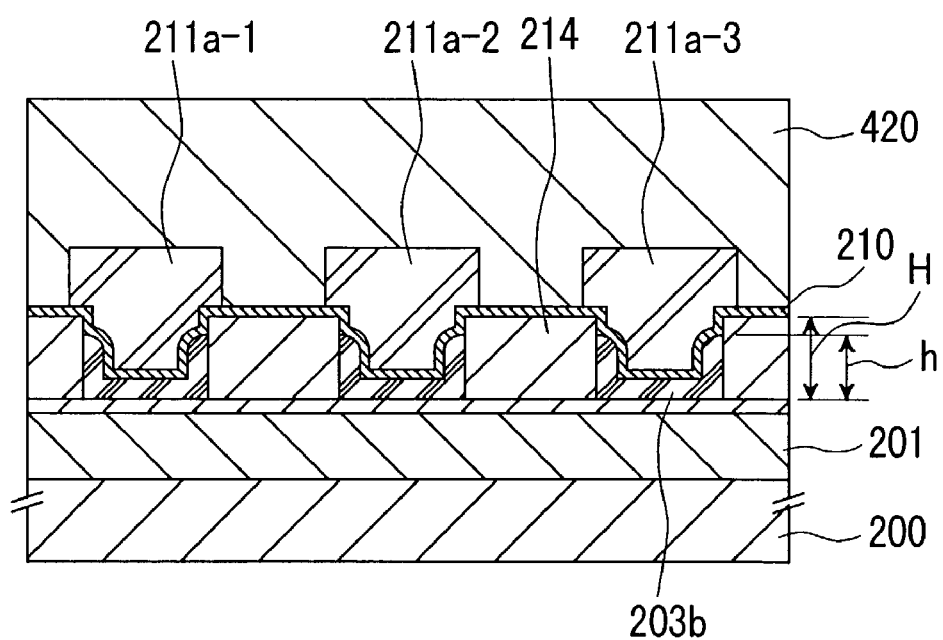

After forming the interpoly dielectric film 420, contact holes extending to the word lines 211a, the source and drain diffusion layers 205, the well 201, and the third gates 203a are formed. After that, a metal film is deposited and then patterned to form wirings, whereby the fabrication of memory cells is completed. FIG. 14A and 14B are sectional views showing the thus obtained memory cells, the sections being taken along both of the above-described directions.

Figure 19:
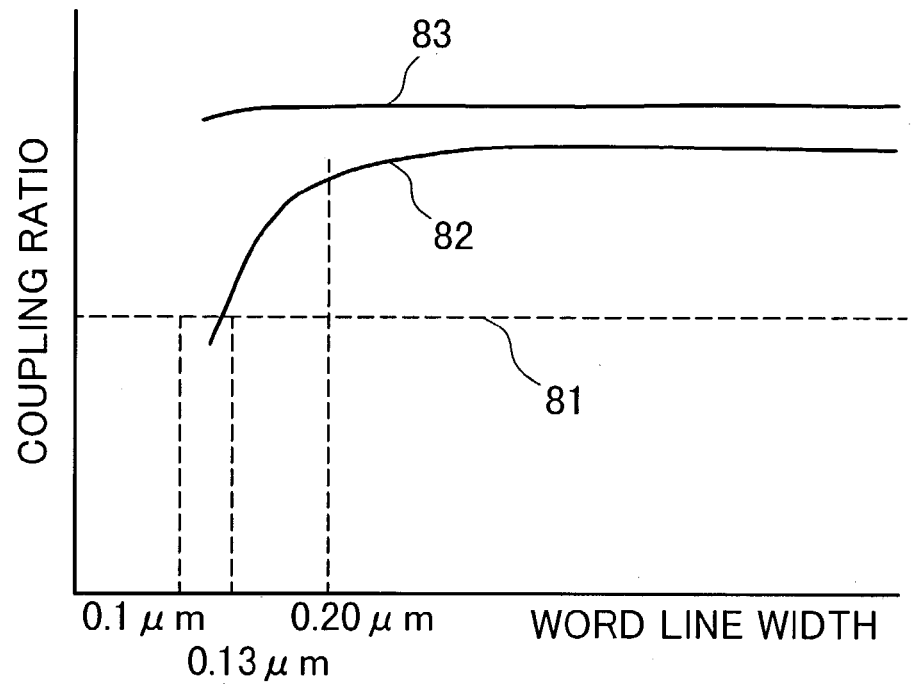
FIG. 19 is a graph showing a relationship between a design word line width and a coupling ratio in the memory cell.

FIG. 19A is a graph showing the dependency of the coupling ratio on the word line width in the memory cells of the nonvolatile semiconductor memory device of the present embodiment, the coupling ratio being compared with that of memory cells fabricated by the conventional technique. A line width when it was designed is used to enter the horizontal axis, and the coupling ratio is used to enter the vertical axis. In addition, the coupling ratio corresponds to an increasing rate of a floating gate voltage with respect to a control gate voltage. More specifically, if the control gate voltage and the floating gate voltage are used to draw an X-Y graph, the curve corresponds to the coupling ratios. In this case, the floating gate voltage applied when the control gate voltage is 0 V, i.e., a segment in the X-Y graph, is determined based on an amount of charges accumulated in the floating gate. A curve 81 indicates a limit value of rate controlling on a chip performance which is achieved by a characteristic of a single memory cell. A curve 82 is a characteristic of the memory cell fabricated by the conventional technique, and a curve 83 is a characteristic of the memory cell according to the present invention. As used herein, the conventional fabrication method is the method of processing a multilayer of a control gate, an interpoly dielectric film, and a floating gate in a batch manner to form desired shapes with the three layers being stacked after the deposition of each of the control gate, the interpoly dielectric film, and the floating gate. As seen in the comparison shown in FIG. 19, the memory cell of the present embodiment ensures the high coupling ratio even if the word line width is narrowed. In particular, an apparent effect is observed when the word line with is 0.13 µm or less.

Second Embodiment

In the first embodiment, after exposing the fourth insulating layers 208a as shown in FIG. 7C, the fifth insulating layers 214 are selectively etched by using the resist pattern as the mask. In the selective etching process, it is possible to etch also the fourth insulating layers 208a to a certain extent with a reduced ratio of the selection. If portions of the fourth insulating layers 208a are etched, a height of side walls of each of the fifth insulating layers 214 becomes greater than those of the third gates 207a and the fourth insulating layers 208a as it is apparent when viewed from the spaces formed through the first gate oxide film 202 on the silicon substrate.

Figure 20:
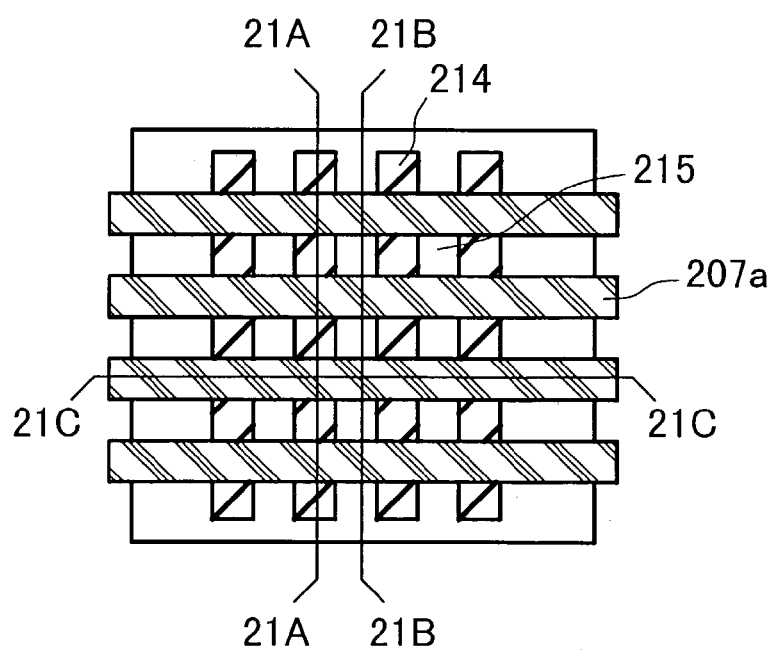
FIG. 20 is a partial plan view showing an example of a nonvolatile semiconductor memory device in a second embodiment according to the present invention.

In the present embodiment, process steps shown in FIGS. 6A to 7C are performed in the same manner as in the first embodiment, and the fourth insulating layers 208a are etched to a somewhat large extent as mentioned above. After that, in the same manner as in the first embodiment, silicon oxide films 206 for separating the third gates 207a from the floating gates 203b are formed. The silicon oxide films 206 may be formed by thermal oxidization of the polysilicon 207a, deposition of oxide films by CVD, or combination of both as described in the foregoing. Sections taken along the lines 21A—21A, the line 21B—21B, and the line 21C—21C in FIG. 20 are shown as FIGS. 21A to 21C. In FIGS. 21A to 25C, A-figures, B-figures, and C-figures are sectional views taken in the same manner as in FIG. 20.

Figure 22A:
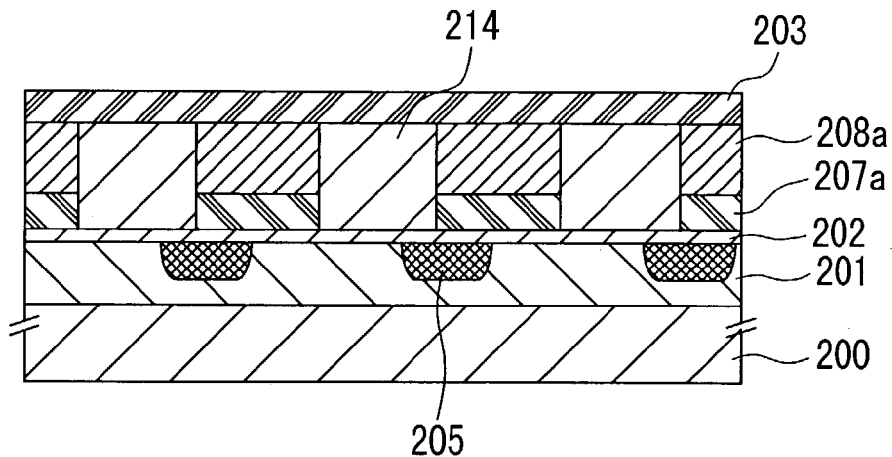
FIGS. 22A to 22C are sectional views illustrating a process step subsequent to FIGS. 21A to 21C of the fabrication process of the nonvolatile semiconductor memory device in the second embodiment, the sections being taken along the three lines indicated in FIG. 20.
Figure 22B:
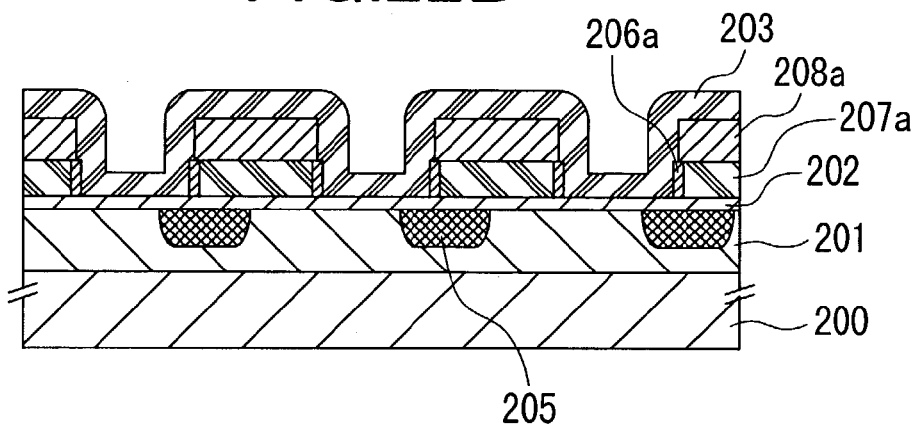
Figure 22C:
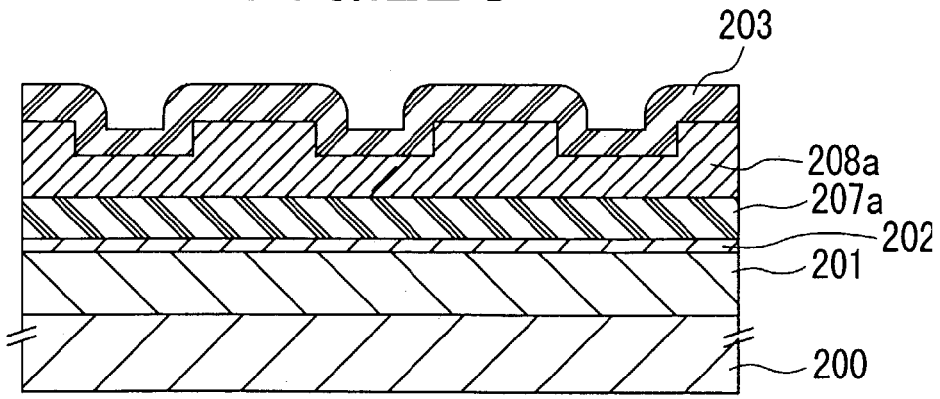

Then, a polysilicon film 203 doped with phosphor (P), which will be formed into the floating gates 203b, is deposited in such a manner as to avoid filling up the spaces perfectly. Sectional views of this state are shown in FIGS. 22A to 22C.

A resist is then applied to fill gaps. The resist and the polysilicon film 203 are etched back to pattern the polysilicon film 203 as a floating gate, thereby forming the floating gates 203b. In this case, a height of the floating gates 203b is set to be below that of the fifth insulating layers 214. As used herein, the height means a height from the semiconductor substrate surface, not a thickness of each of the layers.

Figure 23A:
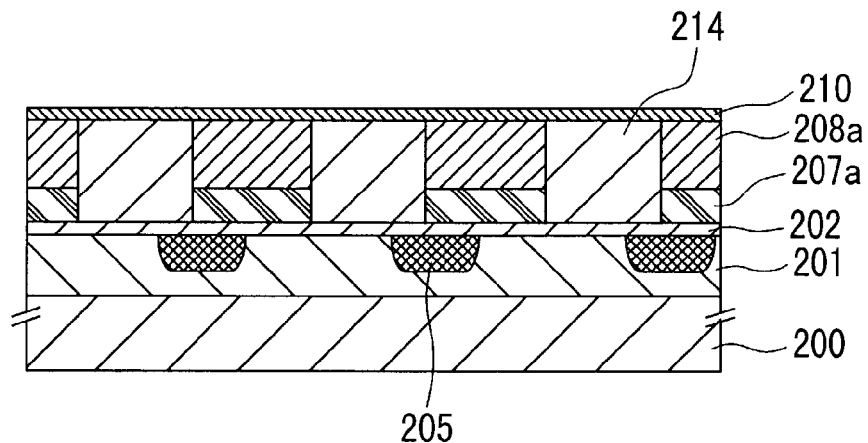
FIGS. 23A to 23C are sectional views illustrating a process step subsequent to FIGS. 22A to 22C of the fabrication process of the nonvolatile semiconductor memory device in the second embodiment, the sections being taken along the three lines indicated in FIG. 20.
Figure 23B:
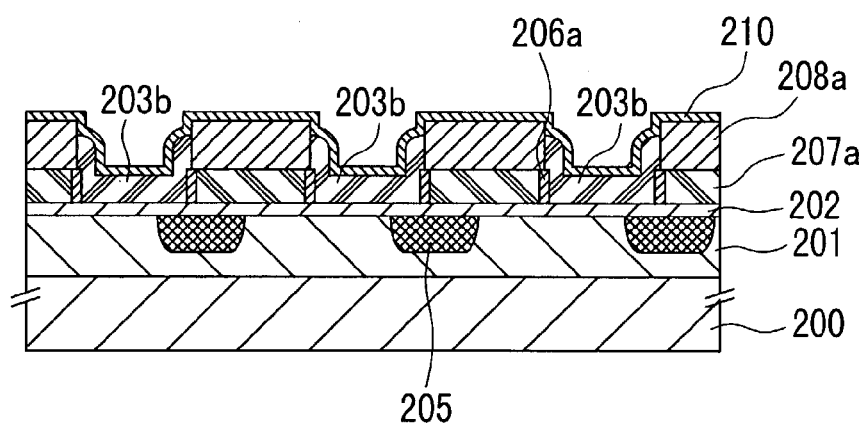
Figure 23C:
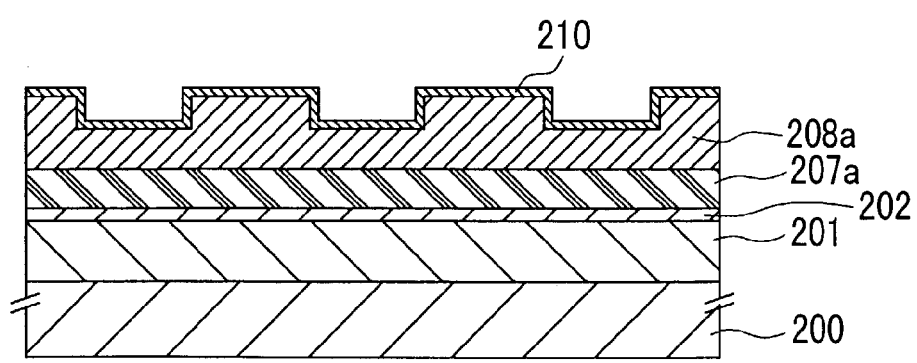

An insulating layer 210 for separating the floating gates 203b from word lines 211a will be formed (FIGS. 23A to 23C). The insulating layer 210 may be a silicon oxide film or a multilayer of silicon oxide film/silicon nitride film/silicon oxide film.

Figure 24A:
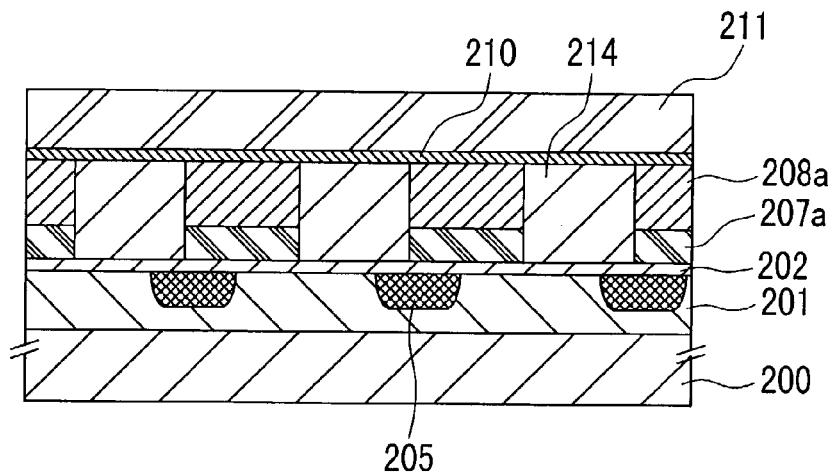
FIGS. 24A to 24C are sectional views illustrating a process step subsequent to FIGS. 23A to 23C of the fabrication process of the nonvolatile semiconductor memory device in the second embodiment, the sections being taken along the three lines indicated in FIG. 20.
Figure 24B:
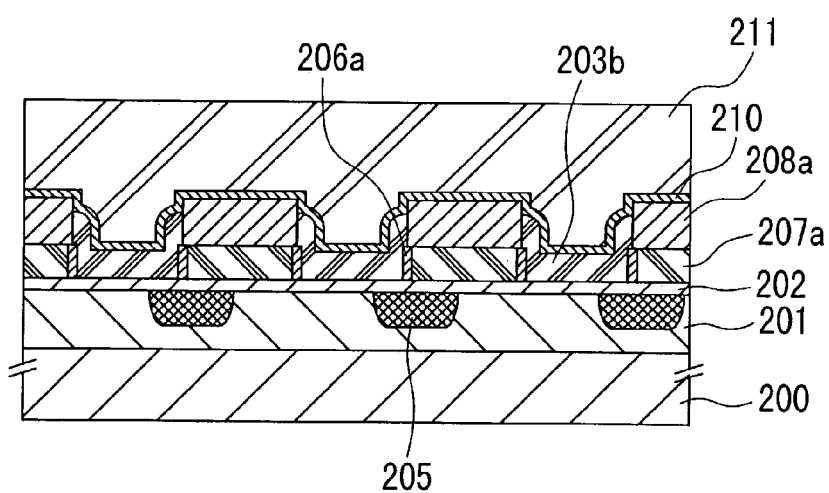
Figure 24C:
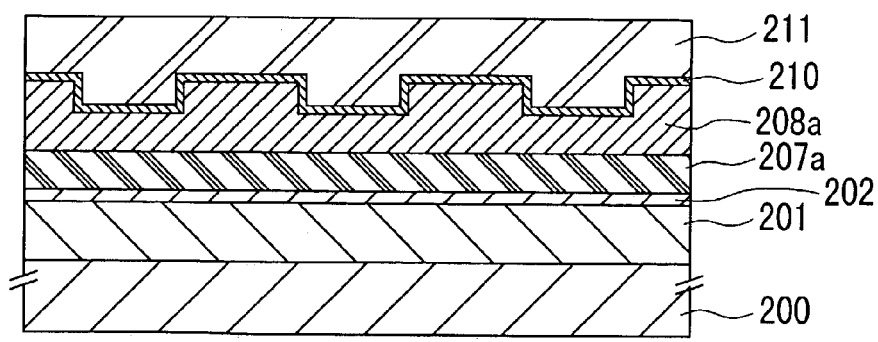

Then, a multilayer of a polysilicon film, a tungsten nitride film, and a tungsten film, which is a so-called polymetal film 211, is deposited (FIGS. 24A to 24C).

Figure 21A:
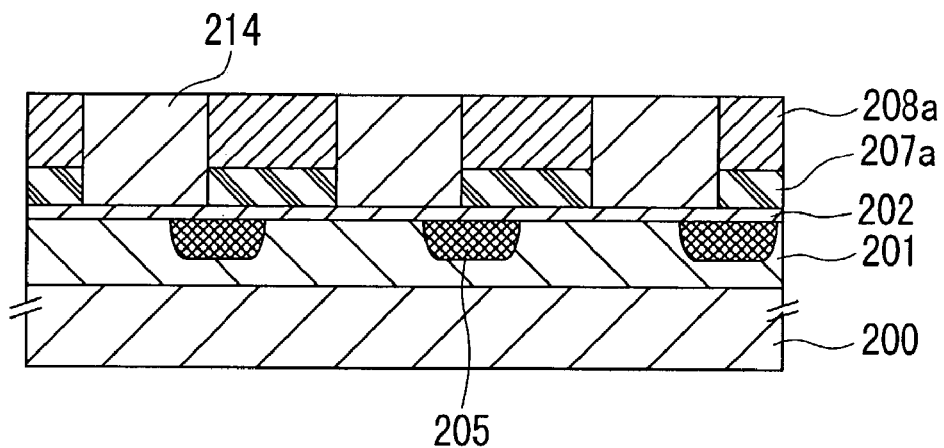
FIGS. 21A to 21C are sectional views illustrating an example of a fabrication process of the nonvolatile semiconductor memory device in the second embodiment, the sections being taken along the three lines indicated in FIG. 20.
Figure 21B:
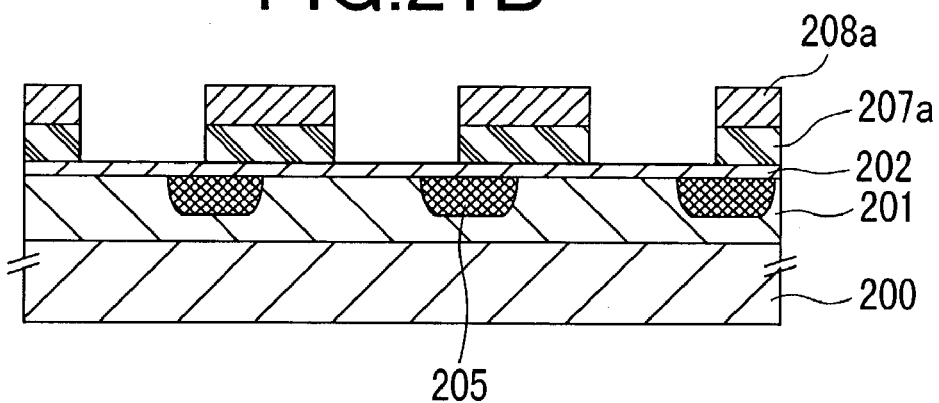
Figure 21C:
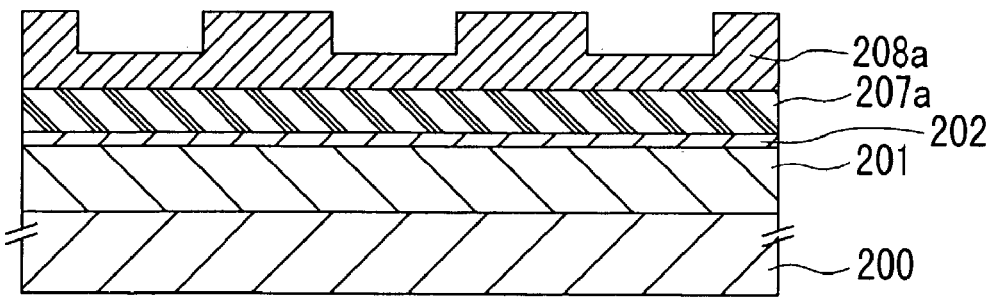

In the second embodiment, an etch back or a chemical mechanical polishing technique is used in place of a mask. It is possible to separate the adjacent word lines 211 from each other by removing the word line material until the second insulating layer 210, which is formed on the fourth insulating layers 208a and the fifth insulating layers 214, is exposed as shown in FIG. 21A (sectional view taken along the line 21A—21A in FIG. 20). Specifically, the word lines 211a-1, 211a-2, and 211a-3 are examples of the separated word lines.

Figure 25A:
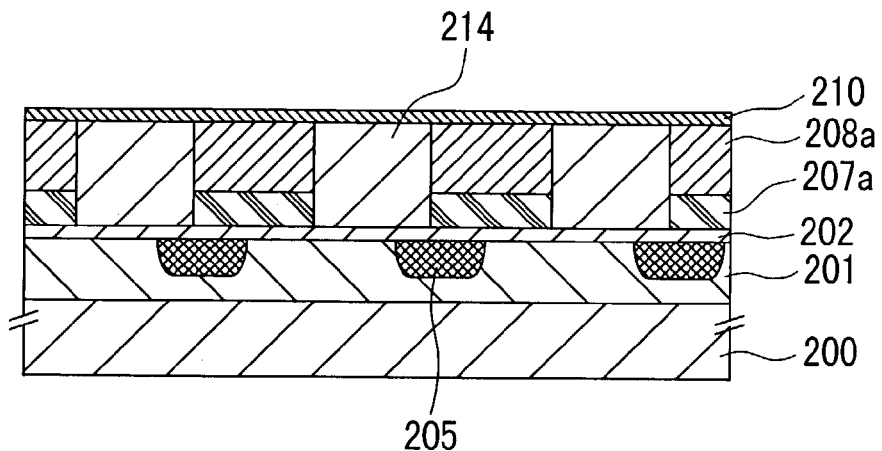
FIGS. 25A to 25C are sectional views illustrating a process step subsequent to FIGS. 24A to 24C of the fabrication process of the nonvolatile semiconductor memory device in the second embodiment, the sections being taken along the three lines indicated in FIG. 20.
Figure 25B:
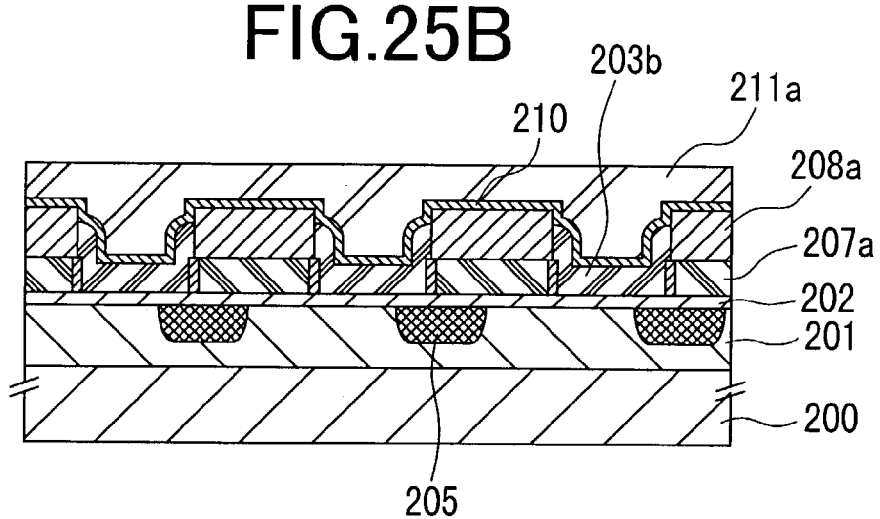
Figure 25C:
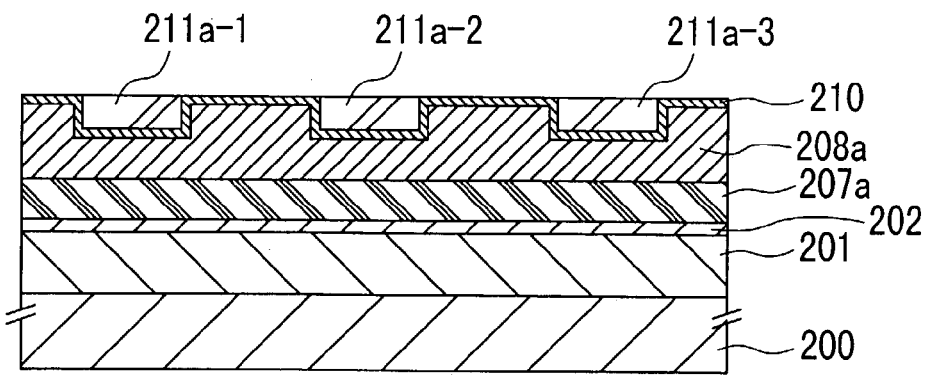
Figure 26A:
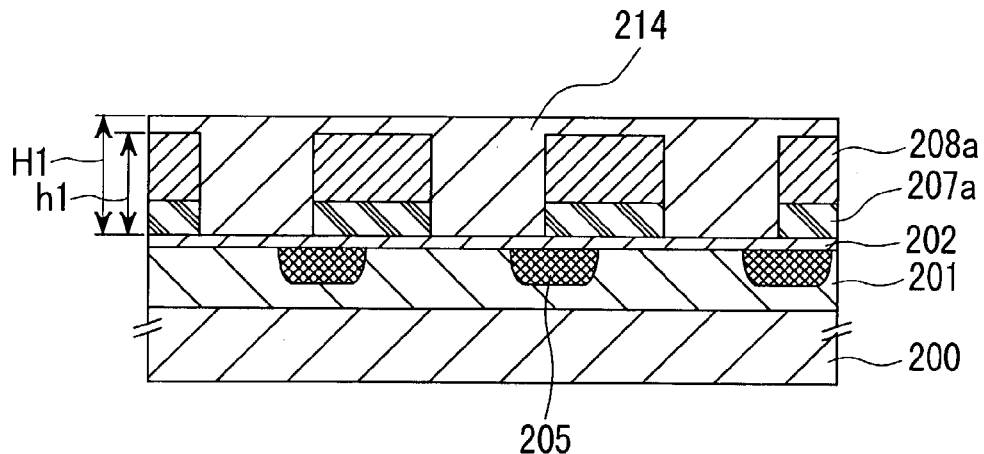
FIGS. 26A to 26C are sectional views illustrating an example of a fabrication process of a nonvolatile semiconductor memory device in a third embodiment, the sections being taken along the three lines indicated in FIG. 20.
Figure 26B:
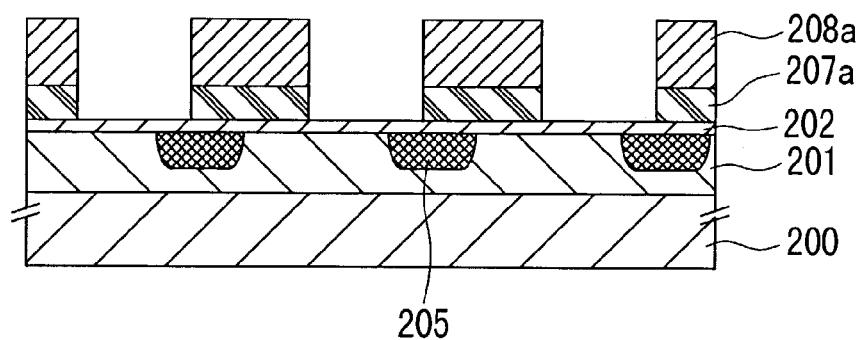
Figure 26C:
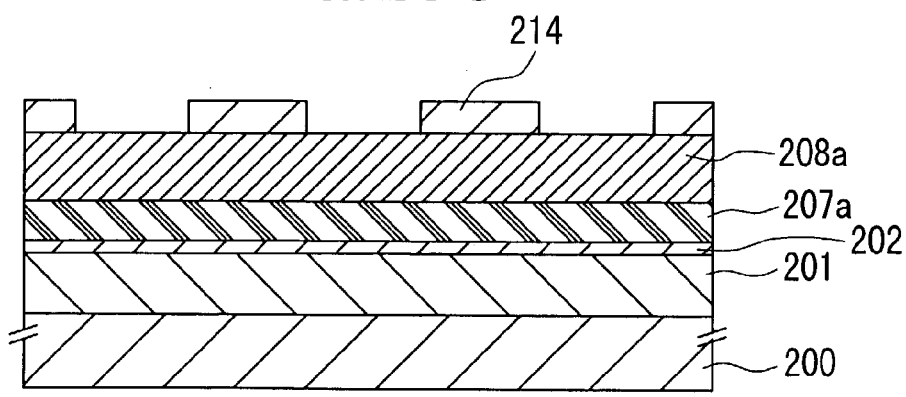

This process step takes advantage of the fact that a height of the second insulating layer 210, which is formed on the fourth insulating layers 208a and the fifth insulating layers 214, as viewed in the section taken along the line 21A—21A in FIG. 20 is always greater than that of the second insulating layer 210 as viewed in the section taken along the line 21B—21B in FIG. 20 (FIGS. 25A to 25C).

In this case, the capacitance of a capacitor which is formed between the floating gate and the control gate with the interpoly dielectric film 210 being layered therebetween is not reduced since the second insulating layer 210 on the floating gates 203b is not exposed.

After forming the interpoly dielectric film, contact holes extending to the word lines 211a, the source and drain diffusion layers 205, the well 201, and the third gates 203a are formed. After that, a metal film is deposited and then patterned to form wirings, whereby the fabrication of memory cells is completed.

As in the first embodiment, a high coupling ratio is ensured even if the word line width is narrowed in the memory cells according to the present embodiment. In particular, an apparent effect is observed when the word line with is 0.13 μm or less.

Third Embodiment

In the first and second embodiments, the fifth insulating layer 214 is deposited followed by the exposition of the fourth insulating layers 208a and then the fifth insulating layer 214 is processed to form the spaces 230 on the first gate oxide film 202 over the silicon substrate.

In turn, in the third embodiment, the fifth insulating layer 214 is patterned in a state where the fourth insulating layers 208a are covered perfectly with the fifth insulating layer 214 by a dry etching technique using the resist pattern as a mask. In this case, even if the etching is performed under the condition of selectively etching the fifth insulating layer 214, a height H1 of the insulating layers 214 is originally greater than a height h1 of the fourth insulating layers 208a.

Figure 27A:
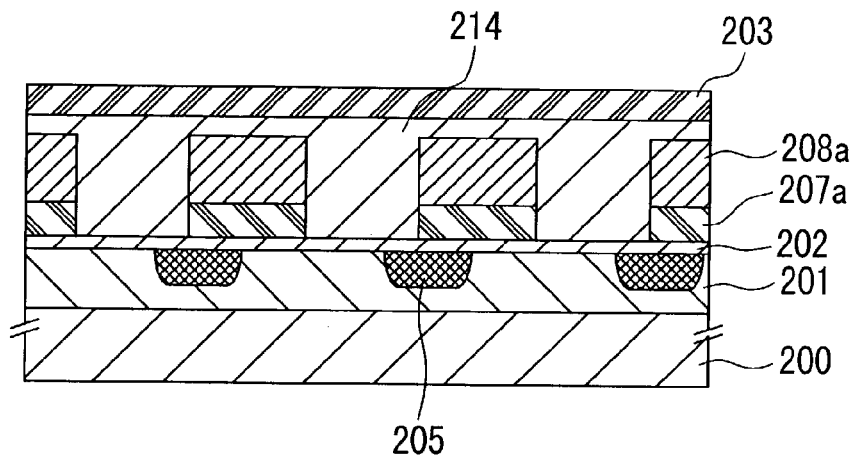
FIGS. 27A to 27C are sectional views illustrating a process step subsequent to FIGS. 26A to 26C of the fabrication process of the nonvolatile semiconductor memory device in the third embodiment, the sections being taken along the three lines indicated in FIG. 20.
Figure 27B:
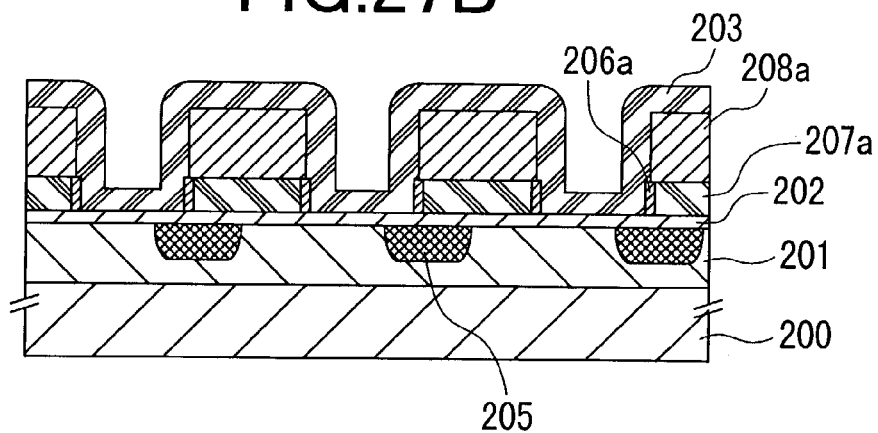
Figure 27C:
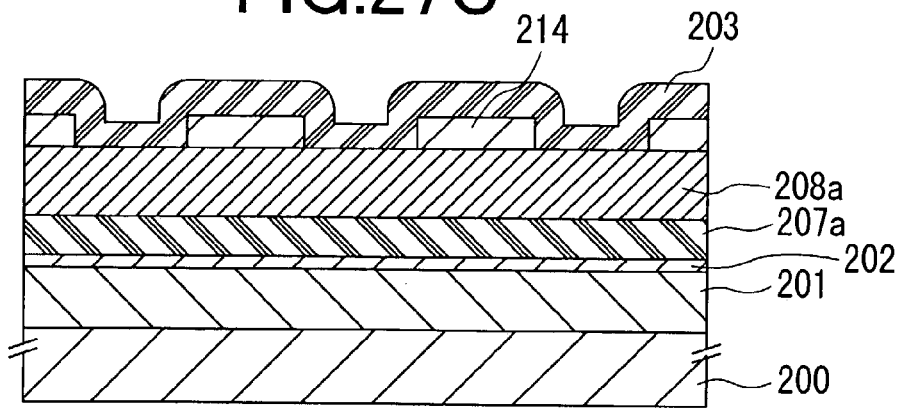

More specifically, in the present embodiment, process steps until FIG. 7B are the same as those of the first embodiment. Sectional views of the process step taken along the lines 21A—21A, 21B—21B, and 21C—21C in FIG. 20 are shown in FIGS. 27A to 27C.

Similar to the first embodiment, silicon oxide films 206a for separating the third gates 207a from the floating gates 203b are formed by thermal oxidization of the polysilicon 207a, deposition of oxide films by CVD, or a combination of both.

Figure 28A:
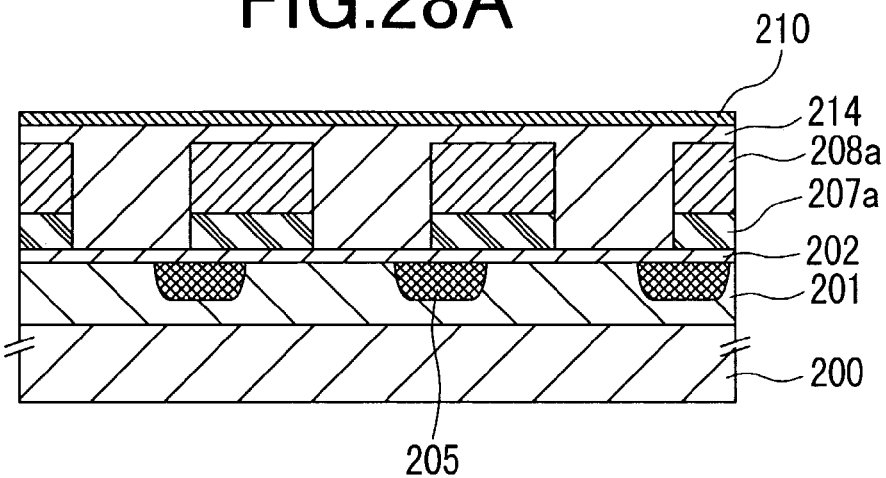
FIGS. 28A to 28C are sectional views illustrating a process step subsequent to FIGS. 27A to 27C of the fabrication process of the nonvolatile semiconductor memory device in the third embodiment, the sections being taken along the three lines indicated in FIG. 20.
Figure 28B:
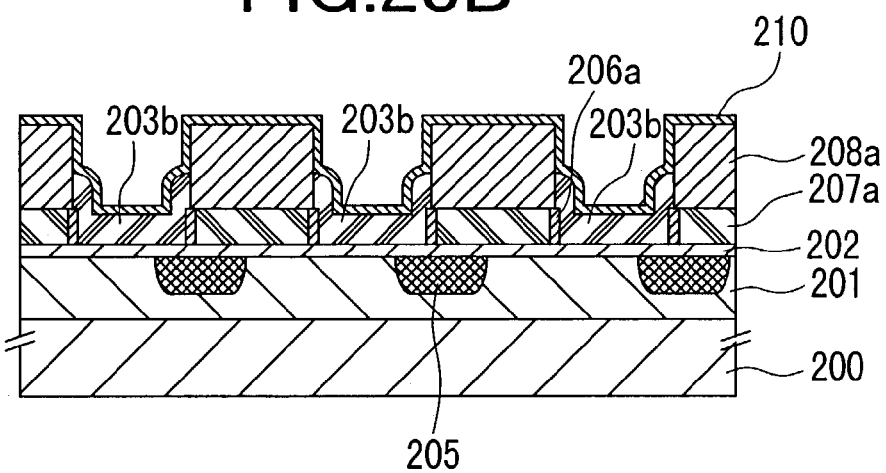
Figure 28C:
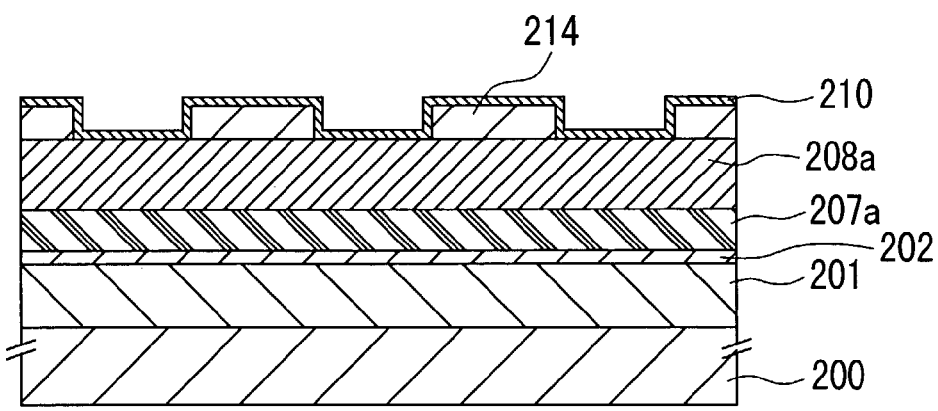

Then, a polysilicon film 203 doped with phosphor (P), which will be formed into the floating gates 203b, is deposited in such a manner as to avoid filling up the spaces perfectly (FIGS. 28A to 28C).

A resist is then applied to fill gaps. The resist and the polysilicon film 203 are etched back to pattern the polysilicon film 203 as a floating gate, thereby forming the floating gates 203b. In this case, a height of the floating gates 203b is set to be below that of the fifth insulating layers 214.

Figure 29A:
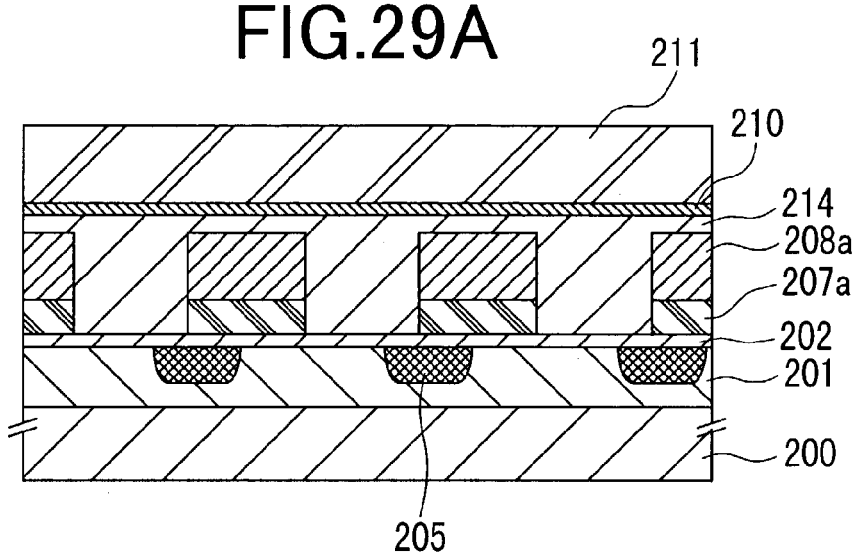
FIGS. 29A to 29C are sectional views illustrating a process step subsequent to FIGS. 28A to 28C of the fabrication process of the nonvolatile semiconductor memory device in the third embodiment, the sections being taken along the three lines indicated in FIG. 20.
Figure 29B:
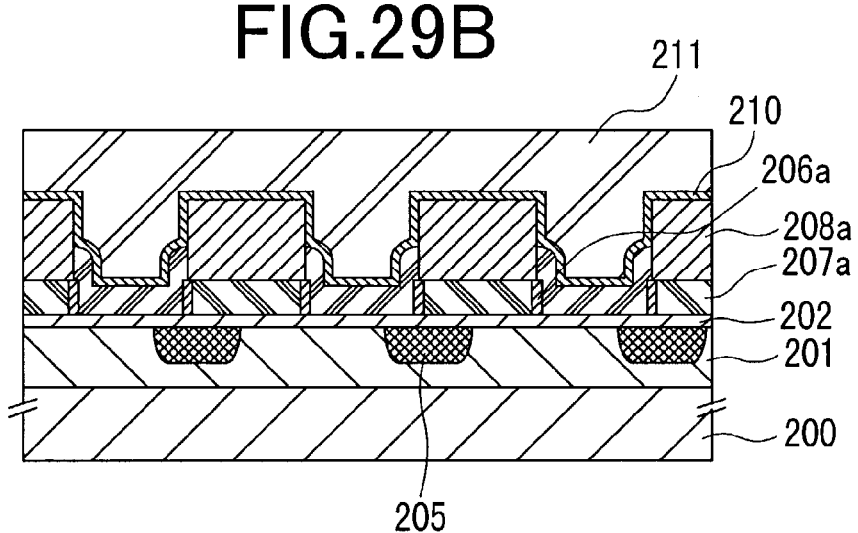
Figure 29C:
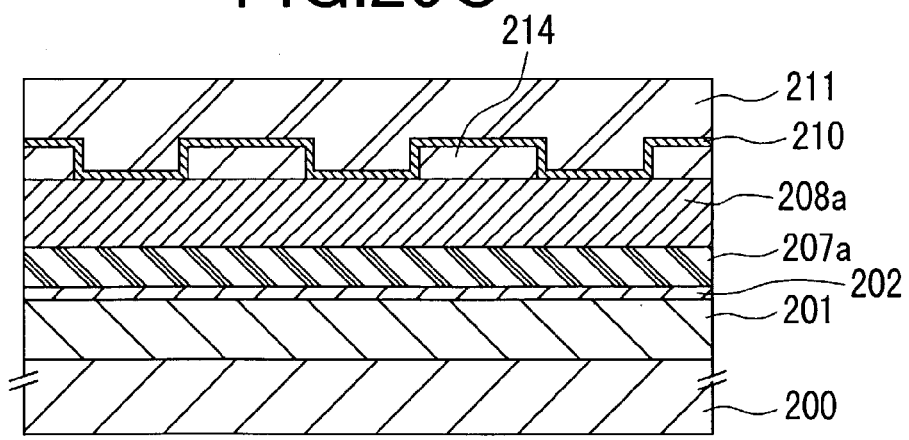

After that, an insulating layer 210 for separating the floating gates 203b from the word lines 211a is formed (FIGS. 29A to 29C). The insulating layer 210 may be a silicon oxide film or a multilayer of silicon oxide film/silicon nitride film/silicon oxide film.

Figure 30A:
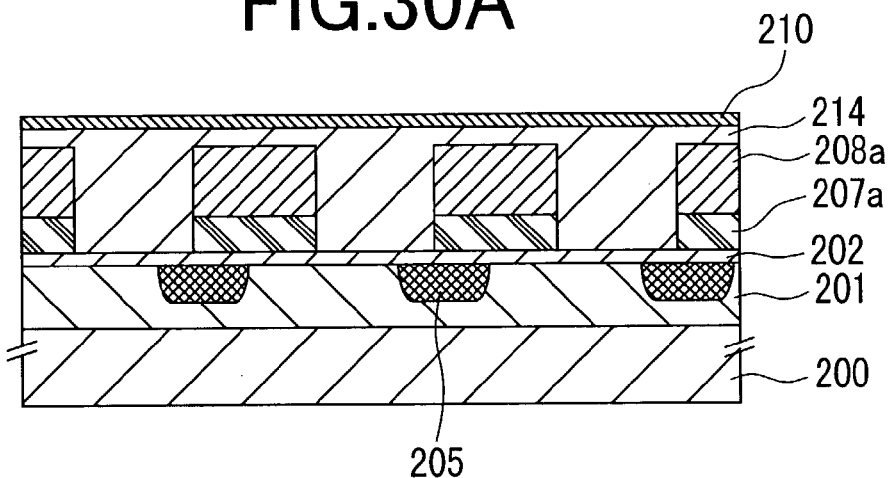
FIGS. 30A to 30C are sectional views illustrating a process step subsequent to FIGS. 29A to 29C of the fabrication process of the nonvolatile semiconductor memory device in the third embodiment, the sections being taken along the three lines indicated in FIG. 20.
Figure 30B:
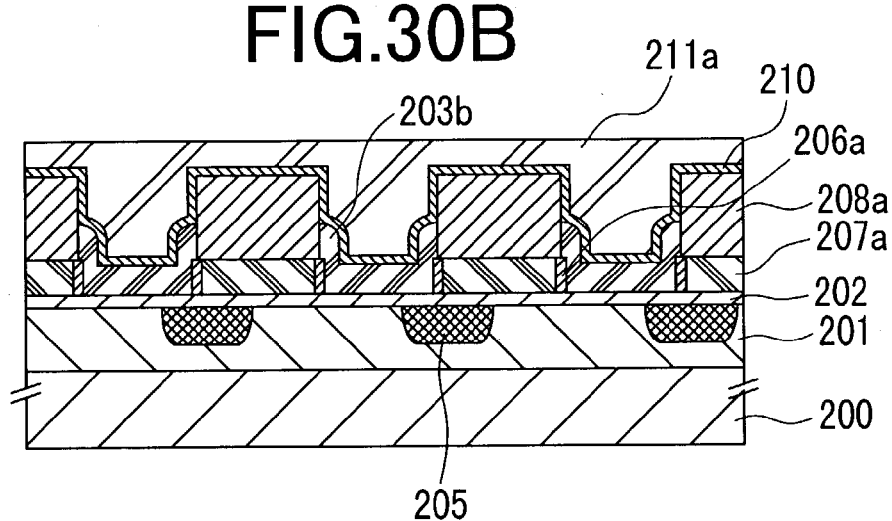
Figure 30C:
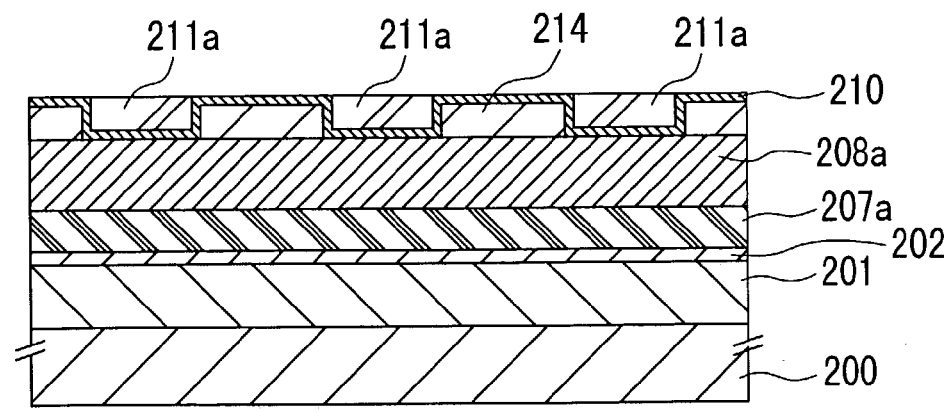

Then, a multilayer of a polysilicon film, a tungsten nitride film, and a tungsten film, which is a so-called polymetal film 211, is deposited (FIGS. 30A to 30C).

In the present embodiment, an etch back or a chemical mechanical polishing technique is used in place of a mask.

It is possible to separate the adjacent word lines by removing the word line material to such an extent that the second insulating layer formed on the fourth insulating layers 208a and the fifth insulating layers 214 (shown in FIG. 30A) are exposed. This process step takes advantage of the fact that a height of the second insulating layer 210, which is formed on the fourth insulating layers 208a and the fifth insulating layers 214, as viewed in the section taken along the line 21A—21A in FIG. 20 is always greater than that of the second insulating layer 210 as viewed in the section taken along the line 21B—21B in FIG. 20 (FIGS. 30A to 30C).

In this case, the capacitance of a capacitor which is formed between the floating gate and the control gate with the interpoly dielectric film 210 being layered therebetween is not reduced since the second insulating layer on the floating gate 203b is not exposed.

After forming the interpoly dielectric film, contact holes extending to the word lines 211a, the source/drain diffusion layers 205, the wells 201, and the third gates 203a are formed (not shown). Then, a metal film is deposited and then patterned to form wirings, whereby the fabrication of memory cells is completed.

As in the first embodiment, a high coupling ratio is ensured even if the word line width is narrowed in the memory cells according to the present embodiment. In particular, an apparent effect is observed when the word line with is 0.13 μm or less.

Fifth Embodiment

In the first to third embodiments, the silicon oxide film is used as the fourth insulating layer for separating the third gate from the second gate, and the silicon nitride film is used as the fifth insulating layer for separating the floating gates formed under the word lines from one another. However, the silicon nitride film and the silicon oxide film may be used as the fourth insulating layer and as the fifth insulating layer, respectively.

Since a dielectric constant of the silicon film is lower than that of the silicon nitride film, the parasitic capacitance between the adjacent word lines is reduced by using the silicon nitride film and the silicon oxide film as the fourth insulating layer and the fifth insulating layer. Therefore, such fourth and fifth insulating layers are advantageous for reducing the word line pitch.

As in the first embodiment, a high coupling ratio is ensured even if the word line width is narrowed in the memory cells according to the present embodiment. In particular, an apparent effect is observed when the word line with is 0.13 μm or less.

Sixth Embodiment

While, in the first to fifth embodiments, the split gate type memory cells are used as examples, a stack type memory cell is used as an example in the sixth embodiment.

FIGS. 31A to 39C are sectional views showing process steps of an example of a fabrication process of a nonvolatile semiconductor memory device of the present embodiment, the sectional views being indicated in order of the process steps.

Figure 31A:
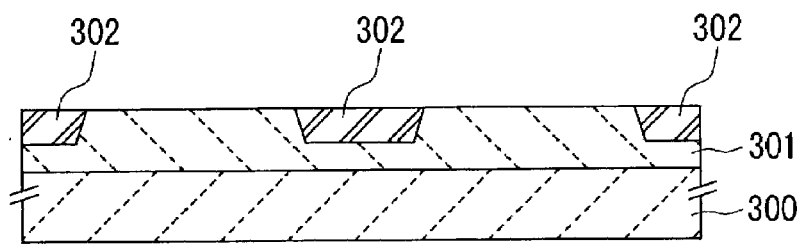
FIGS. 31A to 31D are sectional views illustrating a fabrication process of a nonvolatile semiconductor memory device in a sixth embodiment.
Figure 31B:
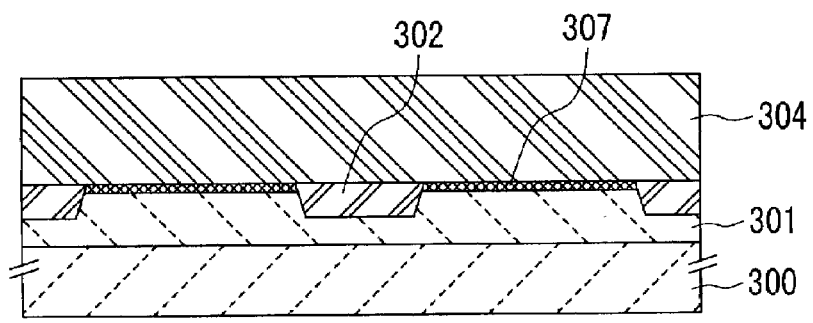
Figure 31C:
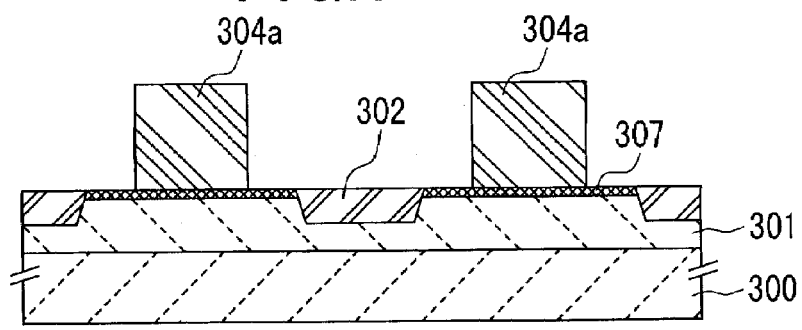
Figure 31D:
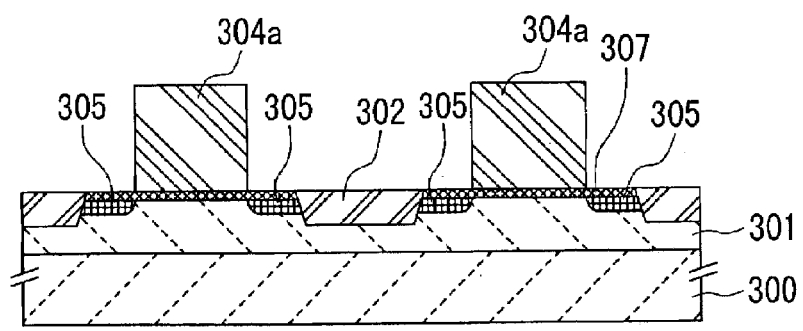

Firstly, a p-type (first conductivity type) well 301 is formed on a semiconductor substrate 300. As described in the foregoing, a part of the well is shown in FIGS. 31A to 39C. A field oxide film 302 which will be formed into an elements separation region is formed in this well by a known method (FIG. 31A). Then a silicon oxide film 307 is formed on a surface of the semiconductor base by, for example, thermal oxidization. A silicon nitride film (third insulating layer) 304 is formed on the silicon oxide film by, for example, CVD (FIG. 31B). The silicon nitride film 304 is processed to form stripes by a lithography and a dry etching technique to form a pattern 304a (FIG. 31C). Arsenic ions are implanted by ion implantation using the pattern 304a as a mask region to form diffusion layers 305 which will be formed into sources and drains of a memory cell (FIG. 31D).

Figure 32A:
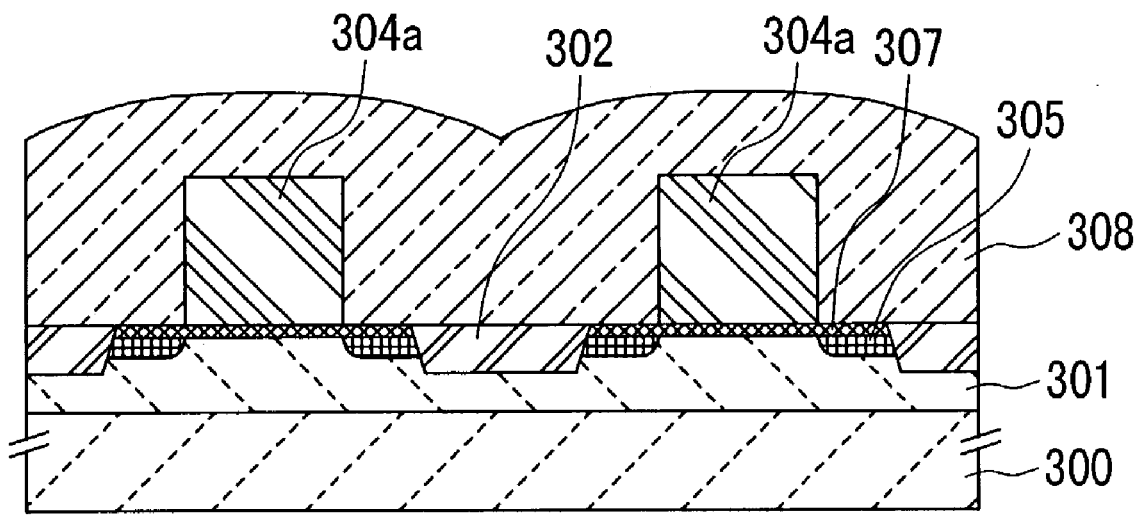
Figure 32B:
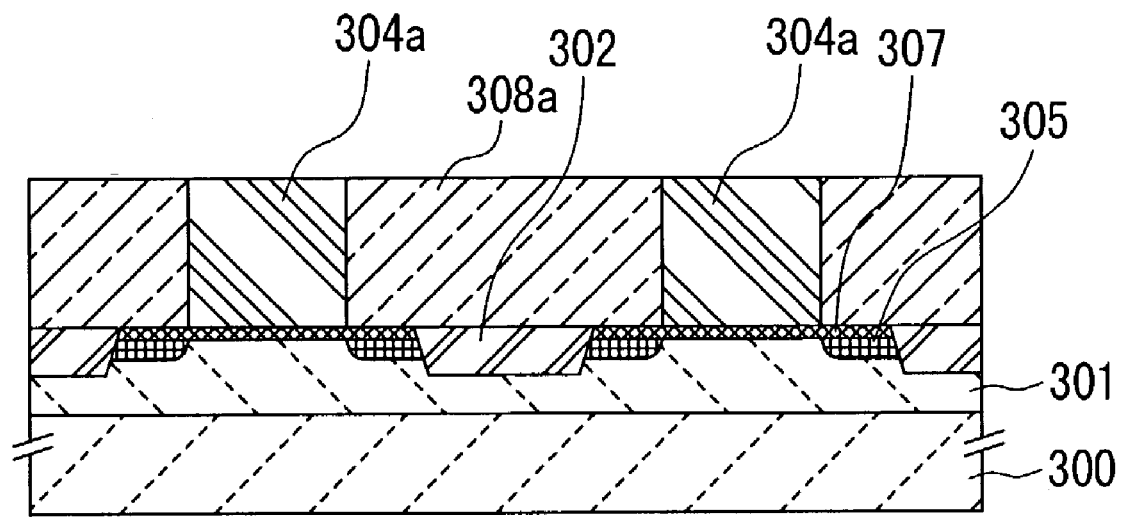

Then a silicon oxide film (fourth insulating layer) 308 is deposited by CVD, for example, in such a manner as to cover the silicon nitride film pattern 304a perfectly (FIG. 32A). Then, the silicon oxide film 308 is processed by a chemical mechanical polishing technique or an etch back technique in such a manner as to expose an upper portion of the silicon nitride film pattern 304a (FIG. 32B).

Then, dry etching is performed under the condition of a selective etching on the silicon nitride film by using as a mask a resist pattern which is in the form of stripes extending in a direction perpendicular to stripes of the exposed silicon nitride film pattern 304a.

Figure 33A:
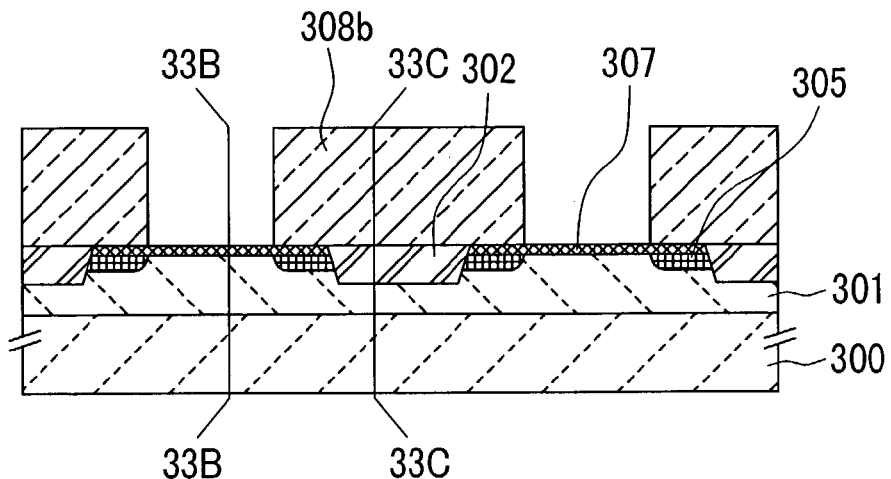
Figure 33B:
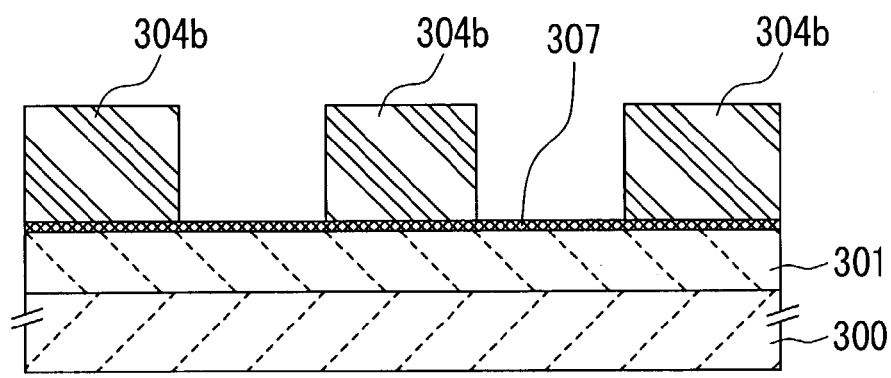
Figure 33C:
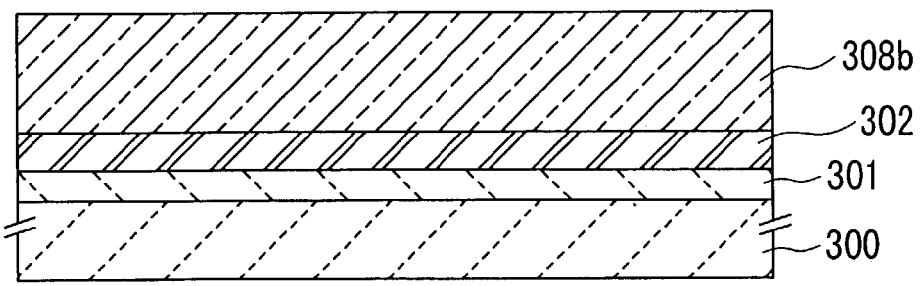

Thus, spaces in each of which two side walls are surrounded by the silicon nitride film which is the third insulating layer and other two side walls are surrounded by the silicon oxide film which is the fourth insulating layer are formed on the silicon substrate (FIGS. 33A to 33C). The spaces are the holes that characterize the present invention. The floating gate is formed inside each of the holes. In addition, FIG. 33B is a sectional view taken along the line 33B—33B in FIG. 33A and FIG. 33C is a sectional view taken along the line 33C—33C in FIG. 33A; the same applies to FIGS. 34A to 39C.

Figure 34A:
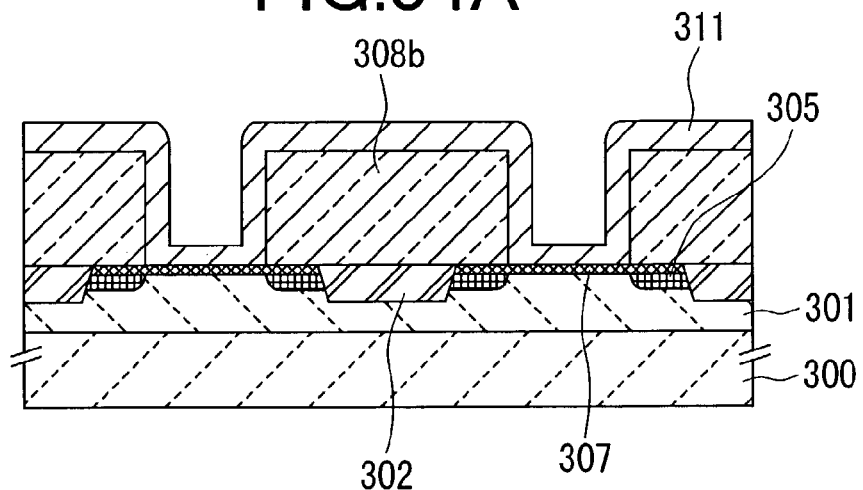
FIGS. 34A to 34C are sectional views illustrating a process step subsequent to FIGS. 33A to 33C of the fabrication process of the nonvolatile semiconductor memory device in the sixth embodiment, the sectional views having the same relationship as that in FIGS. 33A to 33C.
Figure 34B:
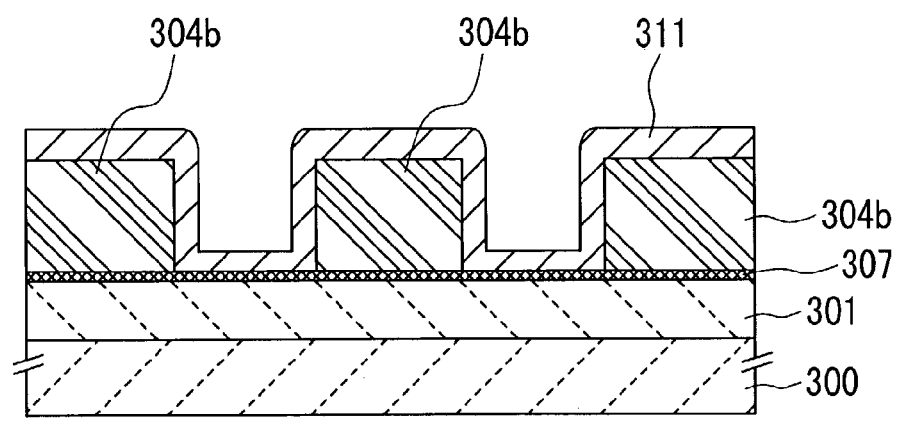
Figure 34C:
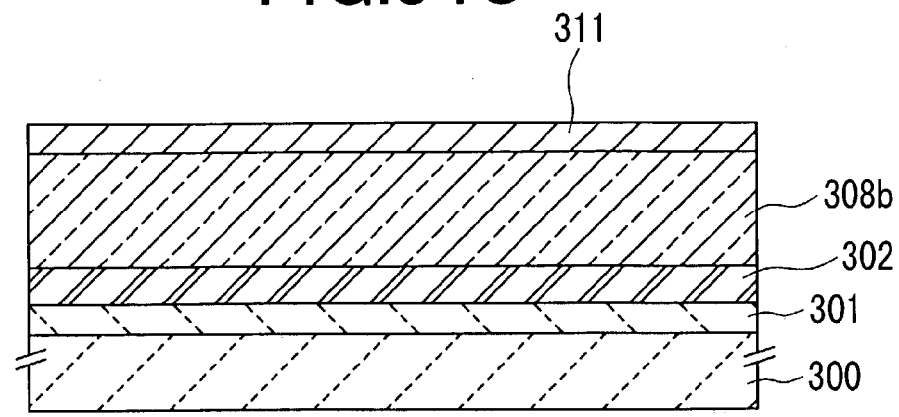
Figure 35A:
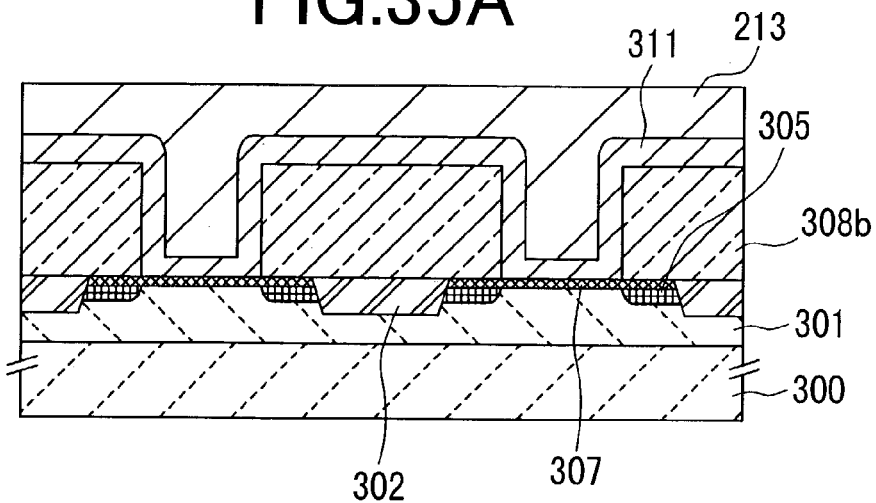
FIGS. 35A to 35C are sectional views illustrating a process step subsequent to FIGS. 34A to 34C of the fabrication process of the nonvolatile semiconductor memory device in the sixth embodiment, the sectional views having the same relationship as that in FIGS. 33A to 33C.
Figure 35B:
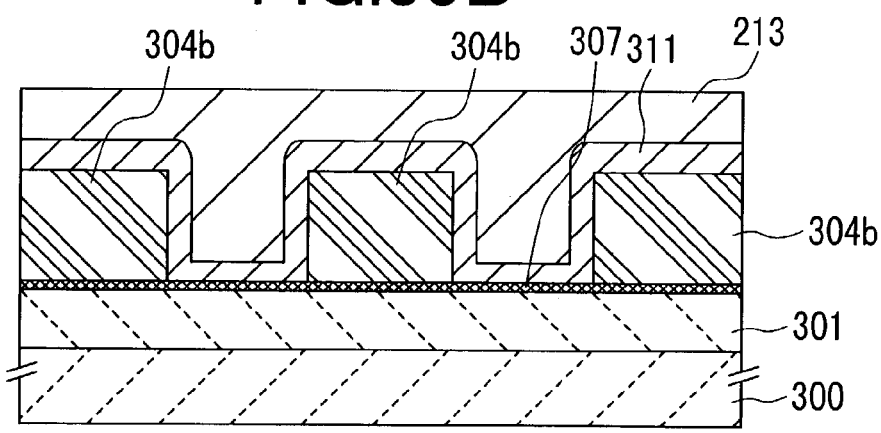
Figure 35C:
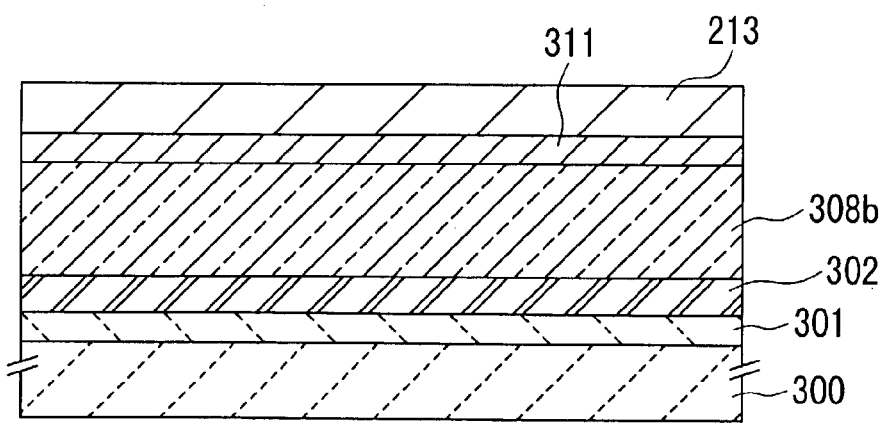
Figure 36A:
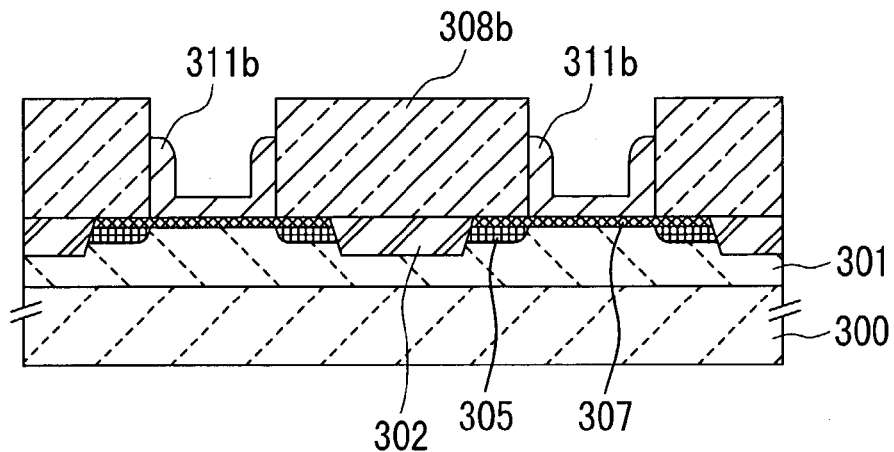
FIGS. 36A to 36C are sectional views illustrating a process step subsequent to FIGS. 35A to 35C of the fabrication process of the nonvolatile semiconductor memory device in the sixth embodiment, the sectional views having the same relationship as that in FIGS. 33A to 33C.
Figure 36B:
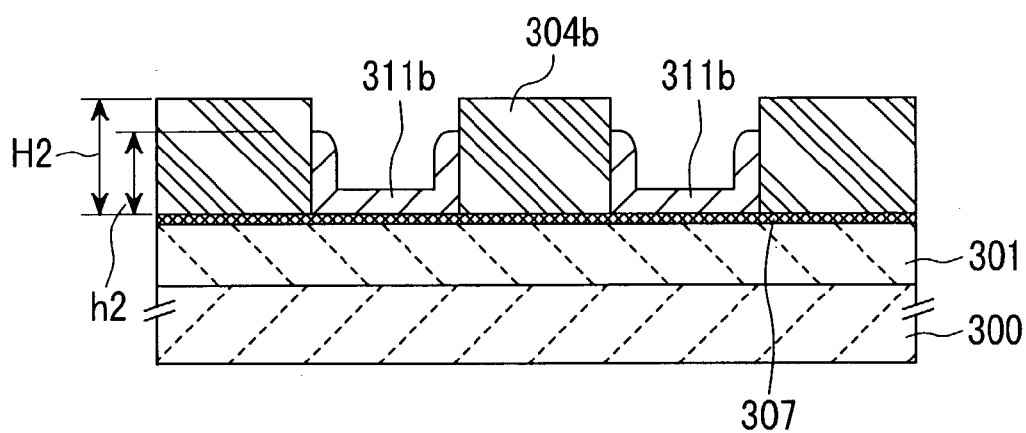
Figure 36C:
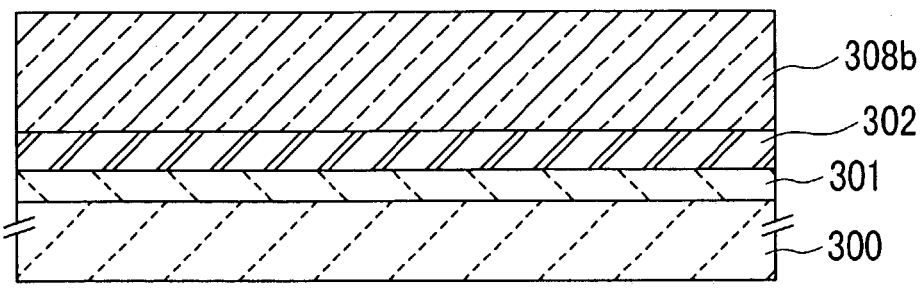

After that, a polysilicon film 311 doped with phosphor (P), which will be formed into the floating gates 311b, is deposited in such a manner as to avoid filling up the spaces perfectly (FIGS. 34A to 34C). A resist 213 is then applied to fill gaps (FIGS. 35A to 35C).

Figure 37A:
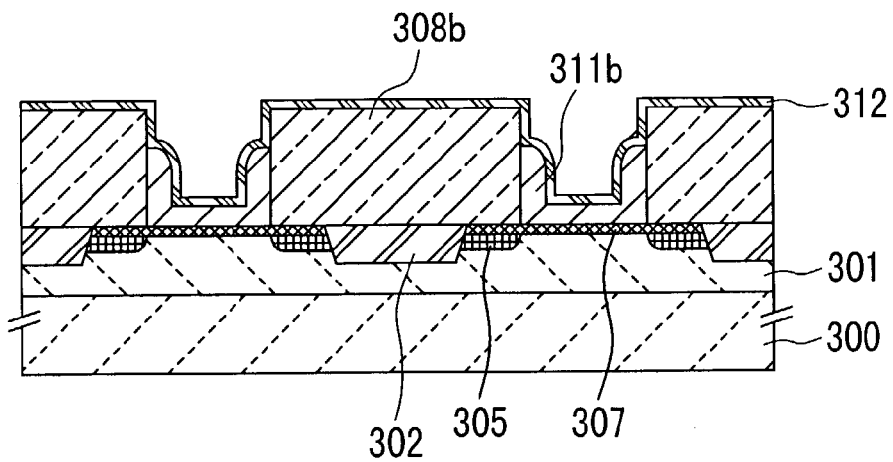
FIGS. 37A to 37C are sectional views illustrating a process step subsequent to FIGS. 36A to 36C of the fabrication process of the nonvolatile semiconductor memory device in the sixth embodiment, the sectional views having the same relationship as that in FIGS. 33A to 33C.
Figure 37B:
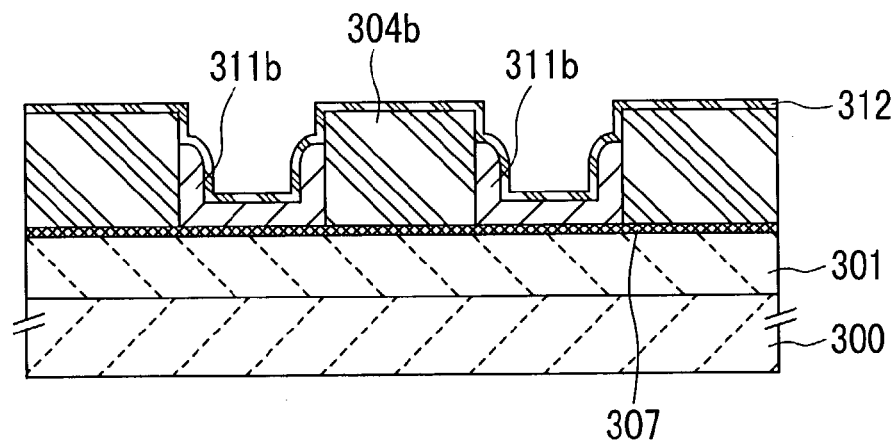
Figure 37C:
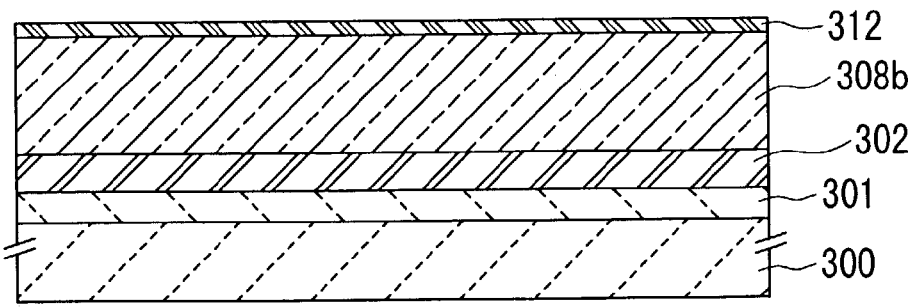

The resist and the polysilicon film 311 are etched back to pattern the polysilicon film 311, which will be formed into the floating gates, thereby forming the floating gates 311b. In this case, the formation of the floating gates 311b is performed in such a manner that a height h2 of the floating gates 311b is below a height H2 of the third insulating layers 304b (FIGS. 37A to 37C). In this process step, the floating gates are separated from one another perfectly for respective memory cells.

An interpoly dielectric film 312 is then formed for separating the floating gates 311b from the control gates. The dielectric layer may be a silicon oxide film or a multilayer of silicon oxide film/silicon nitride film/silicon oxide film (FIGS. 37A to 37C).

Figure 38A:
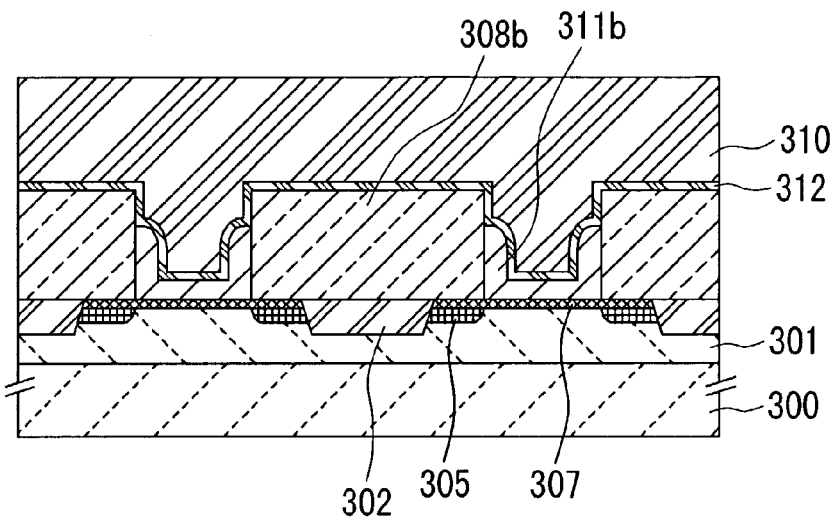
FIGS. 38A to 38C are sectional views illustrating a process step subsequent to FIG. 37A to 37C of the fabrication process of the nonvolatile semiconductor memory device in the sixth embodiment, the sectional views having the same relationship as that in FIGS. 33A to 33C.
Figure 38B:
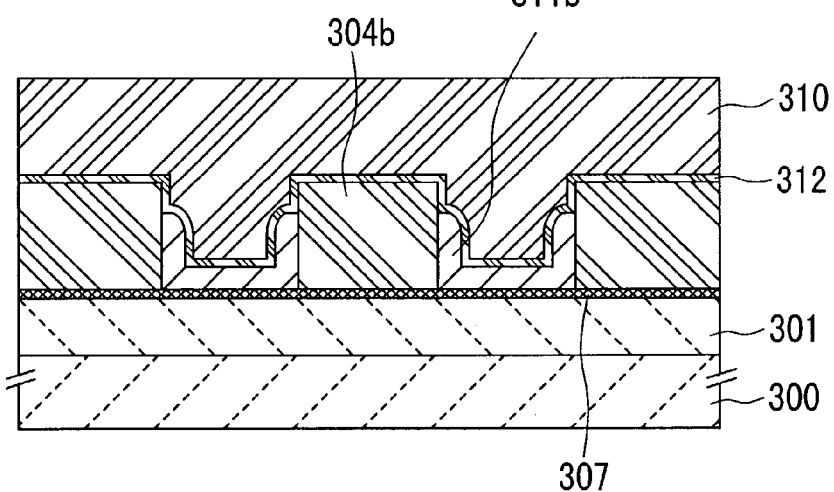
Figure 38C:
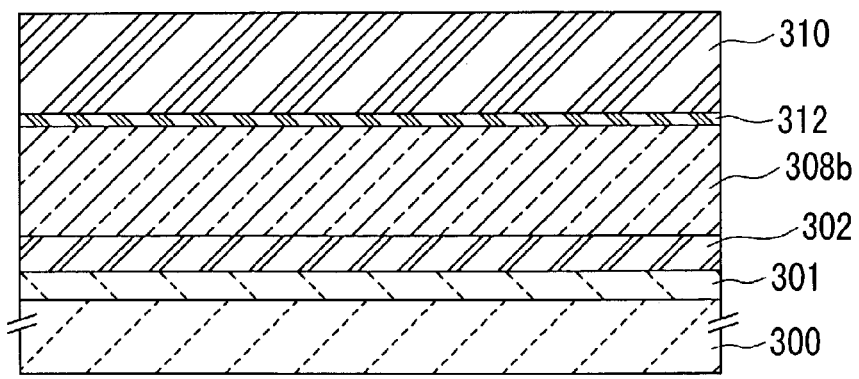
Figure 39A:
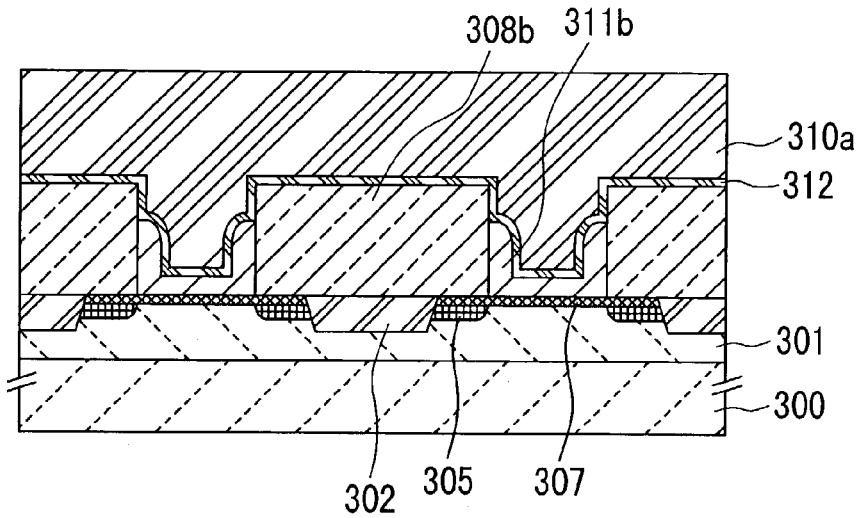
FIGS. 39A to 39C are sectional views illustrating a process step subsequent to FIGS. 38A to 38C of the fabrication process of the nonvolatile semiconductor memory device in the sixth embodiment, the sectional views having the same relationship as that in FIGS. 33A to 33C.
Figure 39B:
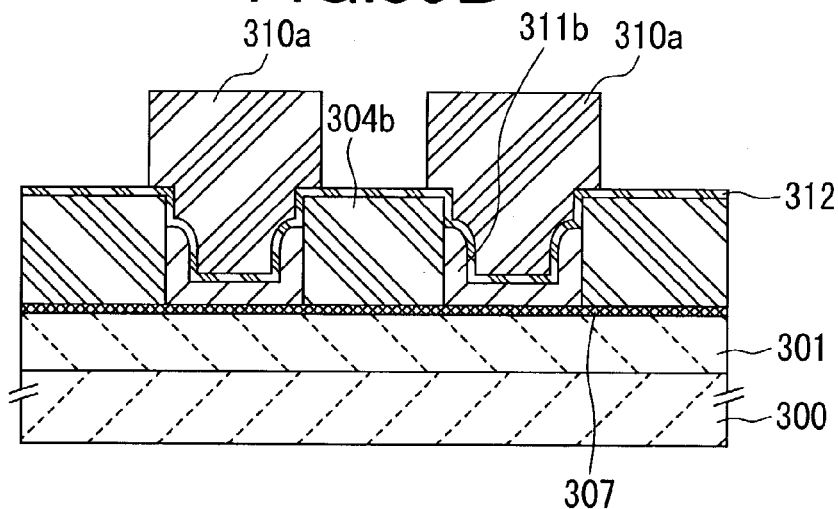
Figure 39C:
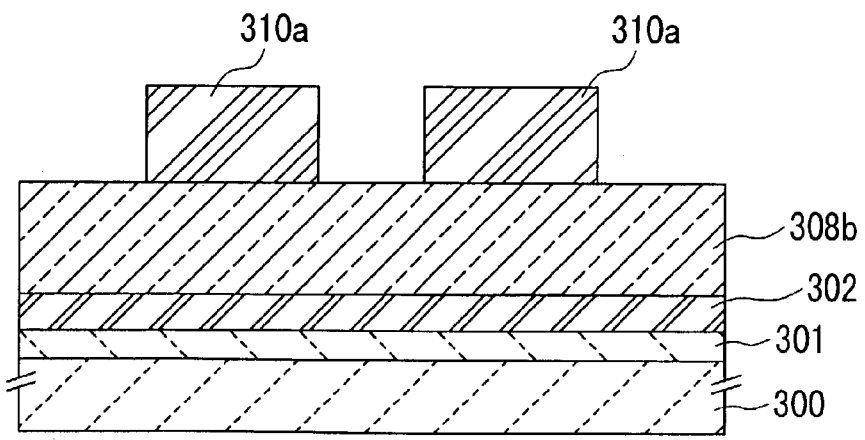

After that, a multilayer of a polysilicon film, a tungsten nitride film, and a tungsten film, i.e. a polymetal film 310, is deposited (FIGS. 38A to 38C). The polymetal 310 is processed by a known lithography and a known dry etching technique to form word lines (FIGS. 39A to 39C).

Conventionally, it has been necessary to sequentially perform etchings on the silicon oxide film or the multilayer 312 of silicon film/silicon nitride film/silicon oxide film and the polysilicon film 311 after the above process step. However, in the present embodiment, since the floating gates 311b are perfectly separated from one another for the respective memory cells in the process step in FIGS. 36A to 36C, the word lines 211 have only to be processed after the above process step. Further, since the height of the floating gates 311b are below that of the third insulating layers 304b, the processing being performed for the word line 211a using a dry etching is terminated at a stage where the surfaces of the third insulating layers are exposed, so that it is possible to separate the adjacent word lines 211a from one another.

Furthermore, even if a misalignment between the floating gate and the word line occurs, the capacitance of a capacitor formed between the floating gate and the control gate with the interpoly dielectric film being layered therebetween is not reduced.

After forming the interpoly dielectric film, contact holes extending to the word lines 311a, the source and drain diffusion layers 305, and the well 301 are formed. After that, a metal film is deposited and then patterned to form wirings, whereby the fabrication of memory cells is completed. In addition, drawings for these process steps are omitted since they are known.

As in the first embodiment, a high coupling ratio is ensured even if the word line width is narrowed in the memory cells of the present embodiment. In particular, an apparent effect is observed when the word line with is 0.13 μm or less.

Seventh Embodiment

In the present embodiment, a NAND type flash memory which is an example of the stack type memory cell will be described.

Figure 40:
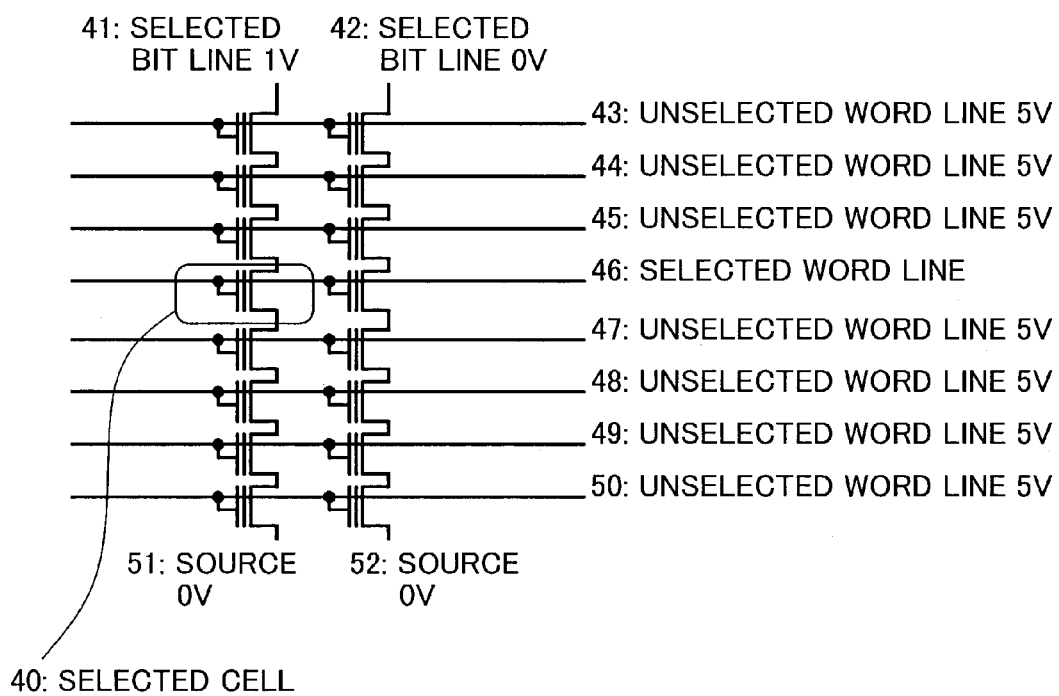
FIG. 40 is a diagram showing an example of a circuit structure of a NAND type flash memory in a state where data is read out from the flash memory.
Figure 41:
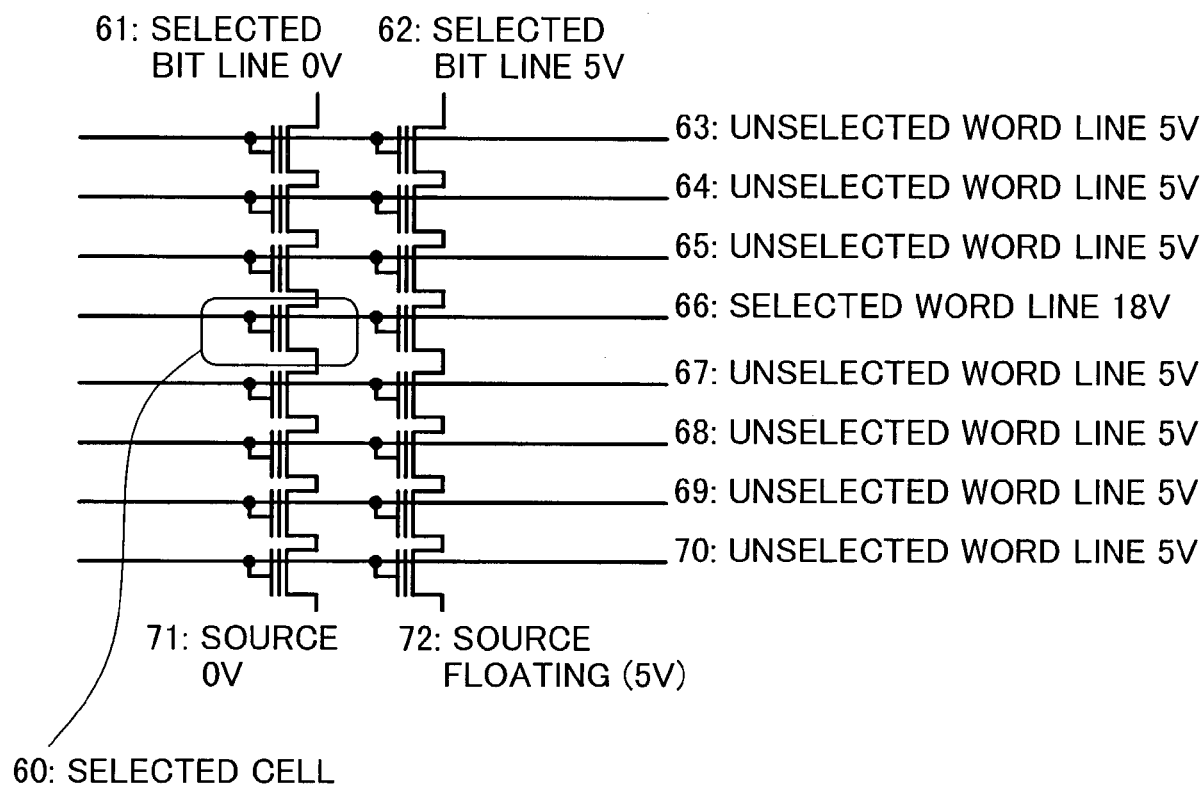
FIG. 41 is a diagram showing the circuit structure of the NAND type flash memory in a state where data is written in the flash memory.

FIGS. 40 and 41 are diagrams showing an example of an equivalent circuit of the NAND type flash memory. Shown in FIG. 40 is a state wherein information is being read out, and shown in FIG. 41 is a state wherein information is being written in.

In reading out information, a voltage of about 1 V is applied to a selected bit line 41 and a voltage of about 5 V is applied to unselected word lines 43 to 45 and 47 to 50 as shown in FIG. 40. Under this voltage condition, a channel is formed under cells under the unselected word lines irrespective of the state of the cell, so that a current can flow through the channel. ON/OFF of each of the memory cells under the selected word line is judged by conduction/non-conduction between a source line and a drain line.

In writing in information, a voltage of 0 V is applied to a selected bit line 61, and a voltage of 5 V is applied to an unselected bit line 62, for example. In the same manner as in the information-reading out, a voltage of 5 V is applied to unselected word lines so that channels are formed under the unselected word lines irrespective of the states of the memory cells. A source which is connected to the selected bit line is maintained at 0 V and a source line which is connected to the unselected bit line is maintained at a floating state, whereby voltages in all of the channels under the memory cells on the selected bit line are maintained at 0 V and voltages in all of the channels under the memory cells on the unselected bit line are maintained at 5 V. A higher voltage of about 18 V is applied to a selected word line 66 to increase a potential of the floating gates. In this case, due to the large potential difference between the floating gates and the channels, a tunnel current is injected through the gate oxide film into the selected cells which are connected to the selected bit line to achieve the information-writing. In the cells connected to the unselected bit line, Although the potential of the floating gates is increased by a voltage as high as 18 V, the injection of tunnel current is suppressed and the information-writing is not carried out since a potential difference between the channels of the floating gates is small due to the channel voltage of 5 V.

FIGS. 42A to 52B are sectional views showing process steps of an example of a fabrication process of the nonvolatile memory device of the seventh embodiment according to the present invention, the sectional views being indicated in order of the process steps.

Figure 42A:
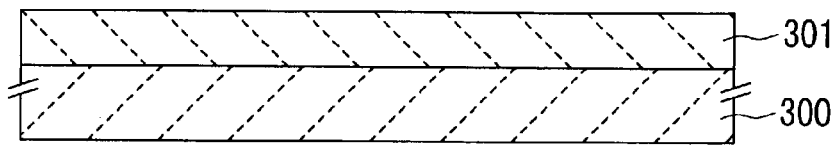
FIGS. 42A to 42D are sectional views illustrating an example of a fabrication process of a nonvolatile semiconductor memory device in a seventh embodiment, which are in the order of process steps.
Figure 42B:
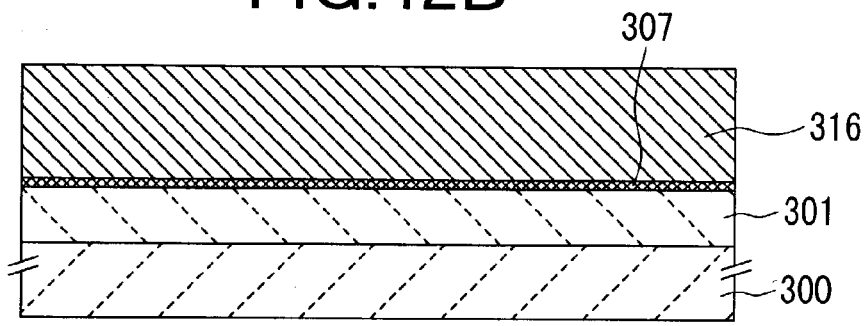

A P-type well 301 on a semiconductor substrate 300 is firstly formed (FIG. 42A). Then, a gate oxide film 307 is formed by, for example, thermal oxidization. A silicon nitride film or a polysilicon film 316 which will be formed into dummy gates is deposited on the gate oxide film by, for example, CVD (FIG. 42B).

Figure 42C:
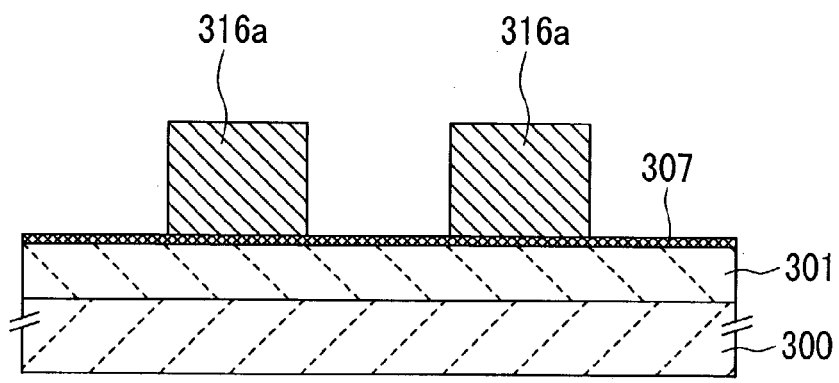
Figure 42D:
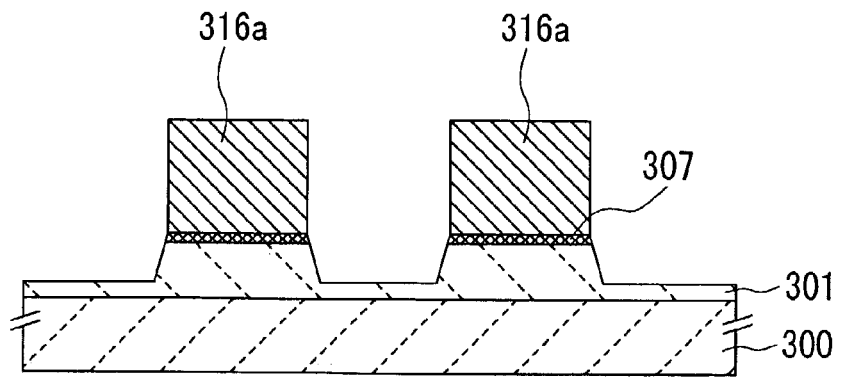

The silicon nitride film or the polysilicon film 316 is processed to be in the form of stripes by a lithography and a dry etching technique to form a pattern 316a (FIG. 42C). Then, etching on the silicon substrate is performed by using the pattern 316a as a mask region (FIG. 42D).

Figure 43A:
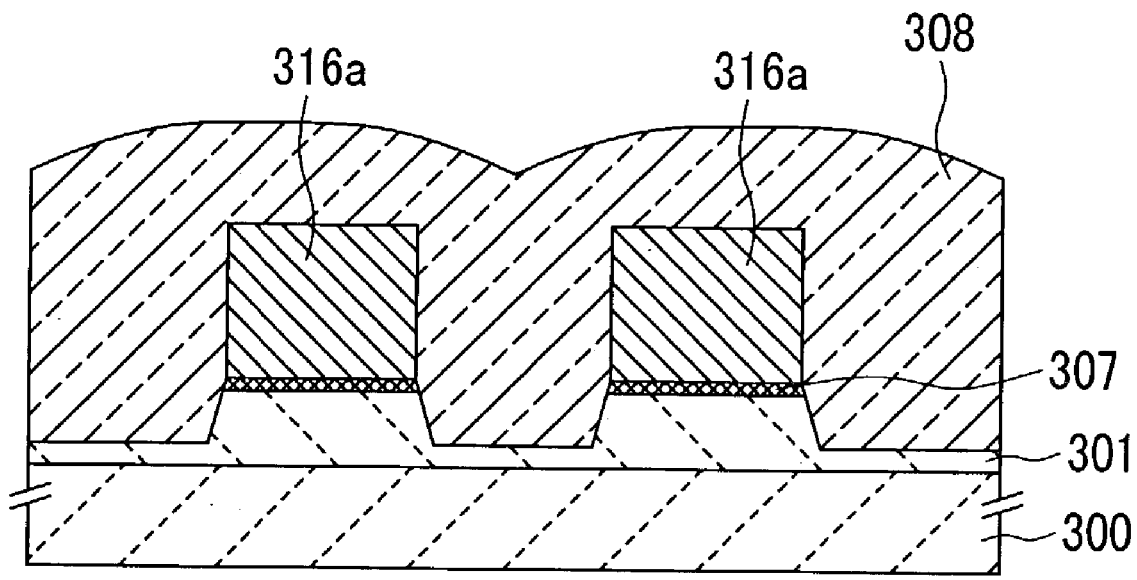
FIGS. 43A and 43B are sectional views illustrating the fabrication process of the nonvolatile semiconductor memory device in the seventh embodiment, which are in the order of process steps.
Figure 43B:
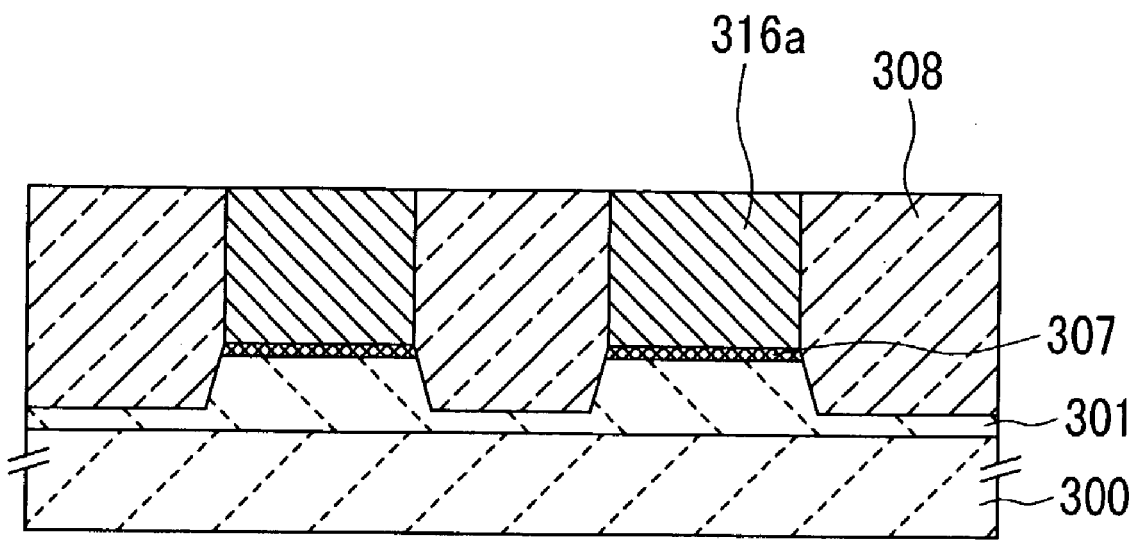

After that, a silicon oxide film 308 is deposited in such a manner as to bury the dummy gates 316a and gaps therebetween perfectly (FIG. 43A). Then, the silicon oxide film 308 is removed by an etch back or a chemical mechanical polishing technique so as to expose surfaces of the dummy gates 316a (FIG. 43B).

The dummy gates 316a are then processed by using as a mask a stripe shaped resist pattern extending in a direction perpendicular to stripes of the exposed dummy gates 316a. In this case, the silicon nitride film or the silicon oxide film which is the material used for forming the dummy gates 316a is selectively etched. In this way, the dummy gates are formed into the dummy gates 316b (FIG. 44B). In addition, FIG. 44A is a sectional view taken along the line 44A—44A in FIG. 44C, and FIG. 44B is a sectional view taken along the line 44B—44B in FIG. 44C.

Figure 45A:
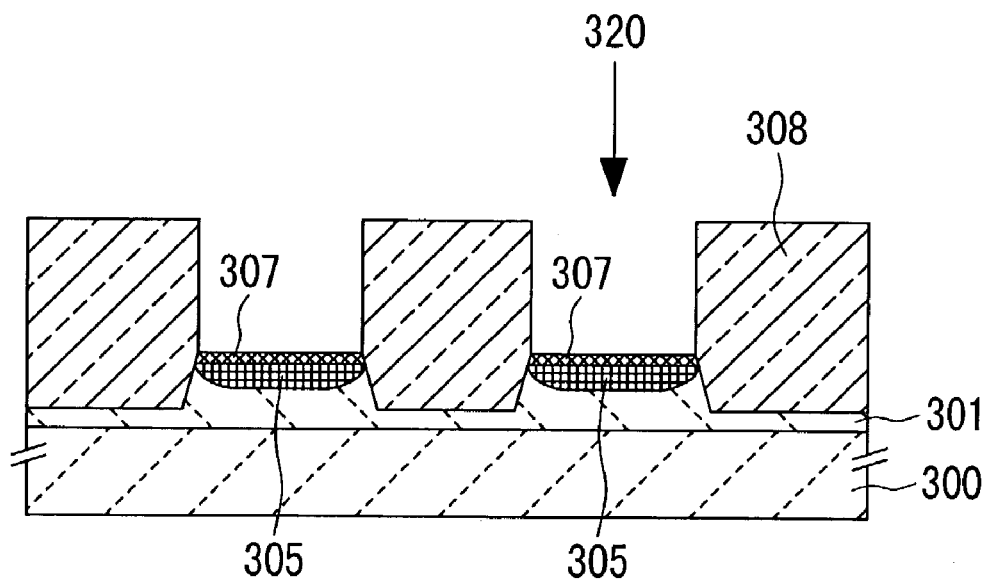
FIGS. 45A and 45B are a cross-sectional view and a longitudinal sectional view illustrating the fabrication process of the nonvolatile semiconductor memory device in the seventh embodiment.
Figure 45B:
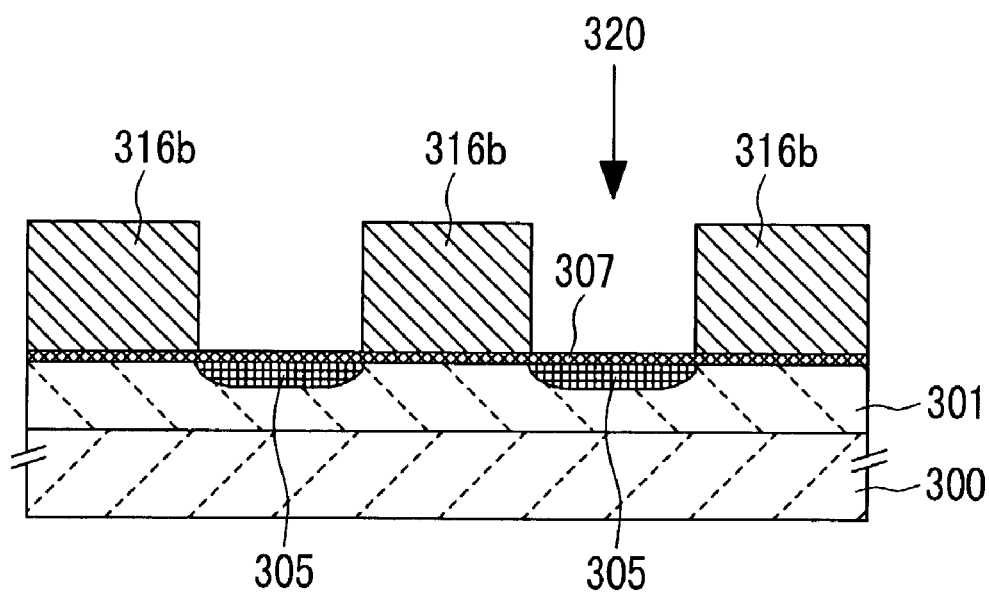

Then, arsenic ions are implanted by ion implantation using the dummy gates 316b and the silicon oxide films which are third insulating layers 308 as masks to form diffusion layers 305 which will be formed into sources and drains of memory cells (FIG. 45A and 45B).

After that, a silicon oxide film is deposited in the case where the silicon nitride film is used as the material for the dummy gates 316b so as to fill the spaces. Alternatively, a silicon oxide film or a silicon nitride film is deposited in the case where the polysilicon film is used as the dummy gate material so as to fill the spaces. The thus-deposited film will be formed into fourth insulating layers 304.

Figure 46A:
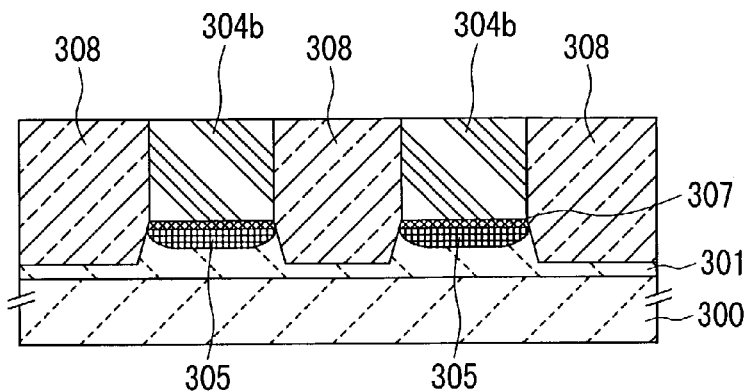
Figure 46B:
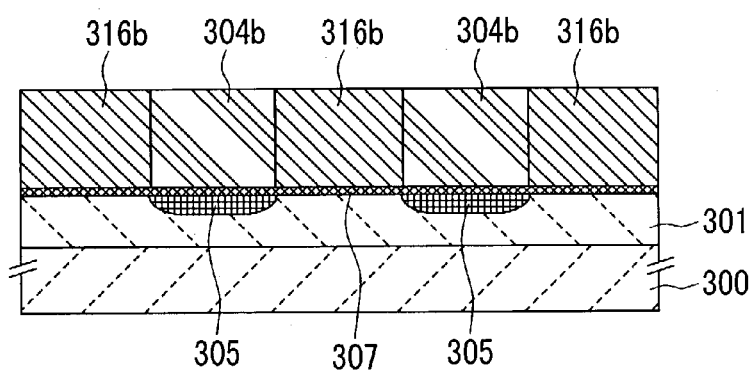
Figure 46C:
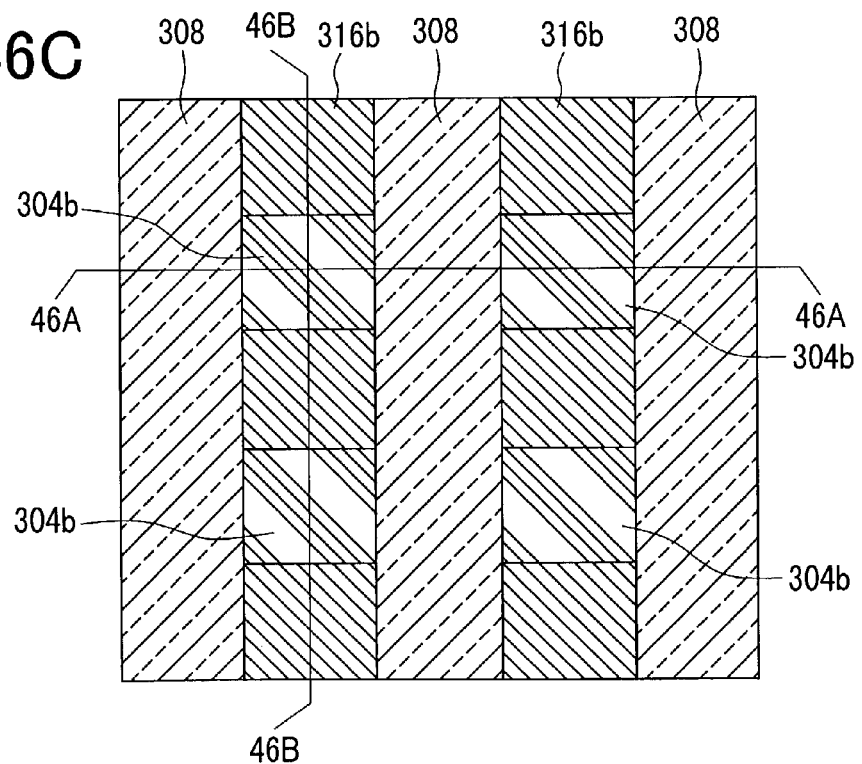

The fourth insulating layers 304 are removed by an etch back or a chemical mechanical polishing technique to expose surfaces of the dummy gates 316b (FIGS. 46A to 46C). In addition, FIG. 46A is a sectional view taken along the line 46A—46A in FIG. 46C, and FIG. 46B is a sectional view taken along the line 46B—46B in FIG. 46C.

Figure 47A:
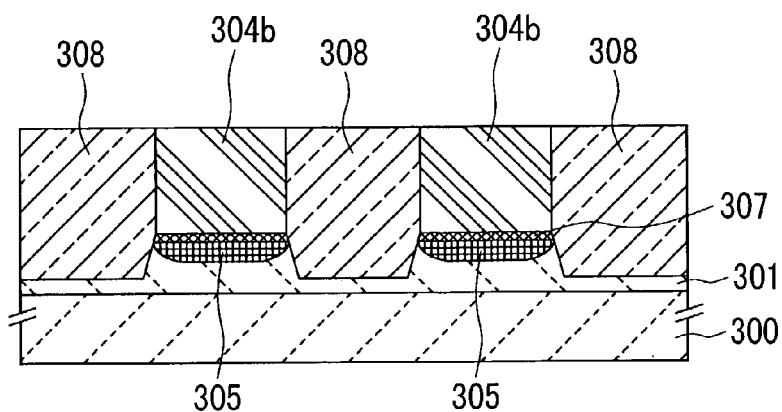
Figure 47B:
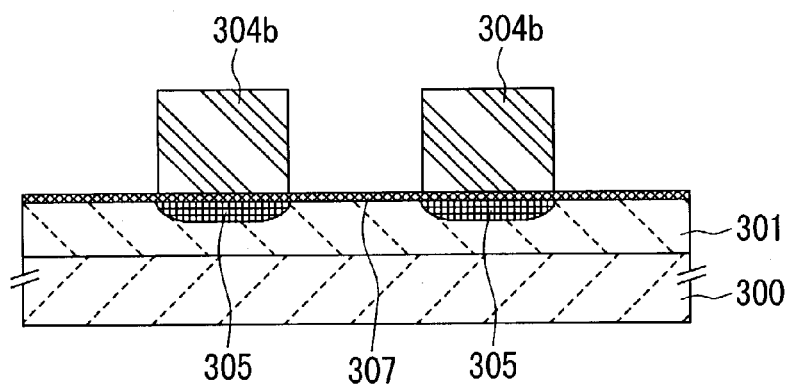
Figure 47C:
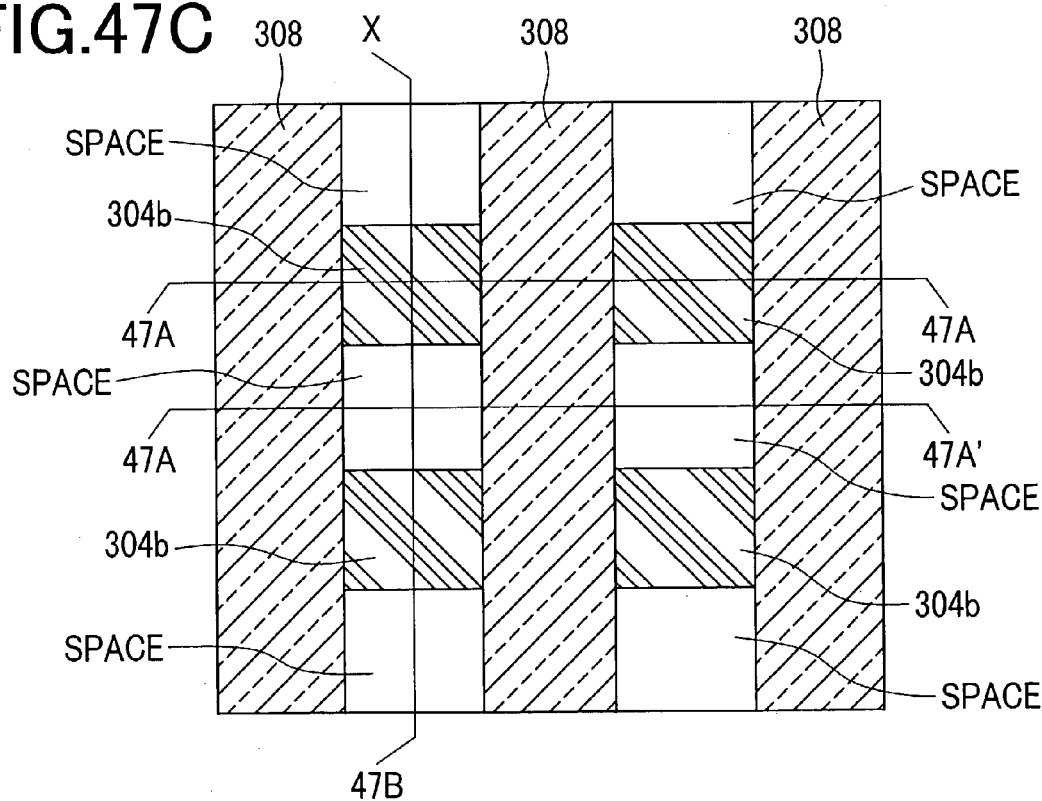

Spaces in which the floating gates are to be formed are created by removing the dummy gates through a dry etching or wet etching under the condition of selective etching on the dummy gate material (FIGS. 47A to 47C). In addition, FIG. 47A is a sectional view taken along the line 47A—47A in FIG. 47C, and FIG. 47B is a sectional view taken along the line 47B—47B in FIG. 47C.

In each of the thus-obtained spaces, two side walls are surrounded by the third insulating layer 308 and other two side walls are surrounded by the fourth insulating layer 304b. The spaces are the first characteristic provided by the present invention. The memory cell formed in each of the spaces is surrounded by the insulating layers.

In FIGS. 48A to 53B, which are sectional views showing sections taken in two directions of the space formed in FIGS. 47A to 47C, each of A-figures is a sectional view taken along the line 47A'—47A' in FIG. 47C and each of B-figures is a sectional view taken along the line 47B—47B in FIG. 47C.

Figure 48A:
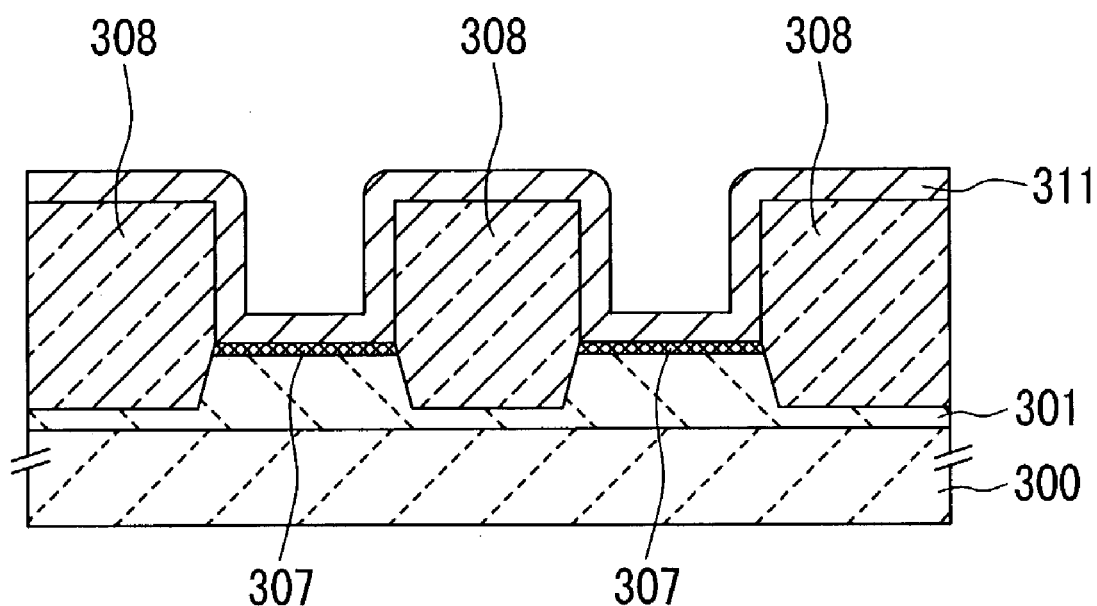
FIGS. 48A and 48B are a cross-sectional view and a longitudinal sectional view illustrating the fabrication process of the nonvolatile semiconductor memory device in the seventh embodiment.
Figure 48B:
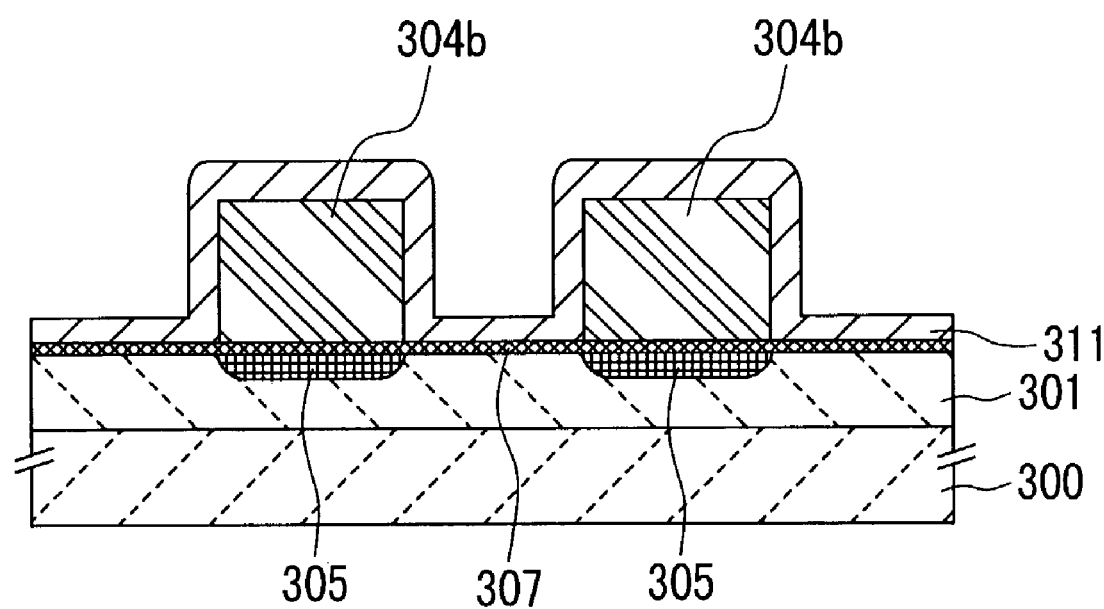
Figure 49A:
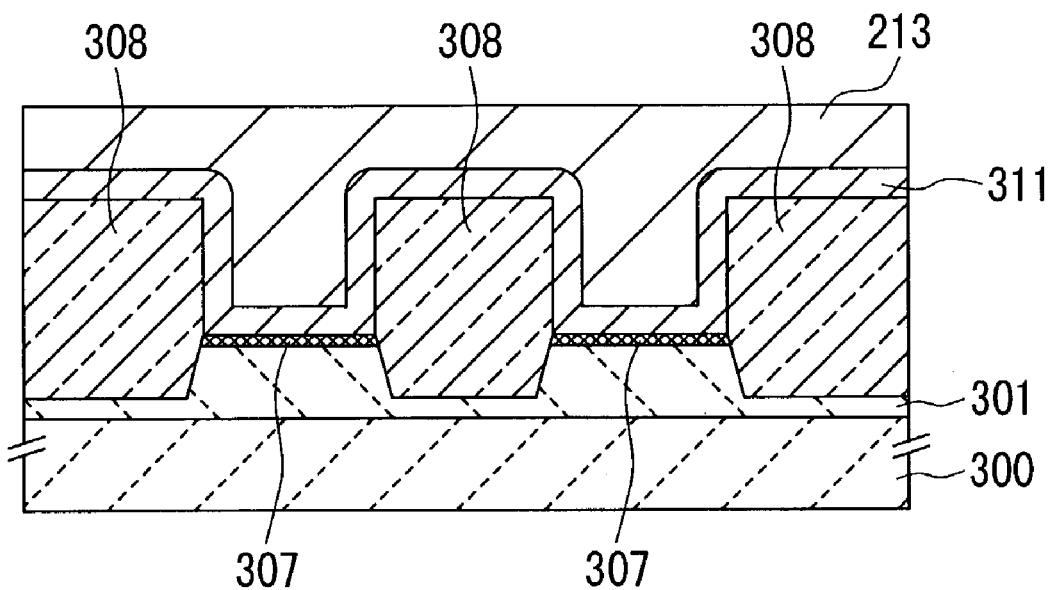
FIGS. 49A and 49B are a cross-sectional view and a longitudinal sectional view illustrating the fabrication process of the nonvolatile semiconductor memory device in the seventh embodiment.
Figure 49B:
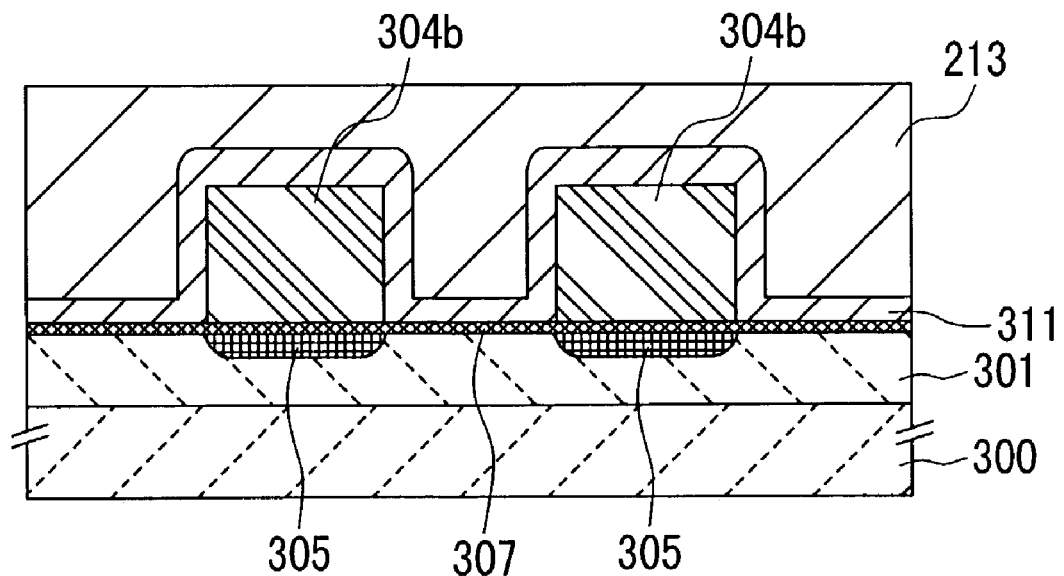
Figure 50A:
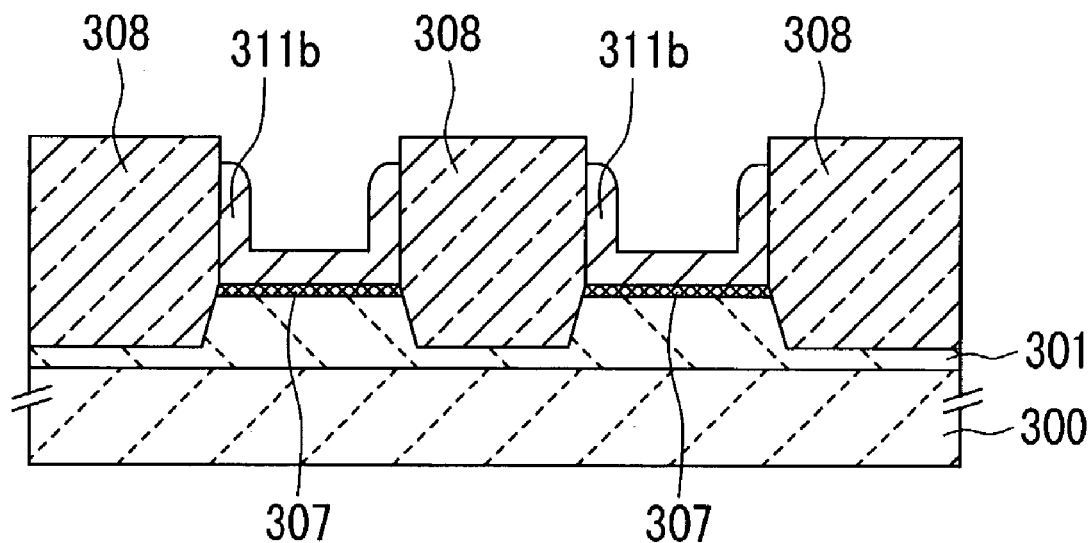
FIGS. 50A and 50B are a cross-sectional view and a longitudinal sectional view illustrating the fabrication process of the nonvolatile semiconductor memory device in the seventh embodiment.
Figure 50B:
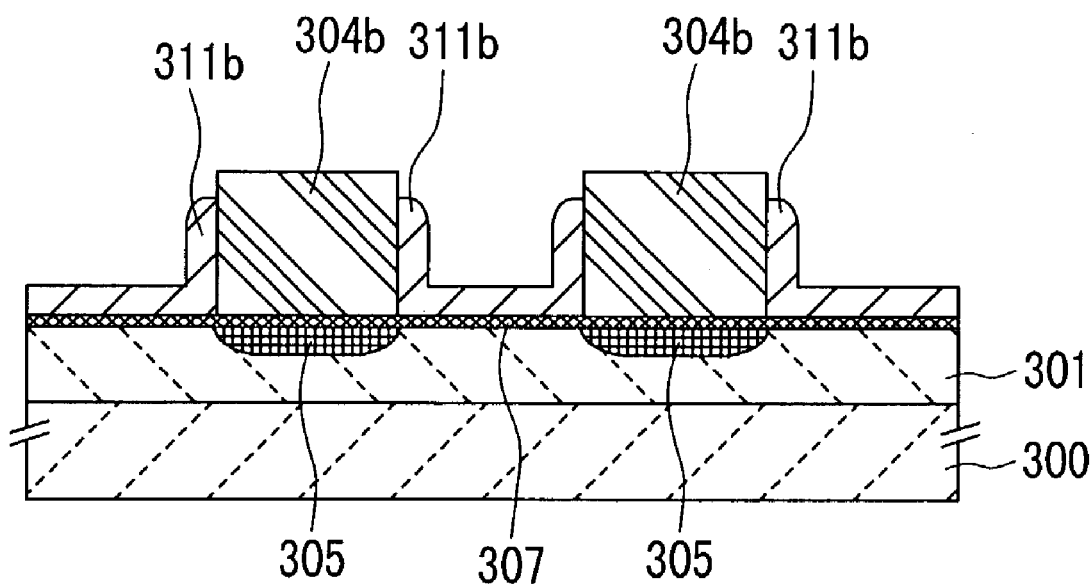
Figure 51A:
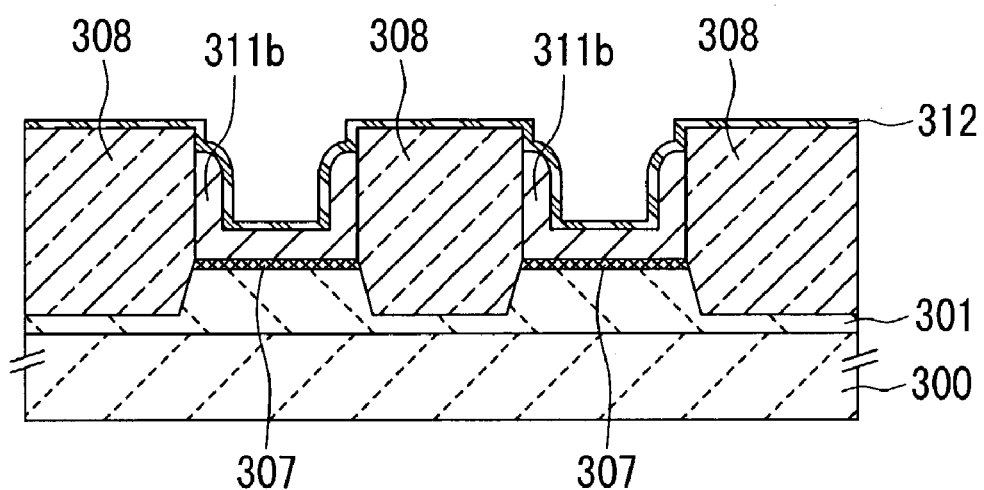
FIGS. 51A and 51B are a cross-sectional view and a longitudinal sectional view illustrating the fabrication process of the nonvolatile semiconductor memory device in the seventh embodiment.

A polysilicon film 311 doped with phosphor (P), which will be formed into floating gates 311b, is deposited in such a manner as to avoid filling up the spaces perfectly (FIGS. 48A and 48B). A resist 213 is then applied to fill gaps (FIGS. 49A and 49B). The floating gates 311b are formed by performing etch backs on the resist 213 and the polysilicon film 311. Patterning on the polysilicon film 311 is performed to form the floating gates 311b. The polysilicon film 311 is processed in such a manner that a height h3 of the floating gates 311b is below a height H3 of the fourth insulating layers (FIGS. 51A to 50B). In this process step, the floating gates are separated from one another for the respective memory cells.

Figure 51B:
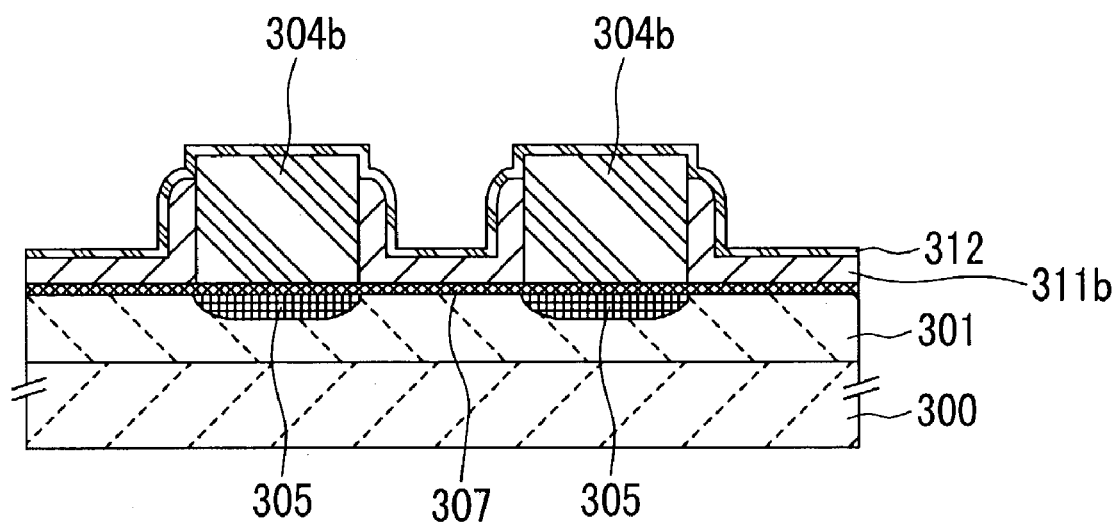
Figure 52A:
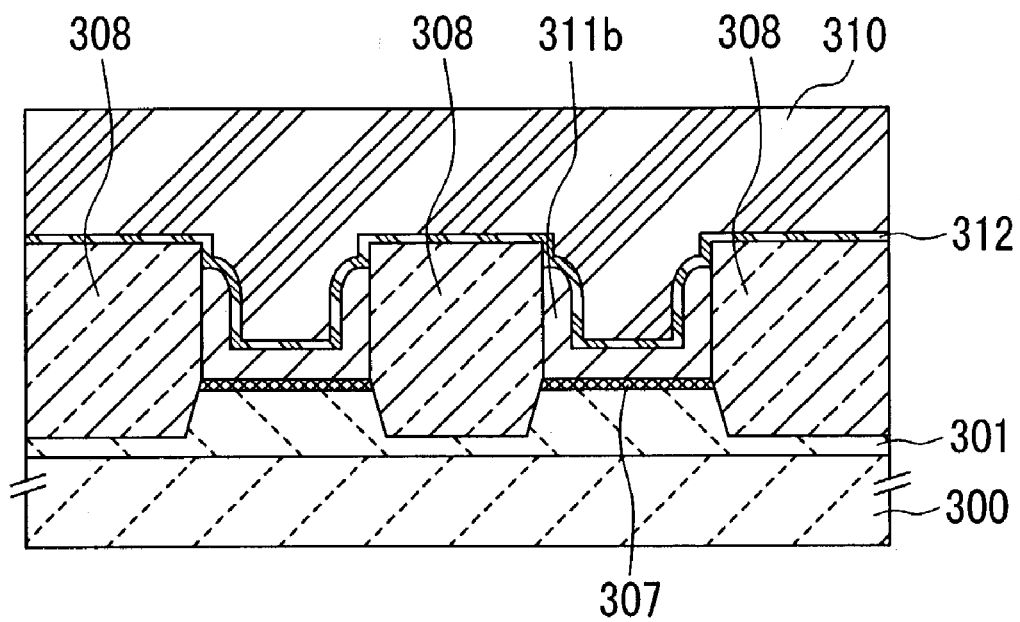
FIGS. 52A and 52B are plan views showing a substrate surface during the fabrication process.
Figure 52B:
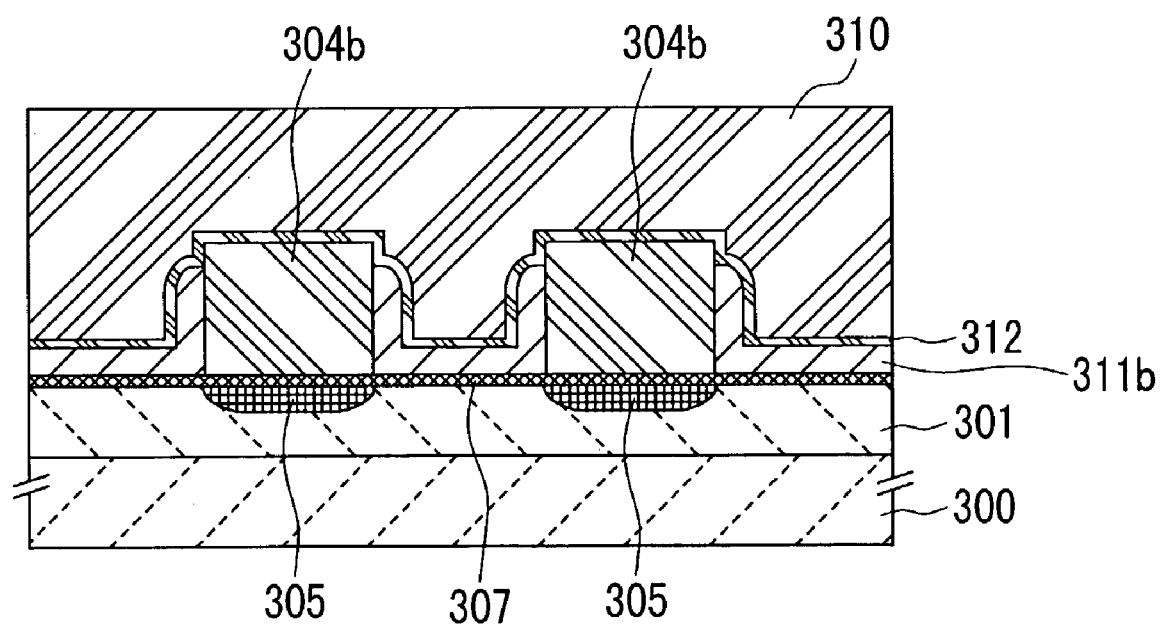

An interpoly dielectric film 312 is then formed for separating the floating gates 311b from the control gates. This insulating layer may be a silicon oxide film or a multilayer of silicon oxide film/silicon nitride film/silicon oxide film (FIGS. 51A and 51B).

Figure 53A:
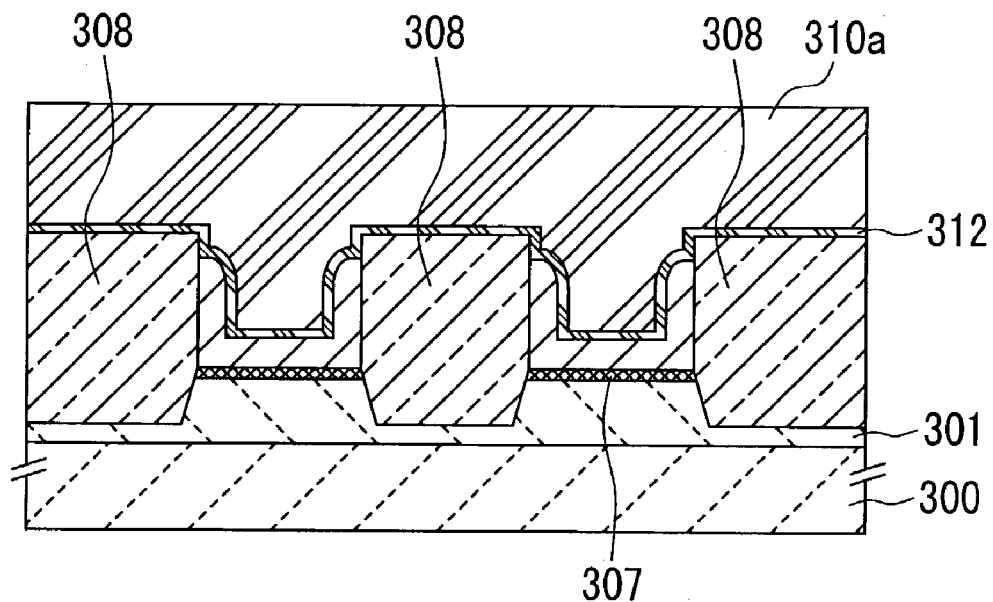
FIGS. 53A and 53B are plan views showing the substrate surface on which a resist mask is formed.
Figure 53B:
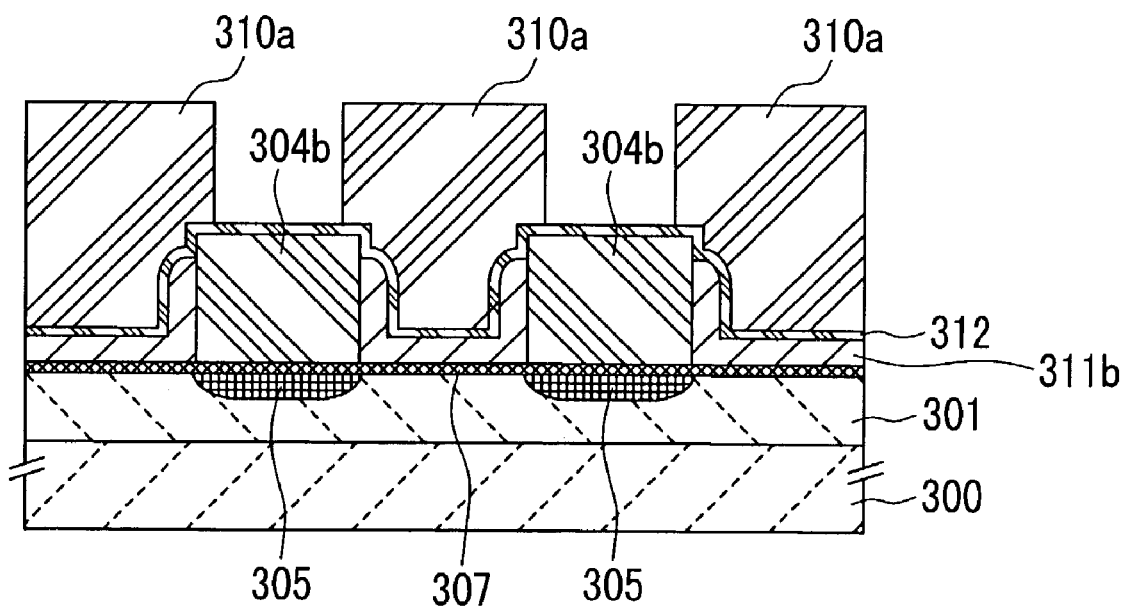

A multilayer of a polysilicon film, a tungsten nitride film, and a tungsten film, i.e. a polymetal film 310, is deposited (FIGS. 52A and 52B) on the thus-prepared semiconductor base. The polymetal 310 is processed by a known lithography and a known dry etching technique to form word lines (FIGS. 53A and 53B).

Conventionally, it has been necessary to sequentially perform etchings on the silicon oxide film or the multilayer 312 of silicon film/silicon nitride film/silicon oxide film and the polysilicon film 311 after the above process step. However, in the present embodiment, since the floating gates are perfectly separated from one another for the respective memory cells in the process step in FIGS. 50A and 50B, the word lines 211 have only to be processed after the above process step. Further, since the height of the floating gates 311b is below that of the fourth insulating layers 304b, the processing being performed for the word line using a dry etching is terminated at a stage where the surfaces of the second insulating layers on the fouth insulating layers are exposed, so that it is possible to separate the adjacent word lines from one another. Furthermore, even if a misalignment between the floating gate and the word line occurs, contact holes extending to the word lines 311a, the source/drain diffusion layers 305, and the well 301 are formed after forming the interpoly dielectric film between the floating gates and the control gates. After that, a metal film is deposited and then patterned to form wirings, whereby the fabrication of memory cells is completed. In addition, drawings for these process steps are omitted since they are known.

As in the first embodiment, a high coupling ratio is ensured even if the word line width is narrowed in the memory cells of the present embodiment. In particular, an apparent effect is observed when the word line with is 0.13 µm or less.

Eighth Embodiment

The silicon oxide film or the multilayer of silicon oxide film/silicon nitride film/silicon oxide film is used as the insulating layer for separating the floating gates from the control gates in the first to seventh embodiments as well as in a ninth embodiment which will be described later in this specification; however, $Ta_2O_5$ which is a high-k material may be used as the insulating layer. Conventionally, in the batch forming of the control gate/interpoly dielectric film material/floating gate, proper control has been required also for the etching on the interpoly dielectric film material, and there has been a great difficulty in using a new material as the interpoly dielectric film material. However, the present invention eliminates the above difficulties since it is unnecessary to perform etching on the interpoly dielectric film in the memory cells of the first to sixth embodiments according to the present invention.

Ninth Embodiment

An NOR type flash memory, which is an example of the stack type memory cell, is described in the present embodiment.

Figure 54:
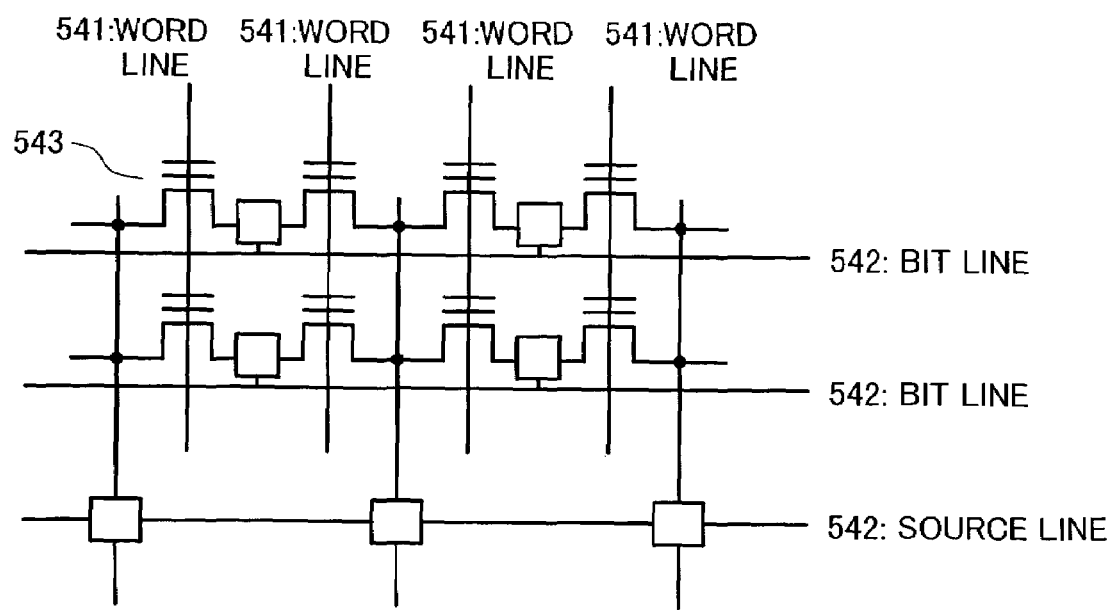
FIG. 54 is a diagram showing a circuit which is an example of a NOR type flash memory.
Figure 55:
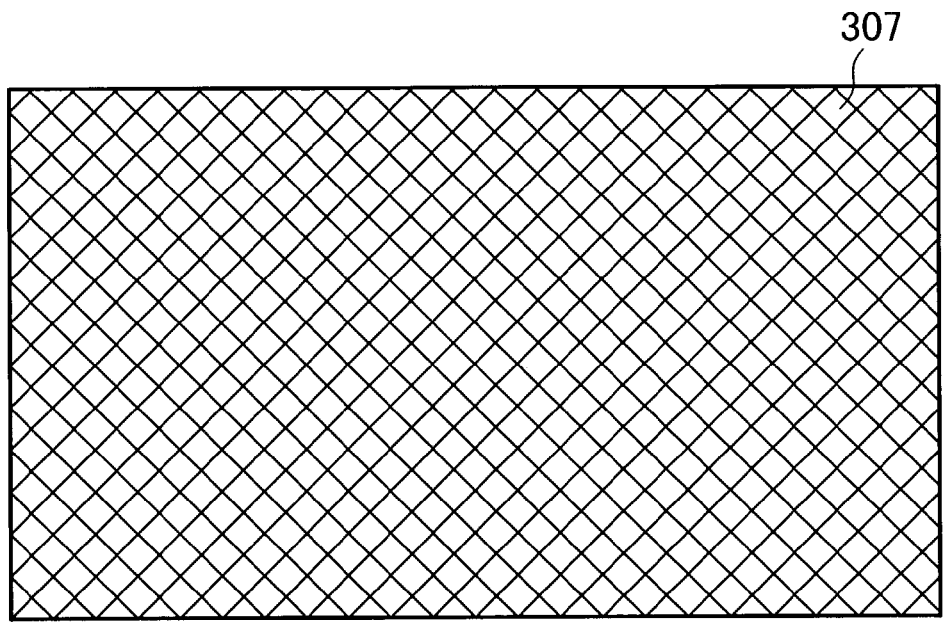
FIG. 55 is a plan view showing a silicon substrate during a fabrication process in an eighth embodiment.
Figure 56:
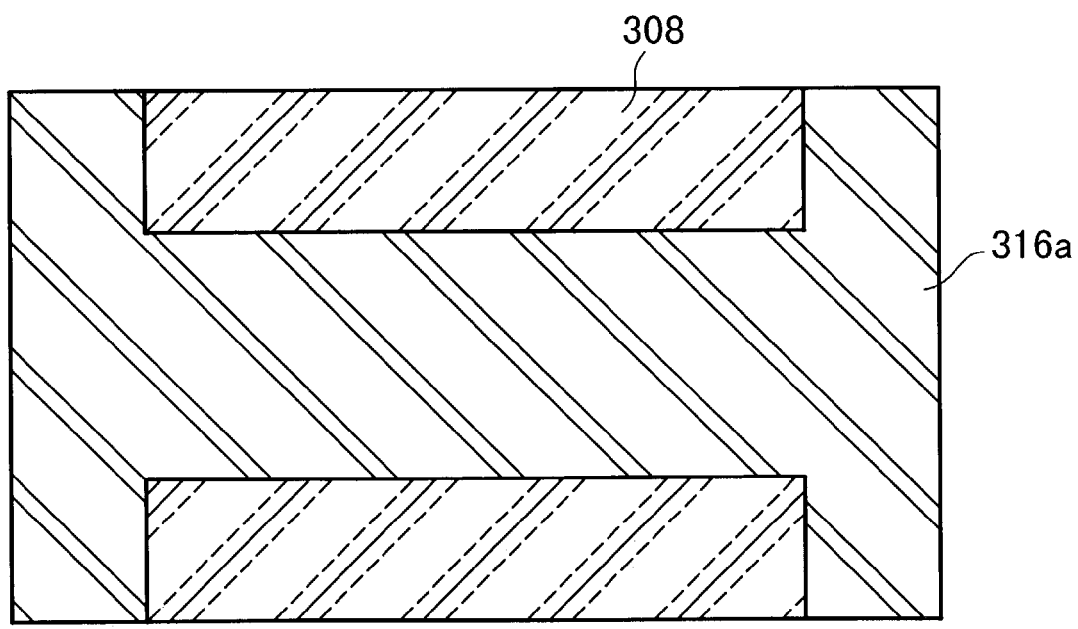
FIG. 56 is a plan view showing the silicon substrate during the fabrication process in the eighth embodiment.
Figure 57:
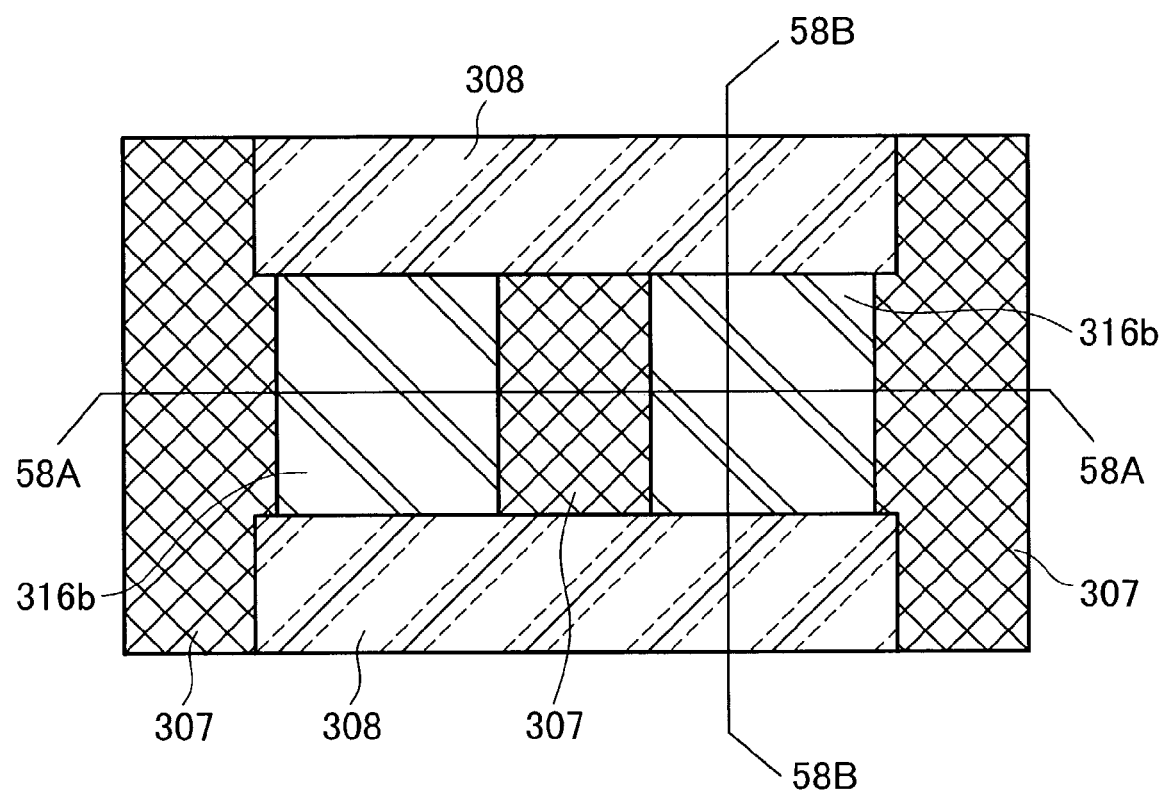
FIG. 57 is a plan view showing the silicon substrate during the fabrication process in the eighth embodiment.

FIG. 54 is a diagram showing an example of a circuit structure of the NOR type flash memory. FIGS. 55 to 57 are plan views showing a silicon substrate under fabrication. FIGS. 58A to 66 are sectional views showing process steps of a fabrication process of the nonvolatile semiconductor memory device according to the present embodiment, the sectional views being indicated in order of the process steps.

In FIG. 54, the NOR type flash memory has word lines 541 and bit lines 542, and reference numeral 543 denotes a nonvolatile semiconductor memory device which is to be used as a basic cell of a memory.

A P-type well 301 is formed on a semiconductor substrate 300 (FIG. 55). Then, a gate oxide film 307 is formed by, for example, thermal oxidization. It is needless to say that a sectional view of the silicon substrate is similar to those shown in FIGS. 58A to 66. A silicon nitride film or a polysilicon film 316 which will be formed into dummy gates is deposited on the gate oxide film by, for example, CVD. Then the silicon nitride film or the polysilicon film 316 is processed to be in predetermined shapes 316a shown in FIG. 56 by a known lithography and a known dry etching technique. Etching on the silicon substrate is performed by using the insulating layer region 316a processed as a mask region. On the thus-obtained semiconductor base, a silicon oxide film 308 is deposited so as to bury the dummy gates 316a and gaps therebetween perfectly. The silicon oxide film 308 is then removed to expose surfaces of the dummy gates 316a. After that, the semiconductor substrate is processed into a desired shape shown in the plan view in FIG. 57 by using a resist pattern of the dummy gates 316a as a mask.

In FIGS. 58A to 65B, each of A-figures is a sectional view taken along the line 58A—58A in FIG. 57, and each of B-figures is a sectional view taken along the line 58B—58B in FIG. 57.

Figure 58A:
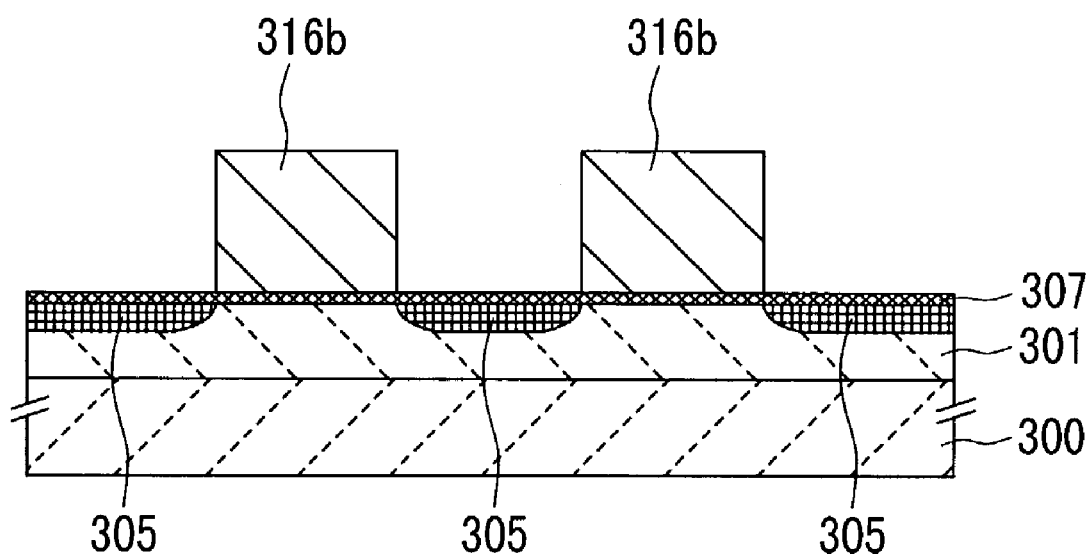
FIGS. 58A and 58B are a cross-sectional view and a longitudinal sectional view illustrating a process step of an example of a fabrication process of a nonvolatile semiconductor memory device in the eighth embodiment.
Figure 58B:
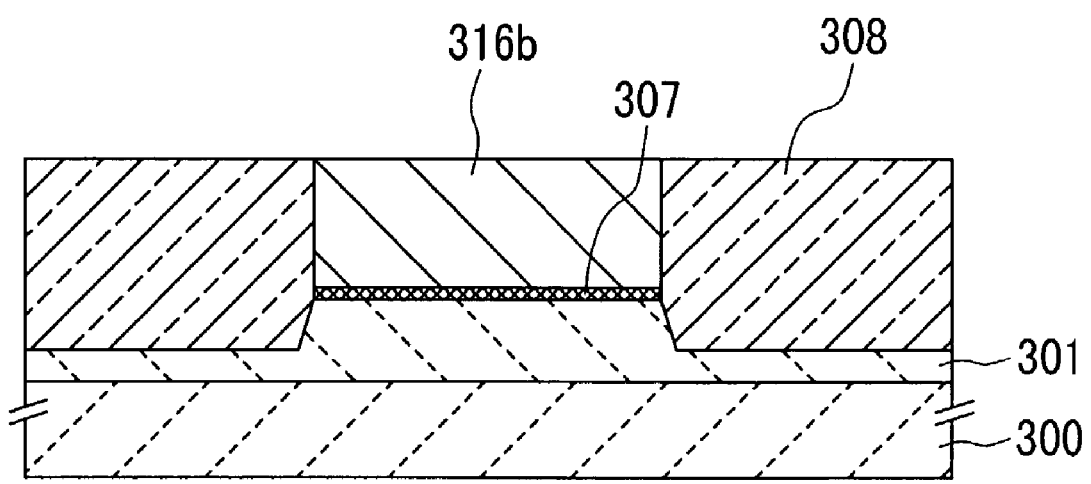

Then, arsenic ions are implanted by ion implantation using the dummy gates 316b and the silicon oxide films which are third insulating layers as masks to form impurity layers 305 which will be formed into sources and drains of memory cells (FIGS. 58A and 58B). The impurity layers implanted are shown in FIG. 58A.

Figure 59A:
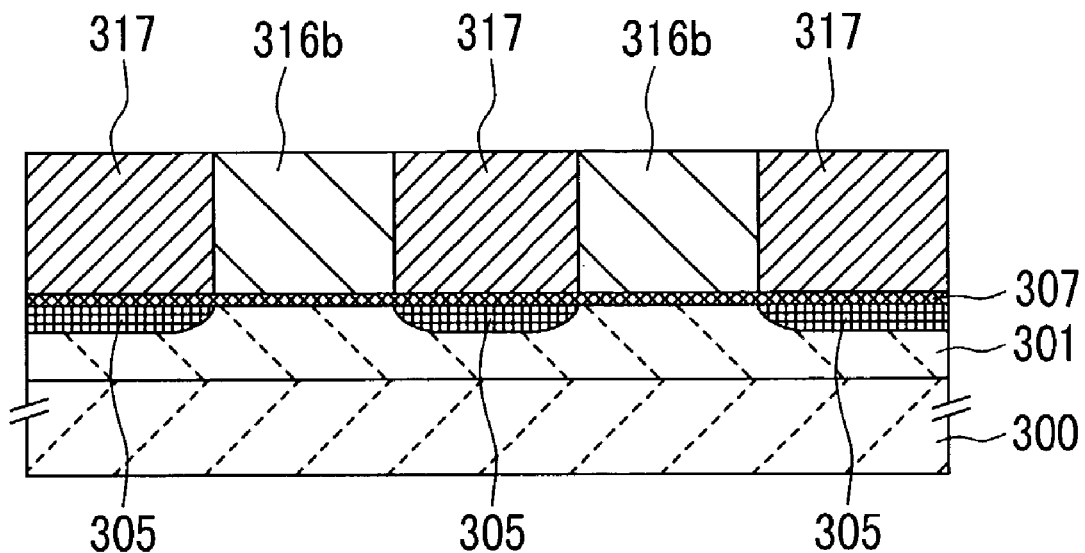
FIGS. 59A and 59B are a cross-sectional view and a longitudinal sectional view illustrating a process step subsequent to FIGS. 58A and 58B of the fabrication process of the nonvolatile semiconductor memory device in the eighth embodiment.
Figure 59B:
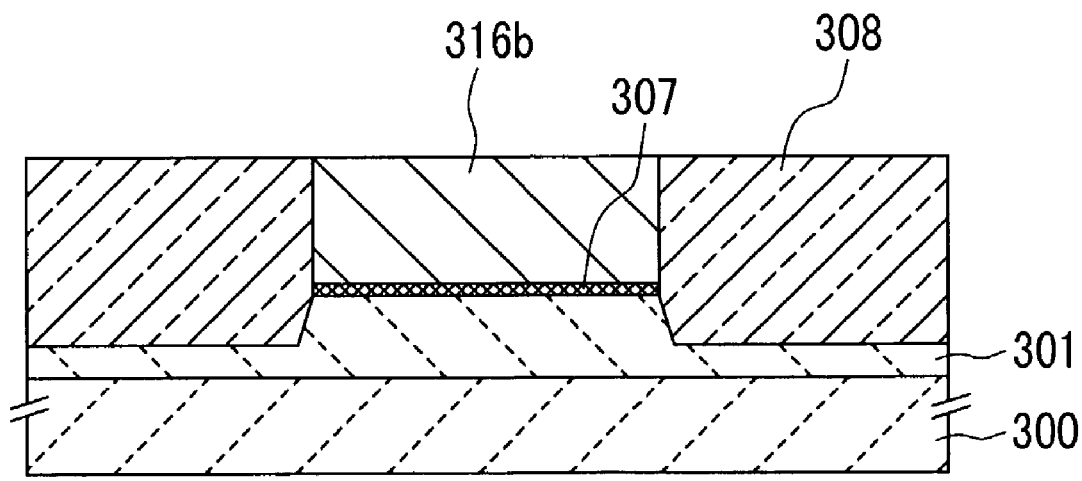

After that, a silicon oxide film is deposited in the case where the silicon nitride film is used as the dummy gate material so as to fill the spaces. Alternatively, a silicon oxide film or a silicon nitride film is deposited in the case where the polysilicon film is used as the dummy gate material so as to fill the spaces. The thus-deposited film is formed into fourth insulating layers 317. The thus-deposited insulating layers are removed by an etch back or a chemical mechanical polishing technique to expose surfaces of the dummy gates 316b. FIGS. 59A and 59B are sectional views showing this process step.

Figure 60A:
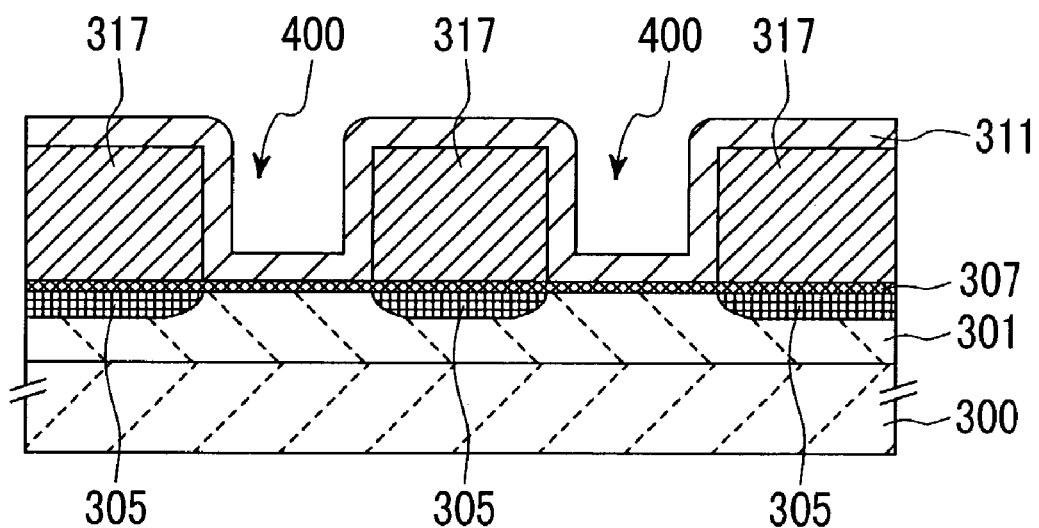
FIGS. 60A and 60B are a cross-sectional view and a longitudinal sectional view illustrating a process step subsequent to FIGS. 59A and 59B of the fabrication process of the nonvolatile semiconductor memory device in the eighth embodiment.
Figure 60B:
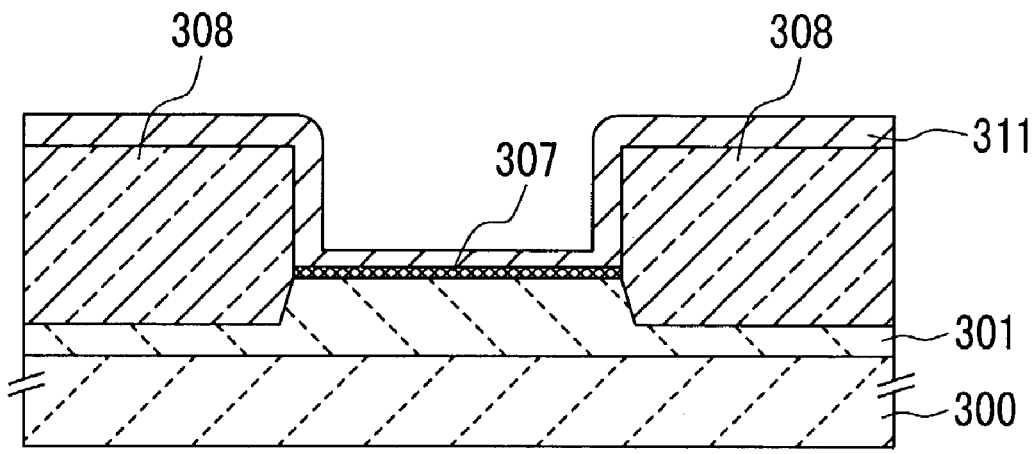

Spaces 400, in which the floating gates are to be formed, are created by removing the dummy gates 316a by a dry etching or a wet etching under the condition of selective etching on the dummy gate material (316a). In each of the thus-obtained spaces 400, two side walls are surrounded by the third insulating layer 308 and other two side walls are surrounded by the fourth insulating layer 317. A polysilicon film 311 doped with phosphor (P), which will be formed into the floating gates 311b, is deposited in such a manner as to avoid filling up the spaces perfectly (FIGS. 60A and 60B).

Figure 61A:
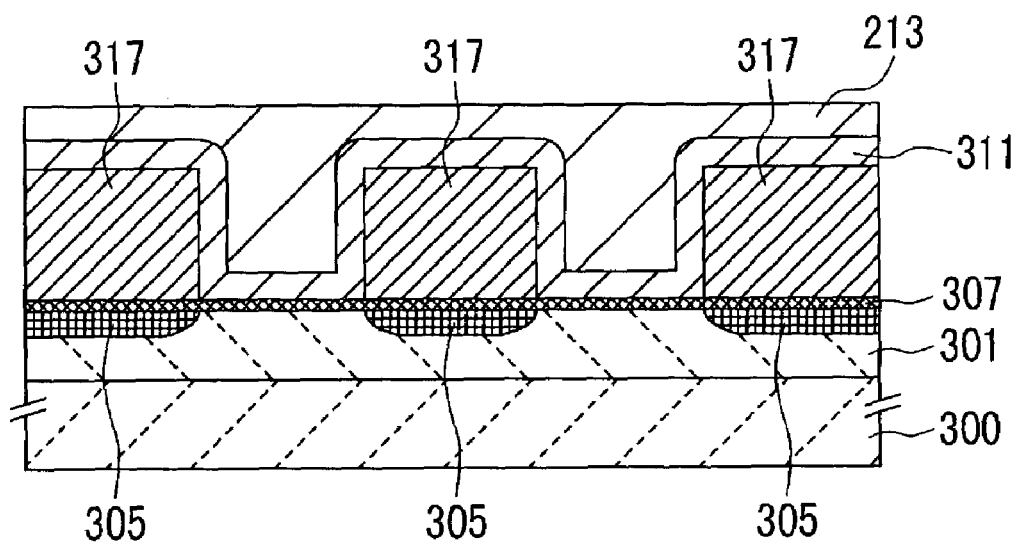
FIGS. 61A and 61B are a cross-sectional view and a longitudinal sectional view illustrating a process step subsequent to FIGS. 60A and 60B of the fabrication process of the nonvolatile semiconductor memory device in the eighth embodiment.
Figure 61B:
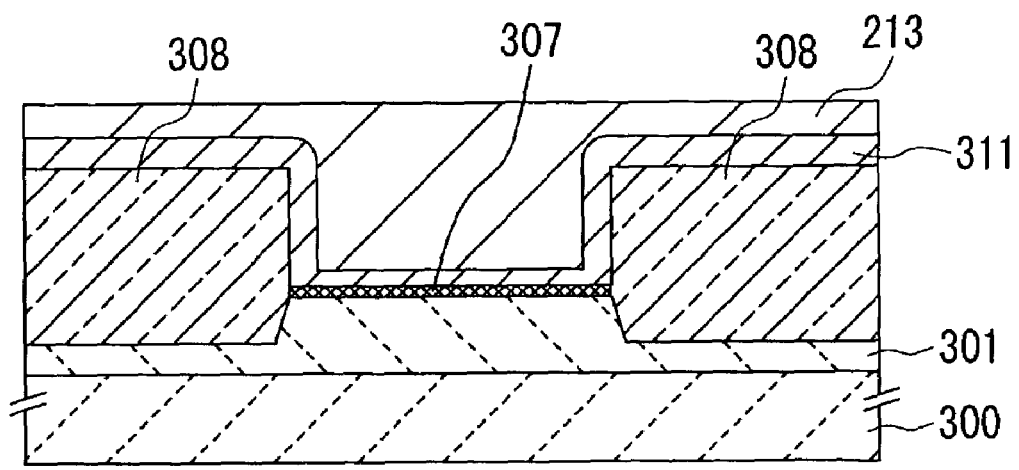
Figure 62A:
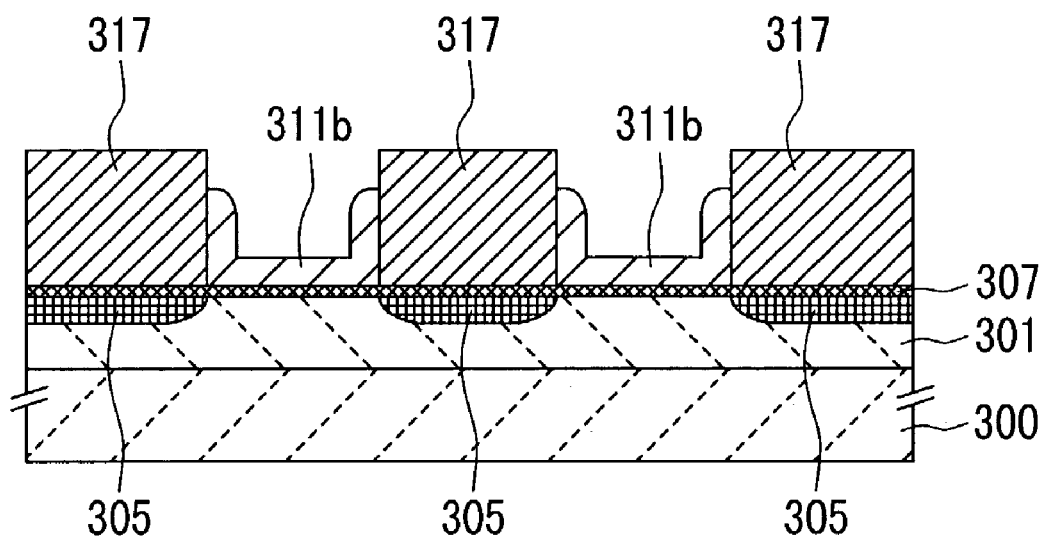
FIGS. 62A and 62B are a cross-sectional view and a longitudinal sectional view illustrating a process step subsequent to FIGS. 61A and 61B of the fabrication process of the nonvolatile semiconductor memory device in the eighth embodiment.
Figure 62B:
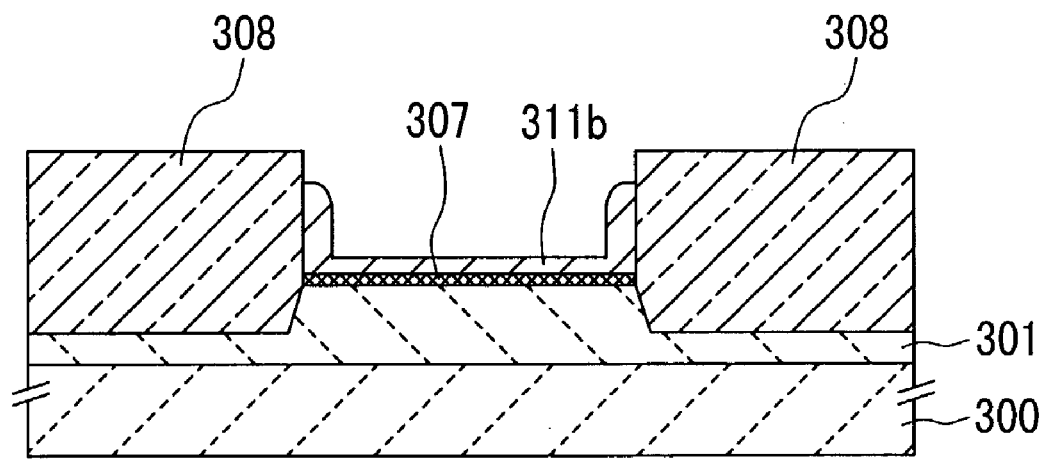

A resist 213 is then applied on the thus-obtained semiconductor base to fill gaps (FIGS. 61A and 61B). The resist and the polysilicon film 311 are etched back and the polysilicon film 311, which will be formed into a floating gate, is patterned to have desired shapes, thereby forming the floating gates 311b. The processing on the polysilicon film 311 is performed in such a manner that a height of the floating gates 311b is below that of the fourth insulating layers 317. FIGS. 62A and 62B are sectional views showing this process step. In this process step, the floating gates 311b are separated from one another as being enclosed by the insulating layers for the respective memory cells.

Figure 63A:
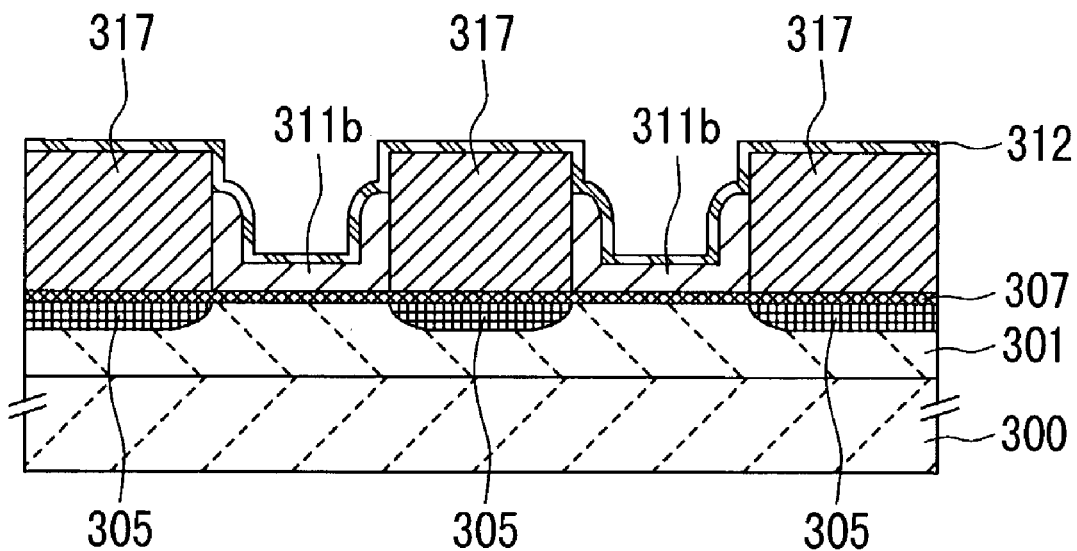
FIGS. 63A and 63B are a cross-sectional view and a longitudinal sectional view illustrating a process step subsequent to FIGS. 62A and 62B of the fabrication process of the nonvolatile semiconductor memory device in the eighth embodiment.
Figure 63B:
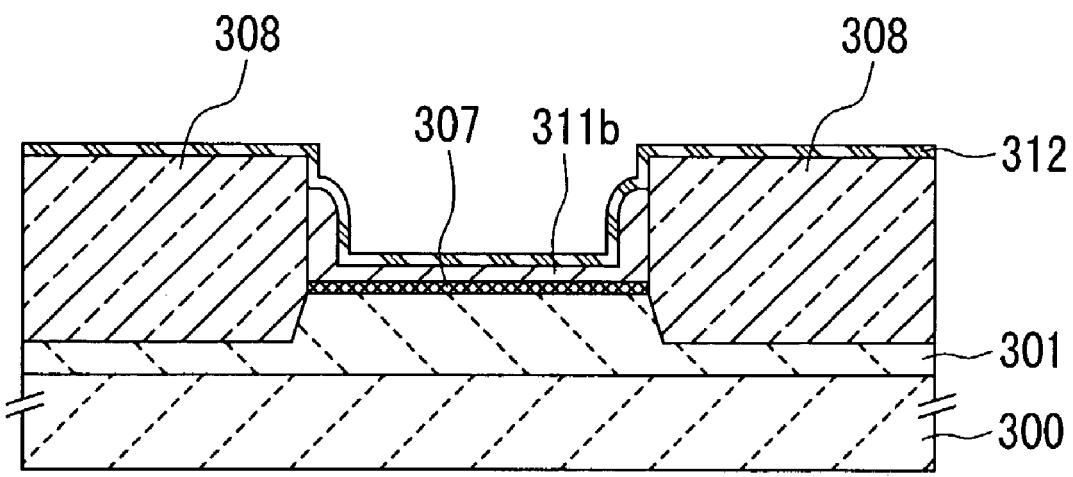

An interpoly dielectric film 312 is then formed for separating the floating gates 311b from the control gates. The insulating layer may be a silicon oxide film or a multilayer of silicon oxide film/silicon nitride film/silicon oxide film (FIGS. 63A and 63B).

Figure 64A:
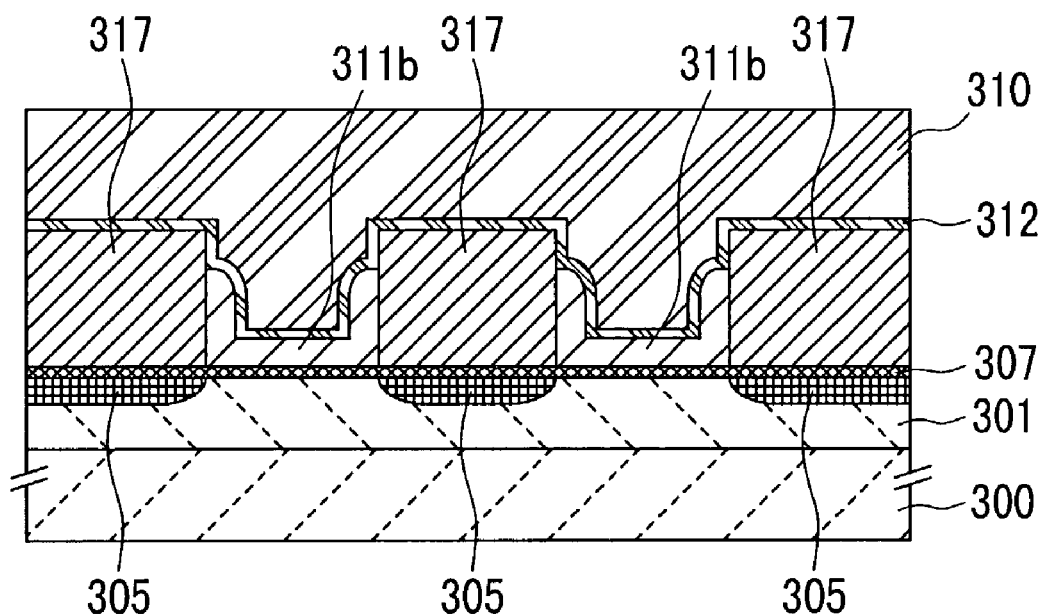
FIGS. 64A and 64B are a cross-sectional view and a longitudinal sectional view illustrating a process step subsequent to FIGS. 63A and 63B of the fabrication process of the nonvolatile semiconductor memory device in the eighth embodiment.
Figure 64B:
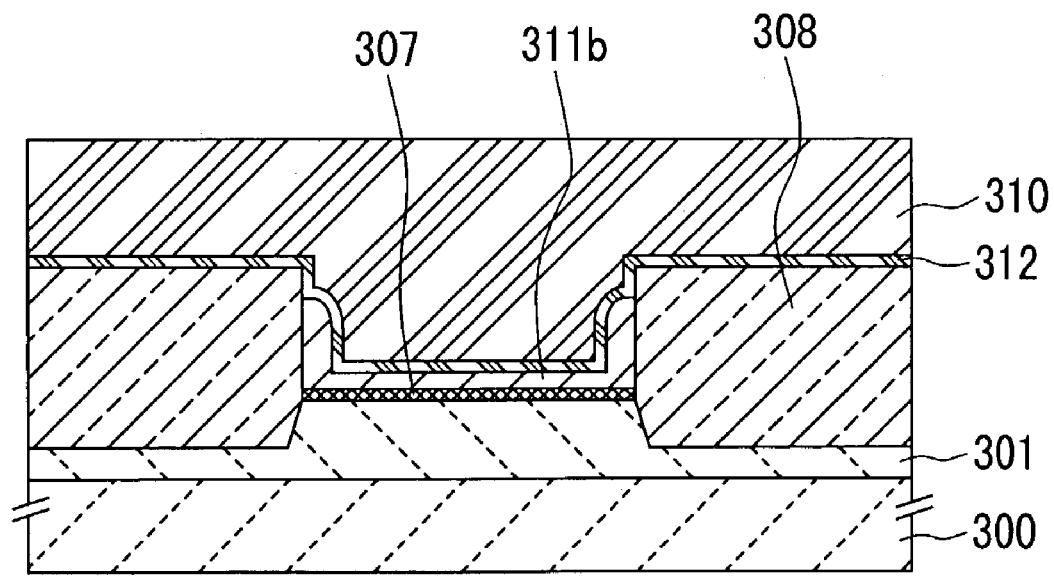
Figure 65A:
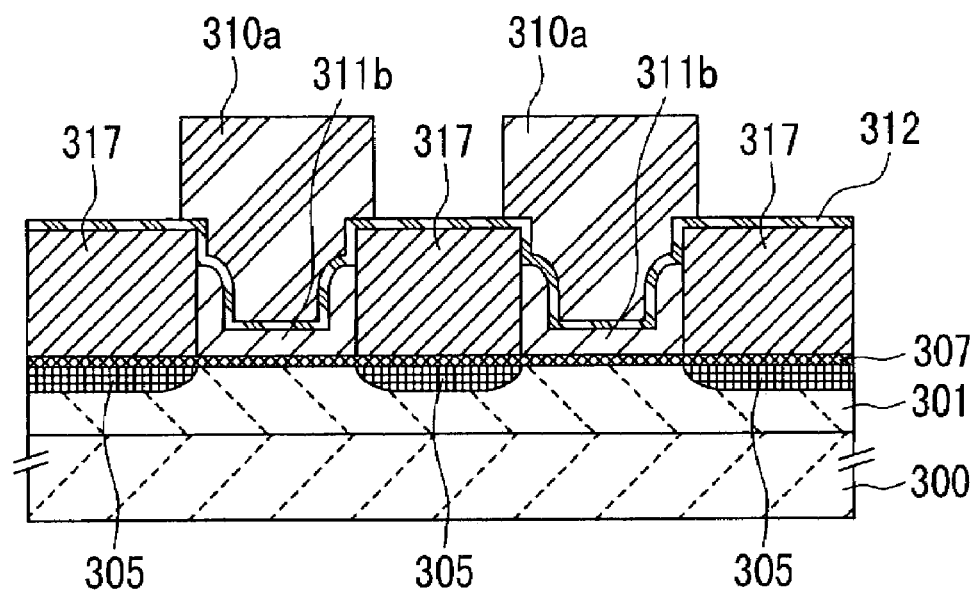
FIGS. 65A and 65B a cross-sectional view and a longitudinal sectional view illustrating a process step subsequent to FIGS. 66A and 66B of the fabrication process of the nonvolatile semiconductor memory device in the eighth embodiment.
Figure 65B:
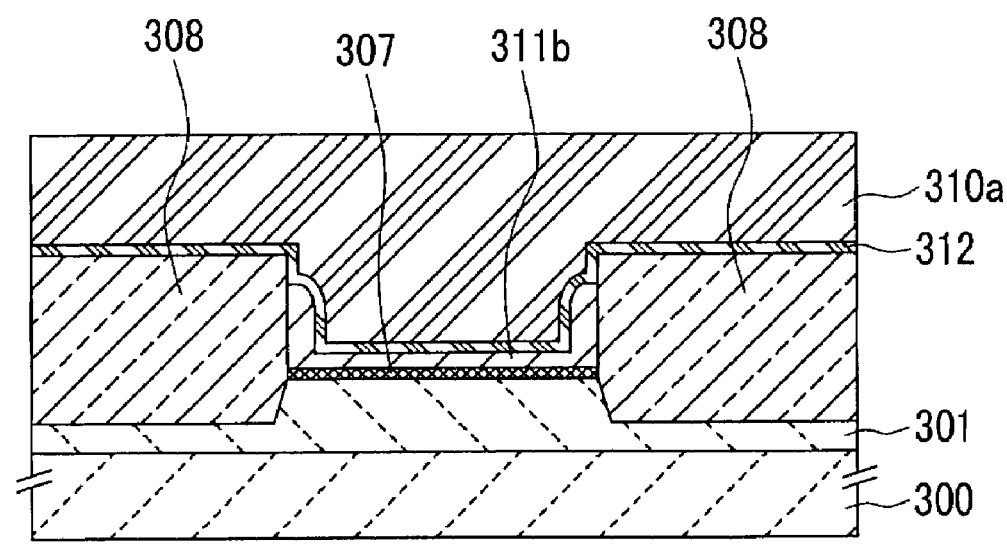

Then, a multilayer of a polysilicon film, a tungsten nitride film, and a tungsten film, i.e. a polymetal film 310, is deposited (FIGS. 64A and 64B). The polymetal film is processed to have desired shapes by a known lithography and a known dry etching technique to form word lines 310a (FIGS. 65A and 65B).

Conventionally, it has been necessary to sequentially perform etchings on the silicon oxide film or the multilayer 312 of silicon film/silicon nitride film/silicon oxide film and the polysilicon film 311 after the above process step. However, in the present embodiment, since the floating gates 311b are perfectly separated from one another for the respective memory cells in the process step in FIGS. 62A and 62B, the word lines 310a have only to be processed after the above process step. Further, since the height of the floating gates 311b is below that of the fourth insulating layers 317, the processing being performed for the word lines 310a using a dry etching is terminated at a stage where the surfaces of the fourth insulating layers are exposed, so that it is possible to separate the adjacent word lines from one another. Furthermore, even if a misalignment between the floating gate and the word line occurs, the capacitance of a capacitor which is formed between the floating gate and the control gate with the interpoly dielectric film 312 being formed therebetween is not reduced.

Figure 66:
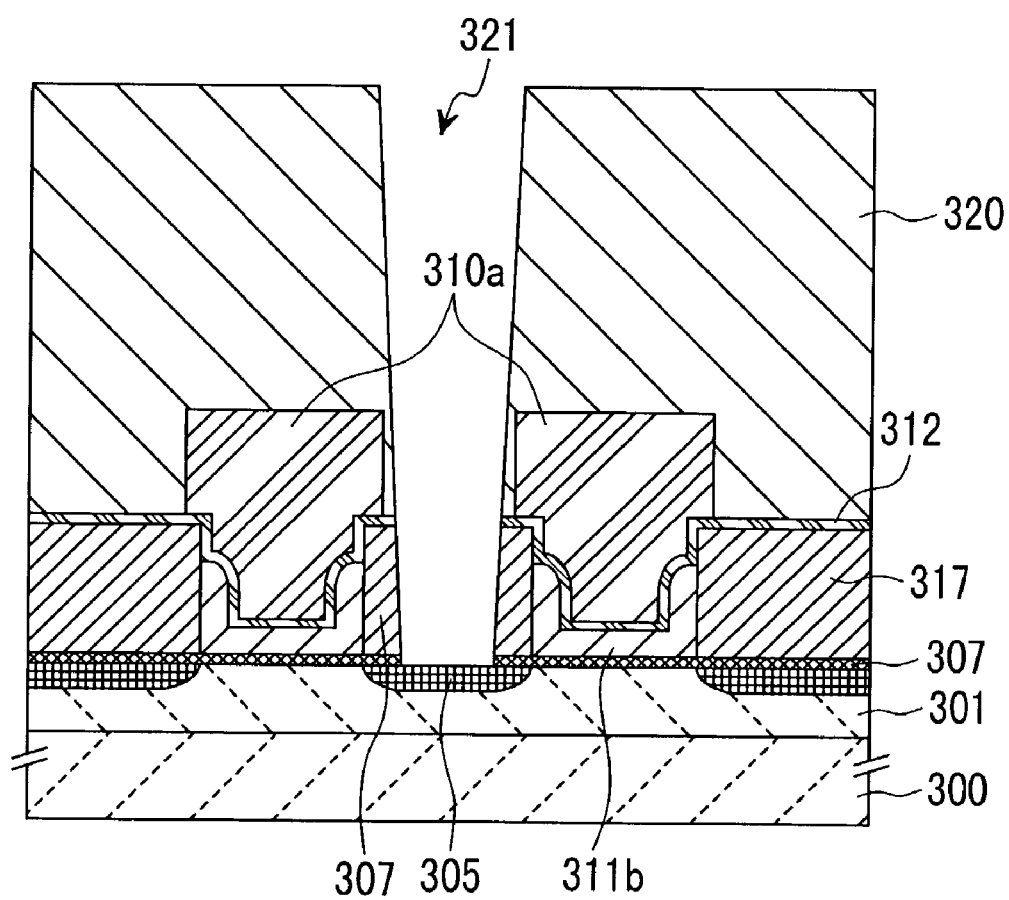
FIG. 66 is a sectional view illustrating the fabrication process of the nonvolatile semiconductor memory device in the eighth embodiment.

After forming the interpoly dielectric film 320, contact holes 321 extending to the diffusion layers each of which is at the center of two floating gates as shown in FIG. 66 are formed. The contact holes are connected with common drain lines. Also, contact holes extending to the word lines 311a, the source/drain diffusion layers 305, and the wells 301 are formed in a known method (FIG. 66). After that, a metal film is deposited and then patterned to form wirings, whereby the fabrication of memory cells is completed. In addition, drawings for these process steps are omitted since they are known.

As in the first embodiment, a high coupling ratio is ensured even if the word line width is narrowed in the memory cells of the present embodiment. In particular, an apparent effect is observed when the word line with is 0.13 μm or less.

Although the present invention has been described in detail in the foregoing, major modes of the invention are summarized as follows because the invention covers detailed items.

(1) A nonvolatile semiconductor memory device comprising a memory cell, the memory cell comprising: a first conductivity type well formed in a silicon substrate; a second conductivity type semiconductor region which will be formed into a source/drain, the second conductivity type semiconductor region being formed in the first conductivity type well; a first gate formed in the silicon substrate via a first gate oxide film; a second gate insulated from the first gate with a second insulating layer which covers the first gate; a third gate insulated from the first gate and the second gate with a third insulating layer and a fourth insulating layer; and a fifth insulating layer which is adjacent to the first gate; wherein one of surfaces of the first gate, which contacts with the second gate via the second insulating layer, has a dented shape as viewed in sections which are perpendicular to the silicon substrate, one of the sections being taken in a direction extending from the first gate to the third gate and the other section being taken in a direction extending from the first gate to the fifth insulating layer.

(2) The nonvolatile semiconductor memory device according to item (1), wherein the fourth insulating layer is formed from an insulating layer material which is different from that used for forming the fifth insulating layer.

(3) The nonvolatile semiconductor memory device according to item (2), wherein the fourth insulating layer is of a silicon nitride film and the fifth insulating layer is of a silicon oxide film.

(4) The nonvolatile semiconductor memory device according to item (2), wherein the fourth insulating layer is of a silicon oxide film and the fifth insulating layer is of a silicon nitride film.

(5) The nonvolatile semiconductor memory device according to items (1) to (4), wherein a height of the first gate is below at least one of those of the fourth insulating layer and the fifth insulating layer.

(6) The nonvolatile semiconductor memory device according to items (1) to (5), wherein a height of the second gate is greater than that of the fourth insulating layer and equal to that of the fifth insulating layer.

(7) The nonvolatile semiconductor memory device according to items (1) to (5), wherein the height of the second gate is greater than that of the fifth insulating layer and equal to that of the fourth insulating layer.

(8) The nonvolatile semiconductor memory device according to items (1) to (7), wherein the first conductivity type is P-type and the second conductivity type is N-type.

(9) The nonvolatile semiconductor memory device according to items (1) to (7), wherein the first conductivity type is N-type and the second conductivity type is P-type.

(10) The nonvolatile semiconductor memory device according to item (8), wherein P-type impurity is boron and N-type impurity is arsenic.

(11) The nonvolatile semiconductor memory device according to item (9), wherein N-type impurity is phosphor and P-type impurity is boron.

(12) The nonvolatile semiconductor memory device according to items (1) to (11), wherein one of the first gate, the second gate, and the third gate serves as an erase gate.

(13) A nonvolatile semiconductor memory device comprising a memory cell, the memory cell comprising: a first conductivity type well formed in a silicon substrate; a second conductivity type semiconductor region which will be formed into a source/drain, the second conductivity type semiconductor region being formed in the first conductivity type well; a first gate formed in the silicon substrate via a first gate oxide film; a second gate insulated from the first gate with a second insulating layer which covers the first gate; a third insulating layer which is adjacent to the first gate; and a fourth insulating layer which is adjacent to the first gate; wherein one of surfaces of the first gate, which contacts with the second gate via the second insulating layer, has a dented shape as viewed in sections which are perpendicular to the silicon substrate, one of the sections being taken in a direction extending from the first gate to the third insulating layer and the other section being taken in a direction extending from the first gate to the fourth insulating layer.

(14) The nonvolatile semiconductor memory device according to item (13), wherein the third insulating layer is formed from an insulating layer material which is different from that used for forming the fourth insulating layer.

(15) The nonvolatile semiconductor memory device according to item (14), wherein the third insulating layer is a silicon nitride film and the fourth insulating layer is a silicon oxide film.

(16) The nonvolatile semiconductor memory device according to item (14), wherein the third insulating layer is a silicon oxide film and the fourth insulating layer is a silicon nitride film.

(17) The nonvolatile semiconductor memory device according to items (13) to (16), wherein a height of the first gate is below at least one of those of the third insulating layer and the fourth insulating layer.

(18) The nonvolatile semiconductor memory device according to items (13) to (17), wherein a height of the second gate is greater than that of the third insulating layer and equal to that of the fourth insulating layer.

(19) The nonvolatile semiconductor memory device according to items (13) to (17), wherein the height of the second gate is greater than that of the fourth insulating layer and equal to that of the third insulating layer.

(20) The nonvolatile semiconductor memory device according to items (13) to (19), wherein the first conductivity type is P-type and the second conductivity type is N-type.

(21) The nonvolatile semiconductor memory device according to items (13) to (19), wherein the first conductivity type is N-type and the second conductivity type is P-type.

(22) The nonvolatile semiconductor memory device according to item (20), wherein P-type impurity is boron and N-type impurity is arsenic.

(23) The nonvolatile semiconductor memory device according to item (21), wherein N-type impurity is phosphor and P-type impurity is boron.

(24) The nonvolatile semiconductor memory device according to items (13) to (23), wherein the first gate is a floating gate and the second gate serves both as a control gate and an erase gate.

(25) The nonvolatile semiconductor memory device according to items (1) to (24), wherein an interpoly dielectric film formed between the first gate and the second gate is formed from a high-k material such as tantalum pentoxide.

Followings are modes of the fabrication process of the present invention.

(26) A fabrication process of a nonvolatile semiconductor memory device, comprising: a step of forming a first conductivity type well in a silicon substrate; a step of forming in the first conductivity type well a second conductivity type semiconductor region which will be formed into a source/drain; a step of forming a first gate in the silicon substrate via a first gate oxide film; a step of forming a second gate in such a manner as to insulate the second gate from the first gate with a second insulating layer which covers the first gate; a step of forming a third gate in such a manner as to insulate the third gate from the first gate and the second gate with a third insulating layer and a fourth insulating layer; and a step of forming a fifth insulating layer adjacent to the first gate; wherein the first gate is formed in such a manner that one of surfaces of the first gate, which contacts with the second gate via the second insulating layer, has a dented shape as viewed in sections which are perpendicular to the silicon substrate, one of the sections being taken in a direction extending from the first gate to the third gate and the other section being taken in a direction extending from the first gate to the fifth insulating layer.

(27) The fabrication process of a nonvolatile semiconductor memory device according to item (26) comprising: a step of covering the third gate and the fourth insulating layer with the fifth insulating layer which is formed from a material different from that used for forming the fourth insulating layer after forming the third gate and a multilayer of the fourth insulating layer; a step of processing the fifth insulating layer to form a space for forming therein the first gate; a step of forming the first gate oxide film; a step of forming the third insulating layer; a step of depositing a first gate material in such a manner as to avoid filling up the space perfectly; a step of filling with a resist material the space remaining after the deposition of the first gate material; a step of forming the first gate in a self alignment manner by an etch back so that a height of the first gate becomes greater than at least one of those of the fourth insulating layer and the fifth insulating layer; a step of depositing the second insulating layer; a step of depositing a second gate material; and a step of processing the second gate in such a manner that a portion of the second insulating layer covering a dented surface of the first gate is not exposed.

(28) The fabrication process of a nonvolatile semiconductor memory device according to item (27), comprising: a step of exposing the fourth insulating layer in such a manner as to leave the fifth insulating layer, the step being performed immediately before processing the fifth insulating layer to form the space wherein the first gate will be formed.

(29) The fabrication process of a nonvolatile semiconductor memory device according to item (26), comprising: a step of depositing and processing the fifth insulating layer; a step of depositing a third gate material in such a manner as to fill a space of the fifth insulating layer; a step of forming the third gate by an etch back in such a manner that a height of the third insulating layer is below that of the fifth insulating layer; a step of covering the third gate and the fifth insulating layer with the fourth insulating layer; a step of exposing the fifth insulating layer in such a manner as to leave the fourth insulating layer; a step of processing the fifth insulating layer to form a space in which the first insulating layer will be formed; a step of forming a first oxide film; a step of forming the third insulating layer; a step of depositing a first gate material in such a manner as to avoid filling up the space perfectly; a step of filling with a resist material a space remaining after the deposition of the first gate material; a step of forming the first gate in a self alignment manner by an etch back so that a height of the first gate becomes greater than at least one of those of the fourth insulating layer and the fifth insulating layer; a step of depositing the second insulating layer; a step of depositing a second gate material; and a step of processing the second gate in such a manner that a portion of the second insulating layer covering a dented surface of the first gate is not exposed.

(30) The fabrication process of a nonvolatile semiconductor memory device according to items (26) to (29), comprising: a step of processing the fifth insulating layer for forming a space in which the first gate will be formed in such a manner that a height of a portion of the fourth insulating layer covering the space is below that of the fifth insulating layer; a step of forming the first gate oxide film; a step of forming the third insulating layer; a step of depositing a first gate material in such a manner as to avoid filling up the space perfectly; a step of filling with a resist material a space remaining after the deposition of the first gate material; a step of forming the first gate in a self alignment manner by an etch back so that a height of the first gate becomes greater than that of the fifth insulating layer; a step of depositing the second insulating layer; a step of depositing a second gate material; and a step of processing the second gate by an etch back or a chemical mechanical polishing technique in a self alignment manner by taking advantage of a height difference between the fourth insulating layer and the fifth insulating layer.

(31) A fabrication process of a nonvolatile semiconductor memory device, comprising: a step of forming a first conductivity type well in a silicon substrate; a step of forming in the first conductivity type well a second conductivity type semiconductor region which will be formed into a source/drain; a step of forming a first gate on the silicon substrate via a first gate oxide film; a step of forming a second gate via a second insulating layer which covers the first gate; and a step of forming a third insulating layer and a fourth insulating layer which are adjacent to the first gate; wherein, the first gate is formed in such a manner that one of surfaces of the first gate, which contacts with the second gate via the second insulating layer, has a dented shape as viewed in sections which are perpendicular to the silicon substrate, one of the sections being taken in a direction extending from the first gate to the third insulating layer and the other section being taken in a direction extending from the first gate to the fourth insulating layer.

(32) The fabrication process of a nonvolatile semiconductor memory device according to item (31), comprising: a step of depositing the third insulating layer; a step of processing the third insulating layer; a step of forming a source/drain diffusion layer by using the processed third insulating layer as a mask; a step of covering the third insulating layer with the fourth insulating layer; a step of exposing the third insulating layer in such a manner as to leave the fourth insulating layer; a step of further processing the third insulating layer to form a space in which the first gate will be formed; a step of forming a first gate oxide film; a step of depositing a first gate material in such a manner as to avoid filling up the space perfectly; a step of filling with a resist material a space remaining after the deposition of the first gate material; a step of forming the first gate by an etch back in an self alignment manner so that a height of the first gate is below at least one of the third insulating layer and the fourth insulating layer; a step of depositing the second insulating layer; a step of depositing a second gate material; and a step of processing the second gate in such a manner as to avoid exposing a portion of the second insulating layer covering a dented surface of the first gate.

(33) The fabrication process of a nonvolatile semiconductor memory device according to items (31) to (32), comprising: a step of processing the third insulating layer for forming a space in which the first gate will be formed in such a manner that a height of a portion of the fourth insulating layer covering the space is below that of the third insulating layer; a step of forming the first gate oxide film; a step of depositing a first gate material in such a manner as to avoid filling up the space perfectly; a step of filling with a resist material a space remaining after the deposition of the first gate material; a step of forming the first gate in a self alignment manner by an etch back so that a height of the first gate becomes greater than that of the third insulating layer; a step of depositing the second insulating layer; a step of depositing a second gate material; and a step of processing the second gate by an etch back or a chemical mechanical polishing technique in a self alignment manner by taking advantage of a height difference between the third insulating layer and the fourth insulating layer.

(34) The fabrication process of a nonvolatile semiconductor memory device according to item (31), comprising: a step of depositing the third insulating layer; a step of processing the third insulating layer; a step of covering the third insulating layer with a dummy gate material; a step of forming a dummy gate; a step of forming a source/drain diffusion layer by using the dummy gate and the third insulating layer as masks; a step of covering the dummy gate and the third insulating layer with the fourth insulating layer; a step of exposing the dummy gate in such a manner as to leave the third insulating layer and the fourth insulating layer; a step of removing the dummy gate; a step of forming a first gate oxide film; a step of depositing a first gate material in such a manner as to avoid filling up a space formed by the removal of the dummy gate; a step of filling with a resist material a space remaining after the deposition of the first gate material; a step of forming the first gate in a self alignment manner by an etch back so that a height of the first gate is below at least one of the third insulating layer and the fourth insulating layer; a step of depositing the second insulating layer; a step of depositing a second gate material; and a step of processing the second gate in such a manner that a portion of the second insulating layer covering a dented surface of the first gate is not exposed.

(35) The fabrication process of a nonvolatile semiconductor memory device according to item (34), comprising: a step of removing the dummy gate in such a manner that a height of the third insulating layer is below that of the fourth insulating layer; a step of forming the first oxide film; a step of depositing the first gate material in such a manner as to avoid filling up a space obtained by removing the dummy gate perfectly; a step of filling with a resist material a space remaining after the deposition of the first gate material; a step of forming the first gate in a self alignment manner by an etch back so that a height of the first gate is below that of the fourth insulating layer; a step of depositing the second insulating layer; a step of depositing a second gate material; and a step of processing the second gate by an etch back or a chemical mechanical polishing technique in a self alignment manner by taking advantage of a height difference between the third insulating layer and the fourth insulating layer.

(36) The fabrication process of a nonvolatile semiconductor memory device according to items (26) to (35), wherein the first conductivity type is P-type and the second conductivity type is N-type.

(37) The fabrication process of a nonvolatile semiconductor memory device according to items (26) to (35), wherein the first conductivity type is N-type and the second conductivity type is P-type.

(38) The fabrication process of a nonvolatile semiconductor memory device according to item (36), wherein boron ions or boron fluoride ions are used as P-type impurity and arsenic is used as N-type impurity.

(39) The fabrication process of a nonvolatile semiconductor memory device according to item (37), wherein phosphor is used as N-type impurity and boron ions or boron fluoride ions are used as P-type impurity.

(40) The fabrication process of a nonvolatile semiconductor memory device according to items (26) to (39), wherein an interpoly dielectric film formed between the first gate and the second gate is formed from a high-k material such as tantalum pentoxide.

Effect of the Invention

Effects of the present invention may be summarized as follows.

It is possible to reduce a memory cell area since the present invention ensures an adequate coupling ratio even if a word line width in a semiconductor integrated circuit device is reduced.

It is possible to improve fabrication efficiency since the present invention reduces damage to a gate oxide film by eliminating a step of exposing a gate insulating layer which has necessarily been performed after depositing a layer which will be formed into a floating gate of a semiconductor integrated circuit device.

What is claimed is:

1. A nonvolatile semiconductor memory device comprising a memory cell, the memory cell comprising:
    a first conductivity type well in a silicon substrate;
    a second conductivity type semiconductor region having at least a pair of a first semiconductor region and a second semiconductor region, the second conductivity type semiconductor region being formed in the first conductivity type well;
    a first gate insulating layer formed in the silicon substrate in such a manner as to at least cover a gap between the pair of the first and the second semiconductor region;
    a first gate formed on the first gate insulating layer;
    a second insulating layer formed to cover the first gate;
    a second gate formed on the second insulating layer;
    a third gate formed alongside the first gate in the silicon substrate with being insulated from the first gate and the second gate with the third insulating layer and a multilayer of at least the second insulating layer and a fourth insulating layer; and
    a fifth insulating layer formed between the first gate and another first gate in a direction intersecting a direction in which the first gate and the third gate are aligned:
    wherein:
    one of surfaces of the first gate, which faces the second gate with the second insulating layer being formed therebetween, has a dented shape as viewed in sections which are perpendicular to the silicon substrate, one of the sections being taken in a direction extending from the first gate to the third gate and the other section being taken in a direction extending from the first gate to the fifth insulating layer.

2. The nonvolatile semiconductor memory device according to claim 1, wherein the fourth insulating layer is formed from an insulating layer material which is different from that used for forming the fifth insulating layer.

3. The nonvolatile semiconductor memory device according to claim 2, wherein the fourth insulating layer is of a silicon nitride film and the fifth insulating layer is of a silicon oxide film.

4. The nonvolatile semiconductor memory device according to claim 2, wherein the fourth insulating layer is of a silicon oxide film and the fifth insulating layer is of a silicon nitride film.

5. The nonvolatile semiconductor memory device according to claim 1, wherein a height of the first gate is below at least one of those of the fourth insulating layer and the fifth insulating layer.

6. The nonvolatile semiconductor memory device according to claim 1, wherein a height of the second gate is greater than that of the fourth insulating layer and equal to that of the fifth insulating layer.

7. The nonvolatile semiconductor memory device according to claim 1, wherein the height of the second gate is greater than that of the fifth insulating layer and equal to that of the fourth insulating layer.

8. The nonvolatile semiconductor memory device according to items claim 1, wherein one of the first gate, the second gate, and the third gate serves as an erase gate.

9. The nonvolatile semiconductor memory device according to claim 1 wherein an interpoly dielectric film formed between the first gate and the second gate is formed from a high-k material.

10. A nonvolatile semiconductor memory device comprising a memory cell, the memory cell comprising:
   a first conductivity type well formed in a silicon substrate;
   a second conductivity type semiconductor region which is a pair of a first semiconductor region and a second semiconductor region, the second conductivity type semiconductor region being formed in the first conductivity type well;
   a first gate insulating layer formed in the silicon substrate in such a manner as to at least cover a gap between the first and the second semiconductor region of the second conductivity type semiconductor region;
   a first gate formed on the first gate insulating layer;
   a second insulating layer formed to cover the first gate;
   a second gate formed on the second insulating layer;
   a third gate adjacent to the first gate; and
   a fourth insulating layer adjacent to the first gate in a direction intersecting a direction in which the first gate is adjacent to the third insulating layer;
   wherein:
   one of surfaces of the first gate, which faces the second gate with the second insulating layer being formed therebetween, has a dented shape as viewed in sections which are perpendicular to the silicon substrate, one of the sections being taken in a direction extending from the first gate to the third insulating layer and the other section being taken in a direction extending from the first gate to the fourth insulating layer.

11. The nonvolatile semiconductor memory device according to claim 10, wherein the third insulating layer is formed from an insulating layer material which is different from that used for forming the fourth insulating layer.

12. The nonvolatile semiconductor memory device according to claim 10, wherein the third insulating layer is of a silicon nitride film and the fourth insulating layer is of a silicon oxide film.

13. The nonvolatile semiconductor memory device according to claim 10, wherein the third insulating layer is of a silicon oxide film and the fourth insulating layer is of a silicon nitride film.

14. The nonvolatile semiconductor memory device according to claim 10, wherein a height of the first gate is below at least one of those of the third insulating layer and the fourth insulating layer.

15. The nonvolatile semiconductor memory device according to claim 10, wherein a height of the second gate is greater than that of the third insulating layer and equal to that of the fourth insulating layer.

16. The nonvolatile semiconductor memory device according to claim 10, wherein the height of the second gate is greater than that of the fourth insulating layer and equal to that of the third insulating layer.

17. The nonvolatile semiconductor memory device according to claim 10, wherein the first gate is a floating gate and the second gate serves both as a control gate and an erase gate.

* * * * *